(12) United States Patent
Schlie et al.

(10) Patent No.: US 8,509,273 B2
(45) Date of Patent: *Aug. 13, 2013

(54) INTEGRATED ADVANCED HEAT SPREADER FOR SOLID-STATE LASER SYSTEMS

(75) Inventors: LaVerne Arthur Schlie, Albuquerque, NM (US); Hongbin Ma, Columbia, MO (US)

(73) Assignees: Integral Laser Solutions, LLC, Albuquerque, NM (US); The Curators of the University of Missouri, Columbia, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/555,884

(22) Filed: Jul. 23, 2012

(65) Prior Publication Data

US 2013/0044776 A1     Feb. 21, 2013

Related U.S. Application Data

(63) Continuation-in-part of application No. PCT/US2011/022289, filed on Jan. 24, 2011.

(60) Provisional application No. 61/297,546, filed on Jan. 22, 2010, provisional application No. 61/512,730, filed on Jul. 28, 2011.

(51) Int. Cl.
*H01S 3/04*     (2006.01)

(52) U.S. Cl.
USPC .................... 372/34; 372/35; 372/36

(58) Field of Classification Search
USPC ................. 372/34, 35, 36
See application file for complete search history.

(56) References Cited

U.S. PATENT DOCUMENTS 8,213,471 B2 *   7/2012   Schlie et al. ............... 372/35

* cited by examiner

*Primary Examiner* — Armando Rodriguez
(74) *Attorney, Agent, or Firm* — Jeffrey D. Myers; Peacock Myers, P.C.

(57) ABSTRACT

A thermal management apparatus and method for a solid-state laser system enabling the laser system to have near isothermal temperatures across and throughout a solid-state gain material, by mechanically controlling an oscillating heat pipe having effective thermal conductivity of 10-20,000 W/m*K; bonding a solid-state lasing crystal or ceramic to the mechanically controlled oscillating heat pipe; and providing a supporting structure including a surface bonded to the solid-state lasing crystal or ceramic that matches the coefficient of thermal expansion of both the solid-state lasing crystal or ceramic and the mechanically controlled oscillating heat pipe.

24 Claims, 47 Drawing Sheets

SCHEMATIC of HIGH POWER THIN DISK LASER

SCHEMATIC of HIGH POWER THIN DISK LASER

"Cold Finger"
Stress Results

Oscillating Heat Pipes

- Thermal Efficiency ↑
- Higher driving force
  - Thermally driven
  - Capillary force
- Higher heat transfer coefficient
  - Evaporation/Condensation
  - Forced convection
- Lower pressure drops
  - Vapor bubbles and liquid plugs
  - Parallel flow
  - No wick structures
- Low manufacturing cost

*Case 1: Square or Rectangular "Cold" - Plate Serving as Advanced Heat Spreader*

*Case 2: <u>Round "Cold"</u> - Plate Serving as Advanced Heat Spreader*

*1 cm diameter x 225 micron Yb:YAG thick thin disk*

*Multi-Beam Pumping with Parabolic Mirror*

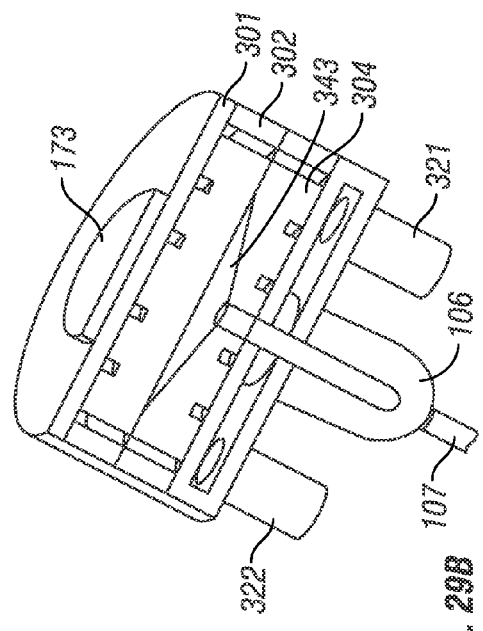
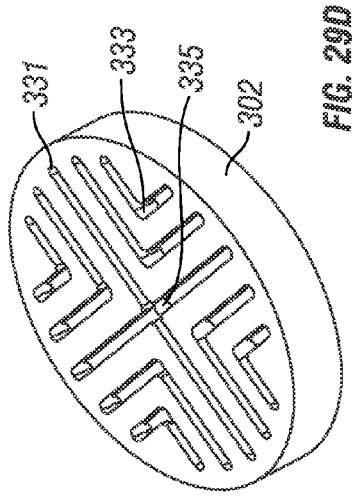
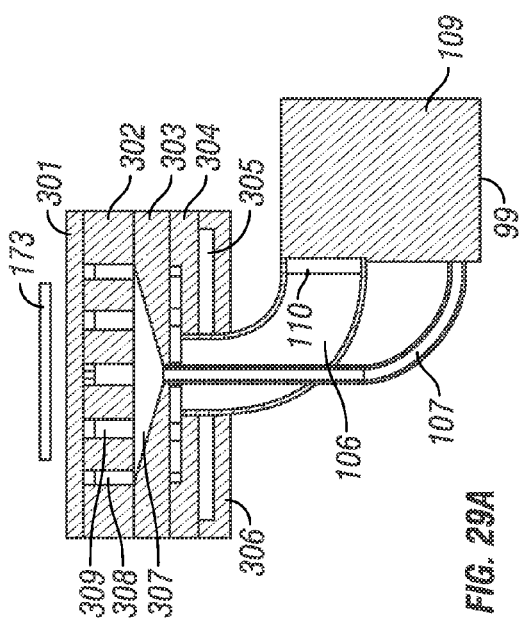
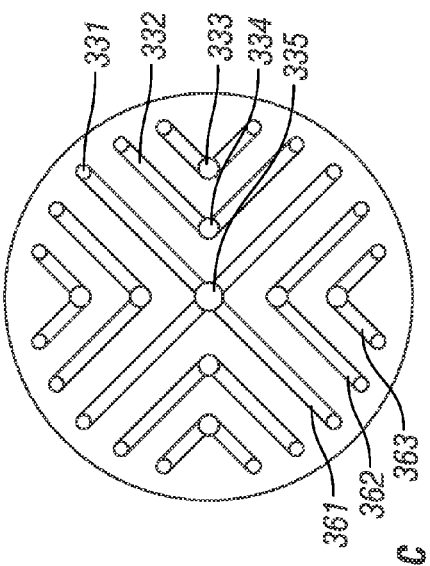

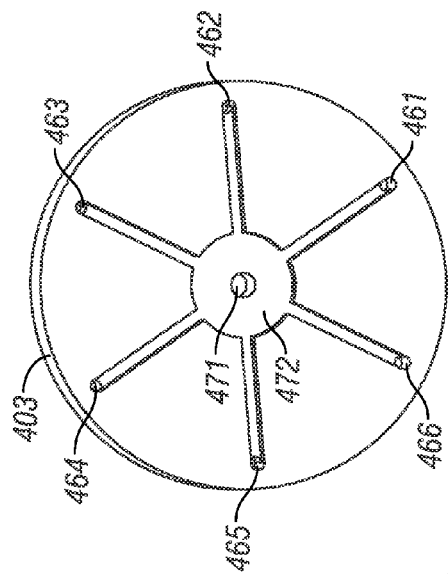
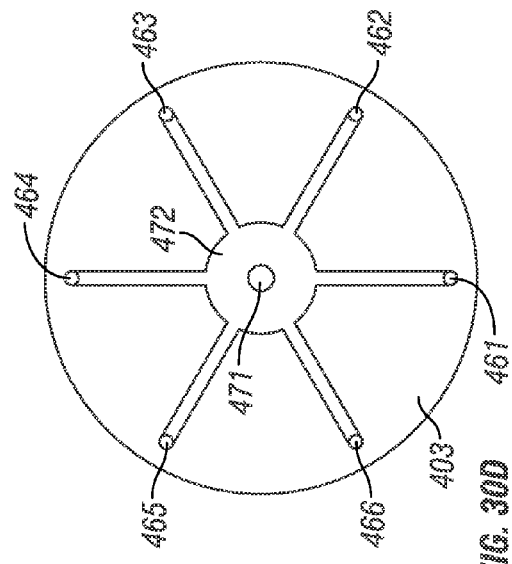
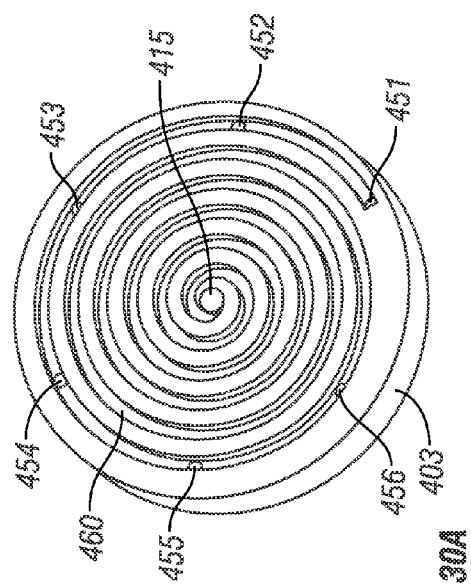
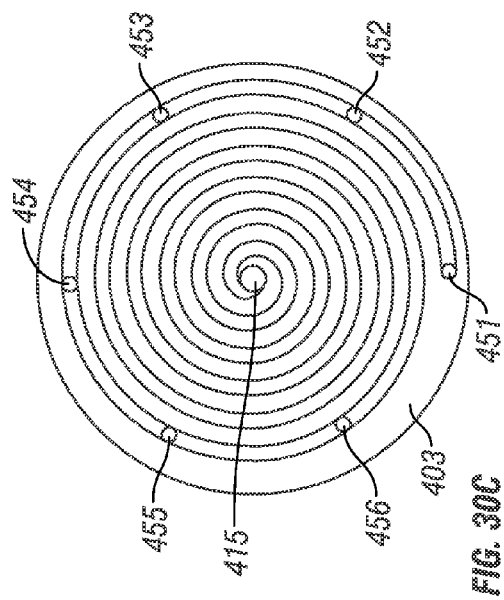
FIG. 30A
FIG. 30B
FIG. 30C
FIG. 30D

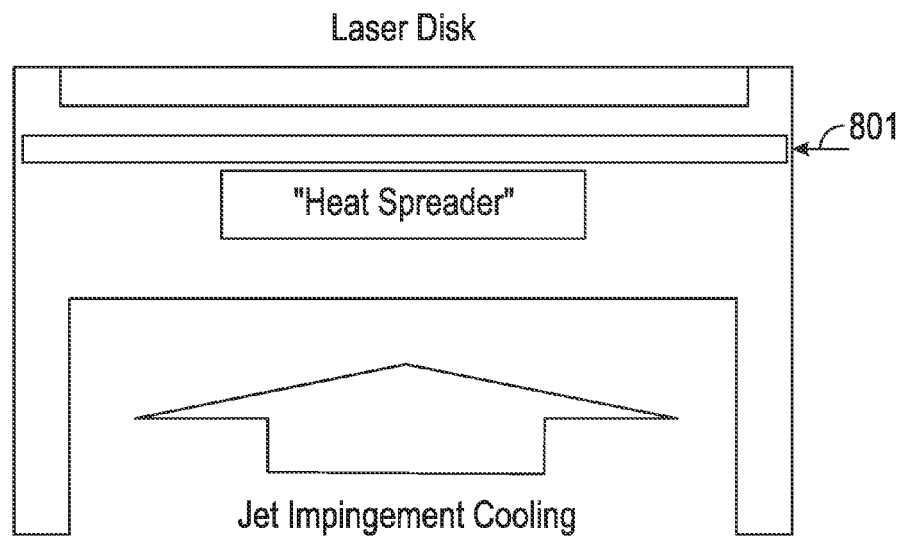
FIG. 40
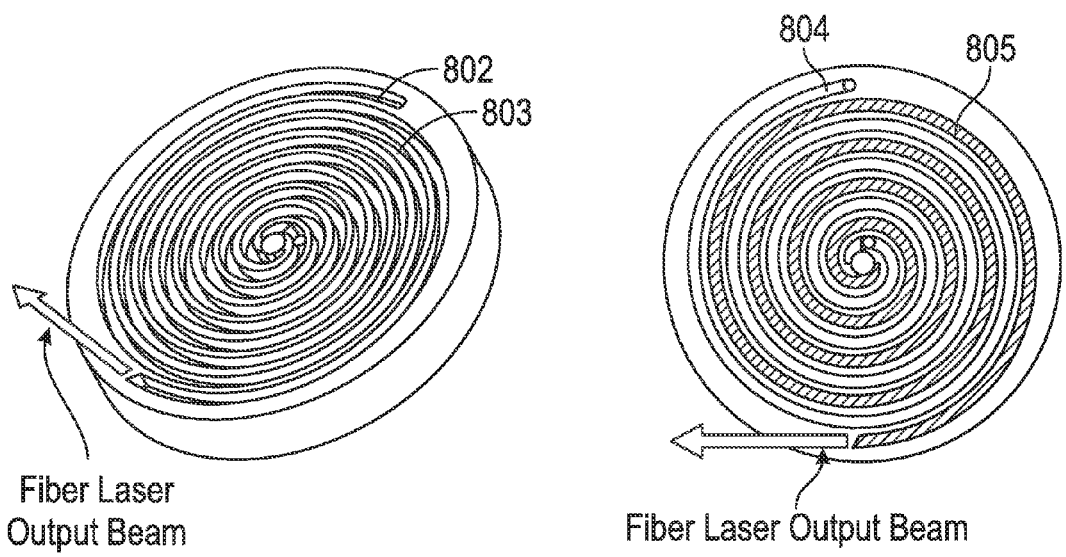
FIG. 41A
FIG. 41B

INTEGRATED ADVANCED HEAT SPREADER FOR SOLID-STATE LASER SYSTEMS

CROSS-REFERENCE TO RELATED APPLICATIONS

This application is a continuation-in-part application of Patent Cooperation Treaty Application No. PCT/US11/22289, entitled "Thin Disk Laser Operations with Unique Thermal Management", filed on Jan. 24, 2011, which claims priority to and the benefit of the filing of U.S. Provisional Patent Application Ser. No. 61/297,546, entitled "Enhanced Thin Disk Laser Performance with Near Isothermal Control", filed Jan. 22, 2010, and the specifications and claims thereof are incorporated herein by reference.

This application also claims priority to and the benefit of the filing of U.S. Provisional Patent Application Ser. No. 61/512,730, entitled "Integrated Advanced Heat Spreader with Solid-State Laser Systems", filed on Jul. 28, 2011, and the specification and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

This invention focuses on the integration of an advanced heat spreader utilizing a closed loop heat pipe containing various "working fluids" like acetone, water and liquid nitrogen to provide greatly improved thermal management for solid-state laser including thin disk lasers, planar waveguide, and fiber lasers plus both edge emitting stacked bar laser diodes and vertical-cavity surface-emitting laser (VCSEL) diodes. The initial emphasis was projected most suitable for the lasing thin disk which are nominally 200 microns ($10^{-6}$ meters), 1-2 cm in diameter and crystalline/ceramic material like Yb:YAG, tungstates, sesquioxides and others, the immediate practical use of this integration should have very good benefits. The emphasis of this enhanced thermal management of all types of solid-state laser systems is an approach to achieve much more uniform and efficient conduction for the lasing solid-state systems at high powers to significantly improve its beam quality (BQ) thus enabling much more widespread use. Besides the solid-state laser system itself, there are several other uses such as high power mirrors and other HEL infrastructural components including pumping laser diodes and transmissive "conditioning" optics of the laser diode pump radiation. The AHS system coupled with a mechanical-control flow of the oscillating heat pipe flow can be applied to lasing laser diodes, semiconductor laser, quantum cascade, and heterostructures lasing system plus nonlinear optical components. Also, this AHS integrated with many all types of solid-state lasers can be operated at room temperature and sub-zero temperature down to below 80° K.

2. Description of Related Art

Note that the following discussion may refer to a number of publications by author(s) and year of publication, and that due to recent publication dates certain publications are not to be considered as prior art vis-a-vis the present invention. Discussion of such publications herein is given for more complete background and is not to be construed as an admission that such publications are prior art for patentability determination purposes.

High power solid-state lasers (SSL) have become the emphasis for industrial and commercial applications due to their efficiency, compactness and small supporting infrastructure relative to high power electrical or chemical gas laser system. Scaling SSL to high powers (>kW's and approaching 100 kW's) has required specific attention to thermal management. Over the last 15 years, thin disk laser has been developed and matured in Germany into reliable laser systems operating at kW's of average powers and used extensively for welding, cutting and material processing. In spite of this success, there are several issues needed to be improved to advance TDL technology to next level, including (1) thermal management; (2) power limitations by amplified spontaneous emission (ASE); (3) thin-disk gain material fabrication for reliable operation and (4) improved homogenization of the pumping laser diode radiation to acquire nearly perfect "flat-top" intensity profiles. This invention initially focuses in the near term on the thermal management aspect of the lasing thin disk which is nominally 200 microns ($10^{-6}$ meters), 1-2 cm in diameter and crystalline/ceramic material like Yb:YAG, tungstates, sesquioxides and others. In addition, all of the advances in TDL using this novel and very unique heat spreader can be applied directly to many other type of high power solid-state laser systems.

The thin disk laser (TDL) pioneered by Giesen has demonstrated high powers (>4-5 kW) and "wall plug" efficiencies better than 20% as discussed by A. Giesen, et al., "Scalable concept for diode-pumped high-power solid-state lasers", Appl. Phys., Vol. B 58, 363 (1994) and J. Speiser, "Fifteen years of work on thin-disk lasers: results and scaling laws", IEEE J. Sel. Top. Quant. Electr., Vol. 13 (3), p. 598 (2007). FIG. 1 illustrates the concept consisting of a lasing thin disk (TD), a hemispherical resonator having back side of thin disk serving as a flat mirror, a cooled heat sink for the TD and the laser diode pump radiation coming from a parabolic multi-pass reflector assembly not shown as disclosed in U.S. Pat. Nos. 6,438,152; 6,577,666; 6,963,592; 7,003,011; and 7,200,160. Although only a part of the pump beam is absorbed by the thin gain element, the pump efficiency can be optimized by re-imaging the pump radiation several times with an optical system of a parabolic mirror and redirecting mirrors. Up to 32 passes of the pump beam can be used with more than 90-98% of the pump power absorbed in the disk. The output laser power at kW levels is multi-transverse mode with M2 values from 5-20 and single, lowest order mode cw operation occurs only for a few 100's of watts.

Even with these impressive results, it is important to achieve much higher single mode laser operation with good beam quality (BQ) from thin disk lasers. Improved high power BQ operation of TDL would enable many more applications. The diminished BQ performance at high powers, however, is the most significant shortcoming of this promising laser technology and is caused by the thermal behavior of the lasing thin disk. As the TD is heated by the optical pumping radiation, it experiences non-uniform temperature profiles, which creates a dynamic lens plus significant thermally-induced stress. These stresses produce both time and spatial varying birefringence in the disk that causes laser polarization changes and non-spatial phase changes across the thin disk. This polarization change and the phase changes, respectively, reduce the laser energy extraction from the thin disk and further degrade the TDL beam quality. All of these thermal problems are attributed to insufficient thermal management of the thin disk. To date, nearly all high power TDL use jet impingement cooling which produces a spatially non-uniform cooling of the thin disk. In this patent application, the use of a special variation of heat pipes produces significantly improved isothermal cooling of the thin disk that will lead to greatly improved beam quality plus good energy extraction from the thin disk laser. This invention should greatly expand the application of the TDL.

The main difference between TDL and conventional rod or slab lasers is the geometry of gain medium. For the TDL, the thickness of the laser crystal (or ceramic) is quite small, 100-200 μm and the diameter is typically 1-2 cm. The large surface-to-volume ratio of the thin disk like fiber lasers makes possible the efficient removal of heat from the TD. As heat is removed via diffusion through the back side of the TD, the temperature distribution in the radial direction could be made quite uniform provided the central area of the disk is pumped by a near flat-top intensity profile and the diffusive cooling is very efficient. Today's operating TDL, however, do not have these ideal pumping and cooling conditions. The present invention deals with the thermal management of the thin disk in an attempt to achieve much more uniform and efficient conduction cooling for the TD's. The most commonly employed approaches for the thin disk lasers use jet impingement cooling of two configurations shown in FIG. 2. These types are the "cold plate" (or "cold finger") thin disk and the "capped" thin disk. In the former, the thin disk is bonded to a "cold plate" (usually 1 mm thick CuW for Yb:YAG lasing thin disk) which is cooled on the back side via water jet impingement. [D. J. Womac, "Correlating Equations for Impingement Cooling of Small Heat Sources with Single Circular Liquid Jets", Transactions of ASME, Vol. 115, p. 106 (1993)] In the "capped" thin disk, an approximate 1 mm thick, undoped crystal or polycrystalline ceramic (like YAG) is bonded to a thin disk like Yb:YAG. The Yb:YAG is then cooled directly to maximize the diffusion of heat through the 200 micron thick lasing material (Yb:YAG is this case) as disclosed in U.S. Pat. Nos. 6,600,763 and 7,200,160. The 1 mm thickness material provides mechanical strength for the nominal 200 micron laser gain material. The most widely used gain medium for TDL is Yb:YAG as discussed by C. Stewen, et al, "A 1-kW cw thin disc laser", IEEE J. Sel. Top. Quant. Electr., Vol. 6 (4), p. 650 (2000); K. Contag et al., "Theoretical modeling and experimental investigations of the diode-pumped thin disk Yb:YAG laser", IEEE J. Quant. Electr., Vol. 29 (8), p. 697 (1999); D. Kouznetsov, et al., "Surface loss limit of the power scaling of a thin-disk laser", J. of Opt. Soc. Amer., Vol. B-23 (6), p. 1074 (2006). Lately many other system has been demonstrated like Yb:KGW as discussed by G. Paunescu, et al., "100-fs diode-pumped Yb:KGW mode-locked laser", App. Phys. B, Vol. 79, p. 555 (2004); J. E. Hellstrom, et al., "Efficient Yb:KGW lasers end-pumped by high-power diode bars", Appl. Phys. B, Vol. 83, p. 235 (2006), Yb:KYW as discussed by K. Seger, et al., "Tunable Yb:KYW laser using a transversely chirped volume Bragg grating", Optics Express, Vol. 17 (4), p. 2341 (2009)] and Yb:Lu$_2$O$_3$ as discussed by R. Peters, et al., "Broadly tunable high-power Yb:Lu$_2$O$_3$ thin disk laser with 80% slope efficiency", Opt. Express, Vol. 15 (11), p. 7075 (2007).

Unfortunately, as related above, non-optimum conduction cooling creates a non-uniform uniform temperature across the thin disk surface and in the TD itself as shown in FIG. 3 for the two specific geometric configurations shown in FIG. 2. FIG. 4 illustrates the analysis details and are described later. Such non-isothermal temperature profile conditions cause a thermal lensing effect plus thermal-stress induced birefringence which results in the laser power decreasing due to depolarization loss. A thin disk of a high power TDL has very high power loading in the disk (up to 100's of kW/cm$^3$ absorbed pump power density). To date, approximately 100 W of output power in a diffraction-limited continuous-wave (CW) beam has been obtained with a single disk. Multimode TDL with 6.5 kW output power from a single disk has been demonstrated. [A. Lobad, et al., "Characterization of a Multikilowatt Yb:YAG Ceramic Thin-Disk Laser", J. of Directed Energy, March, 2011] The scaling laws show that the power limit for CW operation can be theoretically projected to be beyond 40 kW for one single disk. [J. Speiser, "Fifteen years of work on thin-disk lasers: results and scaling laws", IEEE J. Sel. Top. Quant. Electr., Vol. 13 (3), p. 598 (2007)] These non-uniform temperature profiles in a lasing crystal disk result in thermal distortion of the output beam and degradation of laser operation due to thermal stress induced birefringence and deformation in the thin disk. FIGS. 3 and 5 show the non-uniform temperature profile in the radial direction and the temperatures increases in the supporting structure for the TD. In FIG. 5, note the significant difference between the "cold-finger" and "capped" configurations of the Yb:YAG thin disk across the radial direction. These temperature variations for the entire thin disk holding assembly also cause significant deformation for the entire structure. FIG. 6 illustrates this effect for both TD configurations. FIG. 7 shows the axial expansion in a 1 cm pumped cross section versus the radius. Any laser beam propagating through this thermally induced lens will create significant detrimental effects on the TDL's ultimate BQ and resulting performance.

Significance of Thermo-Mechanical-Optical Effects

Thermally induced distortion and its effect on optical performance have been studied for rod amplifiers where classical linear theory considers constant thermal, mechanical, and optical properties within the gain material. Much of this work includes yttrium aluminum garnet (YAG) materials that are often used in HAP applications and addresses both steady state and pulsed laser operations. Optical distortions in YAG rod amplifiers caused by the dependence of the material's index of refraction on temperature T and stress σ and have been analyzed extensively. [D. C. Brown, "Nonlinear thermal distortion in YAG rod amplifiers", IEEE J. Quantum Electron., Vol. 34(12), p. 2383 (1998) and W. Koechner, *Solid-State Laser Engineering*, 6$^{th}$ Revision, Springer Series in Optical Sciences, New York, N.Y., 2006] FIG. 8 shows the associated stresses experienced by the two thin disk configurations for the temperature profiles of FIG. 3. For analysis of the thin disk temperature and resultant Optical Path Differences, the results for rod laser will not provide accurate results due to the short thickness, typically 100-200 microns. The exact method for modeling these parameter is shown in FIG. 4 and described below. More recently, measurements of the temperature dependent material properties (Yb:YAG) have enabled much more accurate analysis of the non-quadratic radial and tangential polarizations. [R. Wynne, et al., "Thermal Coefficients of the Expansion and Refractive Index in YAG", Appl. Opt., Vol. 38, p. 3182 (1999) and D. C. Brown, "Nonlinear thermal distortion in YAG rod amplifiers", IEEE J. Quantum Electron., Vol. 34(12), p. 2383, (1998)]. Unfortunately, analyses with temperature dependent properties do not yield simple analytical solutions and instead require a numerical approach such as the finite element method. Similarly, the geometry of the thin disk laser does not lend itself to analytical evaluations of distortion, especially since the design of the structure that mounts the thin disk affects its thermo-mechanical-optical response. [Y. Liao, et al., "Pressure tuning of thermal lensing for high-power scaling", Opt. Lett., Vol. 24(19), p. 1343 (1999)]. Employing the thermo-mechanical properties in the numerical analysis of Yb:YAG yields the radial spatial optical path differences (OPD) experienced per pass. FIG. 9 shows these associated OPD results in Yb:YAG thin disks from the temperature profiles of FIG. 3 being excited at 5 kW/cm² and the deformations of FIG. 6 yielding the birefringence resulting from the thermal stress of FIG. 8.

The cooling technique must be very efficient and at high thermal energy fluxes (>kW/cm²) in order to further increase laser output power. Increase of the pump power to produce higher laser output power naturally results in significantly more heating of the thin disks. The generated heat must be removed as quickly as possible. A good way to attack this issue is to enhance heat transfer from the heat sink by improving the heat sink design and utilizing an advanced thermal management approach. Advanced thermal management that can efficiently and quickly remove heat from TDL and make uniform temperature in a TDL is the most challenging issue for the next generation of high power TDL. The current thermal management technology is limited not only by the heat removal rate but also by the temperature uniformity. Currently, the achieved highest rate of heat removal from a TDL is approximately 0.3 kW/cm². Scaling the laser output power greater than 10 kW with very good single mode, high BQ thin disk laser operation, this heat removal can become more than 1-2 kW/cm².

For Yb:YAG with CuW (20-80%) as mounting structure, the thermo-mechanical properties are shown below in Table I. [A. Giesen; H. Hügel, A. Voss, K. Wittig, U. Brauch and H. Opower, "Scalable concept for diode-pumped high-power solid-state lasers", Appl. Phys. B 58, 363 (1994); A. Giesen and J. Speiser, "Fifteen years of work on thin-disk lasers: results and scaling laws", IEEE J. Sel. Top. Quant. Electr., 13 (3), 598 (2007); C. Stewen; K. Contag, M. Larionov, A. Giesen, H. Hugel, "A 1-kW cw thin disc laser", IEEE J. Sel. Top. Quant. Electr., 6 (4), 650 (2000); K. Contag et al., "Theoretical modeling and experimental investigations of the diode-pumped thin disk Yb:YAG laser", IEEE J. Quant. Electr., 29 (8), 697 (1999); and R. Wynne, J. L. Daneu and T. Y. Fan, "Thermal Coefficients of the Expansion and Refractive Index in YAG", Appl. Opt., 38, 3182 (1999).]

TABLE I

Thermo-Mechanical Properties

| Yb:YAG | |
|---|---|
| v = | 0.17 |
| E (Young Modulus) = | 284 GPA |
| G (modulus of rigidity) = | E/(1 + v) |
| α = | $2 \times 10^{-6} \{9.459 [1 - \exp(-0.00523*(T + 273.15)]\}$ |
| dn/dT = | $-3.5 + 0.0548*T - 5 \times 10^{-5}*(T + 273.15)^2$ |
| K = | $6.62 * \frac{204}{(T + 177.15)} - 0.439$ |

TABLE I-continued

Thermo-Mechanical Properties

| CuW – 15/85% | |
|---|---|
| v = | 0.3 |
| E (Young Modulus) = | 280 GPa |
| α = | $7.97 \times 10^{-6}$ |
| K = | 175 |

Note:
K in Watts/m*KT in ° C.

With these parameters, the stress induced OPD (optical path differences) experienced in the thin disk for both TD configurations was determined as shown in FIG. 9. In FIG. 10, the curve labeled "180" shows the associated refractivities, Δn, or OPD's—optical path differences for a CuW "cold-finger". These OPD results will be discussed below as FIG. 4 relates. Photoelastic coefficients $\pi_{ij}$ are taken from Brown, supra, plus other are also discussed in more detail below. All of these integrated effects cause thin disk bulging, bending and other deformations which can occur in thin disk gain medium for the small dimensions used in data shown in FIGS. 5-7, 9-10. [Innocenzi, M. E., Yura, H. T., Fincher, C. L. and Fields, R. A., "Thermal modeling of continuous-wave end-pumped solid-state lasers", Appl. Phys. Lett. 56 (19), p. 1831, 1990; and Liao, Y., Miller, R. J. D., and Armstrong, M. R., "Pressure tuning of thermal lensing for high-power scaling", Opt. Lett. 24(19), p. 1343, 1999.]

Relation of OPD to Beam Quality: Thin Disk Temperature Control Needs

SWith the thermal lensing effects caused by non-uniform expansion of the thickness, the change of refractivity index (n) varies with the temperature of lasing thin disk. For a thin disk of thickness d having an integrated refractivity Δn along its axial direction (FIG. 11) and operating at a wavelength λ, the laser optical phase difference as a function of the radius is as follows: [K. M. Swift, R. D. Rathge and L. A. Schlie, "Dispersion of Gases in Atomic Iodine Lasers at 1.315 μm", Appl. Optics, Vol. 27, p. 4377 (1988)].

$$\Delta\phi(r) = 2\pi * \Delta n * d/\lambda \quad (1)$$

For a good beam quality, the condition $\Delta\phi \leq \lambda/10$ needs to exist. At room temperature for Yb:YAG, the thermal-optical coefficient $dn/dT = 9 \times 10^{-6}/°$ K. [R. Wynne, et al., "Thermal Coefficients of the Expansion and Refractive Index in YAG", Appl. Opt., Vol. 38, p. 3182 (1999)] To achieve this condition that $\Delta\phi \leq \lambda/10$, the maximum temperature variation across the thin disk must be <20° K. A very good beam quality should have $\Delta\phi \leq \lambda/20$ and an excellent BQ should be $\Delta\phi \leq \lambda/50$ which corresponds, respectively, to temperature variations across the thin disk to be less than 10° K. and 2° K. To meet this requirement, a very good thermal cooling method is required that can provide a much more uniform temperature distribution across and through the thin disk. The results of FIGS. 4-5 and 9 shown below clearly illustrate that jet impingement cooling will not improve the BQ for the TDL. Besides the degradation in BQ due to these non-uniform temperatures, the temporal variations of the temperature profiles will cause many different modes to have transient behavior and operation.

Modeling Methodology & Sequence of Analysis Approach

FIG. 4 shows flow diagram for the sequence of analyzing the thermal mechanical-optical (TEO) behavior for the thermal, stress and OPD of lasing thin disks and interlays/HR and AR coated structures. All of the analysis performed assumes axisymmetric conditions exist, i.e., no-φ azimuthal dependence exists. First the geometrical infrastructure, dimensions and specific materials are determined. Table I lists the relevant TEO properties used in the analysis. Next, the specific pump power density (watts/unit volume) is established and then the resultant temperature profile is determined for the entire structure being analyzed. From these temperature profiles, the strains ($\in_{rr}$, $\in_{\phi\phi}$, $\in_{zz}$) are computed which are used to establish the deformation (or displacements, $U_r$ and $U_z$). Following next is establishing the stress values (MPa's). From these computed value for the strains, deformations and temperature variations throughout the geometrical structure, the resultant thermal lensing and optical path difference or OPD become available.

Temperature Behavior:

For the generic heat transfer problem, the governing transient equation relating the spatial and transient temperature T with a heat power, "Source" for a medium characterized by thermal conductivity K and heat capacity, c, is given by [H. S. C. a. J. C. Jaeger, Conduction of Heat in Solids, 2nd Ed., Oxford, Clarendon, 1986; M. R. Gosz, Finite Element Method. Applications in Solids, Structures and heat Transfer, Franscis & Faylor, 2006; and W. Koechner, Solid-State Laser Engineering, 2nd Ed., New York: Springer-Verlag, 1988]

$$\nabla \cdot (K\nabla(T) + \text{Source} = \rho c \frac{\partial T}{\partial t} \quad (2)$$

In the analysis described here for a lasing thin disk, the axisymmetric, cylindrical geometry (really a thin disk) with no $\phi$-dependence and operating under cw conditions, heat equations described by $$\frac{1}{r}\left[K\frac{\partial}{\partial r}\left(r\frac{\partial T}{\partial r}\right)\right] + \frac{\partial^2 T}{\partial z^2} + \dot{Q}(r,z) = 0 \quad (3)$$

where $\dot{Q}$ is the heat source in watts/unit volume. In the analysis to date, no external forces on any part of the geometrical structure were ever included. [J. N. Goodier, Theory of Elasticity, 3rd Edition, McGraw-Hill, 1970]

Strain Displacements in r and z Directions:

The steady state equilibrium equation of thermal-induced strains for a non-uniformly heated solid is given as [L. D. Landau and E. M. Lifshitz, Theory of Elasticity—Course of Theoretical Physics, Vol. 7, New York: Pergamon, 1986 (translated from Russian), 3rd Edition]

$$\frac{(1-\nu)}{(1+\nu)}\nabla(\nabla \cdot u) - \frac{(1-2\nu)}{(1+\nu)}\nabla \times \nabla \times u = \alpha\nabla(T) \quad (4)$$

where $\nu$ is the Poisson ratio and $\alpha$ is the thermal expansion coefficient. u is either the radial ($U_r$) or longitudinal ($U_z$) displacement. The "driving forces" in this equation are the expansion coefficient $\alpha$ and the gradient of the temperature throughtout the thin disk stucture. The values of the resulting strains are evaluated for all (r,z) coordinates via the simple expressions, $$\in_{rr} = \frac{\partial U_r}{\partial r} \quad \in_{\phi\varphi} = \frac{U_r}{r} \quad \in_{zz} = \frac{\partial U_z}{\partial z} \quad (5)$$

where $U_r$ and $U_z$ are respectively the radial and axial displacements determined from Eqn (6).

Optical Path Distance (OPD) Through Thin Disk:

The optical path difference through the thin disk by integrating along the z-direction with the "2-factor" accounting for a double pass through the disk per trip. The phase per pass is $$\phi = \frac{2\Box}{\lambda}(n_o - 1) * t_d$$

where $t_d$ is the thin disk thickness, $\lambda$ is the laser wavelength and $n_o$ is the refractive index of the lasing thin disk medium. The associated phase change relation give the phase change, $$\Box\Delta\phi = \frac{2\Box}{\lambda}[(n_o - 1)\Delta t_d - t_d \Delta n] \cdot [6, 7]$$

The strain relations are then the resultant changes in the thin disk thickness $\Delta t_d = \in_{zz} t_d$ and $$\Delta n = \frac{dn}{dT}(T - T_{start}) * t_d.$$

[A. Giesen and J. Speiser, ""Fifteen Year Working with Thin Disk Laser Technology" *IEEE J. of Selected Topics Quantum Electronics*, vol. 13, no. 3, p. 598 (2007)] The resultant total phase change from a single trip through a thin disk is [A. K. Cousins, "Temperature and Thermal Stress Scaling in Finite Length End-Pumped Laser Rods"," vol. 28, no. 4, pp. 1057-1069, 1992]

$$\Delta\varphi_{Thin\_Disk} = 2 * \int_0^{T_d}\left[(n_o - 1) \in_{zz}(r,z) + \frac{\partial n}{\partial T} * (T - T_{start})\right]dz \quad (6)$$

Advanced Thermal Management—Micro-Channeled, Closed Loop Oscillating Heat Pipe

In order to increase the heat removal capability and reach a higher level of temperature uniformity, cooling devices or systems based on phase change heat transfer have been widely utilized. For example, heat pipes are used in laptop or desktop computers. When heat continuously increases in high power TDL's, currently available cooling devices such as liquid cooling employing jet impingement cooling approaches cannot meet the requirement. This is attributed to the facts that the capillary limitation, boiling limitation, vapor flow effect, and thermal resistances occurring in the conventionally configured heat pipe wicks significantly limit the heat transport capability. Therefore, in order to develop a highly efficient cooling system to remove the extra-high heat flux and significantly increase the effective thermal conductivity, a novel mechanically controlled hybrid of advanced high power technology heat pipes is proposed and discussed in detail below.

The value of the higher thermal conductivity from the advanced heat spreader highlighted above described in detail below are shown in FIG. 10 by the comparison of temperature profiles for the two different thermal conductivity, 180 (CuW) and 10,000 W/m*° K. For the latter, the temperature profile through the thin disk is very constant radially except for the very edge of the thin disk. FIGS. 12 13 show respectively the deformation and stress comparisons for these two different thermal conductivities of the effect heat spreaders. Also, note that the maximum temperature at the center of the thin disk is 77° K. lower. FIG. 13 shows the corresponding OPD for the temperature profiles of FIG. 14 creating the deformations and stress induced birefringence. The nearly flat OPD clearly shows the real value of the advanced heat spreader to significantly improve the BQ of thin disk lasers. Operating an 80° K. should make the BQ very good even at very high power loading. In addition, the de-polarizing losses in the thin disk due to stress-induced birefringence should be greatly decreased and maybe completely eliminated.

For the thermal management aspects of the advanced heat spreader (AHS) to be appreciated, first a discussion of main concepts must be described, namely, thin film evaporation, thermally excited oscillating motion, nanofluid, and nano-structure-modified wicks. The advanced heat spreader system uses capillary heat pipe (HP) action in closed, not open tubes that contain "wicks" to return working flow. FIG. 15 illustrates a conventional "wicked" heat pipe This AHS approach eliminates the reduction of working fluid flow by forcing a unidirectional flow. The large "effective" thermal conductivity is created as a result of the unidirectional flow (often aided by check-valve) and the evaporation-condensation action of working fluid (i.e., the latent heat of vaporization), a thermal process called "oscillating motion of the liquid plugs and vapor bubble". FIG. 16 shows the basic concept principle of oscillating heat pipes (OHP) which are described below. It should be noted that the "Heat Pipe Action" can be promoted by various "working fluids" such as water, acetone, ammonia and nitrogen (cryogenic operation) at room temperature (RT).

Thin Film Evaporation

In the presence of a thin film, a majority of heat will be transferred through a very small region. [M. A. Hanlon, et al., "Evaporation Heat Transfer in Sintered Porous Media," ASME Journal of Heat Transfer, Vol. 125, p. 644, (2003); S. Demsky, et al., "Thin film evaporation on a curved surface", Microscale Thermo-physical Engineering, Vol. 8, p. 285 (2004); H. B. Ma, et al., "Fluid Flow and Heat Transfer in the Evaporating Thin Film Region," Microfluidics and Nanofluidics, Vol. 4, No. 3, pp. 237-243. (2008).] When evaporation occurs only at the liquid-vapor interface in the thin-film region, in which the resistance to the vapor flow is negligible, evaporating heat transfer can be significantly enhanced, resulting in much higher evaporating heat transfer coefficient than boiling heat transfer coefficient with enhanced surfaces [S. G. Liter, et al., "Pool-boiling CHF Enhancement by Modulated Porous-Layer Coating: Theory and Experiment," *International Journal of Heat and Mass Transfer*, 44, pp. 4287-4311 (2001)]. Utilizing this information, a number of high heat flux heat pipes have been developed at the University of Missouri (MU). For example, a micro-grooved heat pipe, 6-mm diameter and 135-mm length produces a temperature drop of only 2° C. from the evaporator to the condenser under a heat input of 50 W. Another example is the air-cooled aluminum heat pipe which can remove a total power of 200 W with a heat flux up to 2 MW/m². Utilizing and optimizing thin film regions significantly increases the heat transport capability and effectively increase the effective thermal conductibility of the vapor chamber.

As to thin film evaporation, to confirm the superior capabilities of nanofluids in high-heat removal, Demsky and Ma's model [get reference] was extended to explore evaporating heat transfer through a thin nanofluid film, assuming a 0.2% volume fraction of $Al_2O_3$ added into water as the working fluid. The heat flux in the thin-film region now peaks at 11.6 MW/m² for a superheat of 1.0° C., over 50 percent increase than that in regular fluids, indicating that the nanoparticles can indeed significantly increase evaporating heat transfer through the thin film region. Most excitingly, as the liquid phase continuously vaporizes and consequently the volume fraction of nanoparticles in the thin film region further increases, the effective thermal conductivity of nanofluids becomes higher which may result in even higher heat transfer rates than that. [Ma, H. B., Wilson, C. Borgmeyer, B., Park, K, Yu, Q, Choi, U.S., Tirumala, M., 2006 "Nanofluid Effect on the Heat Transport Capability in an Oscillating Heat Pipe," Applied Physics Letters, Vol. 88, No. 14, pp. 1161-1163]. Effective heat removal also assures temperature uniformity across the evaporating section. Higher thermal conductivity of nanofluids, in addition, will reduce the thermocapillary flow in the thin film region, which significantly assists the nanofluid in passing the thin film region and thus remarkably raise the dryout limit. Using the newly developed model [54], heat transfer and fluid flow in thin film region occurring in the nanostructure wicks will be predicted and the optimum design for the wicks to be used in the evaporating section of the proposed system will be obtained.

As to thermal modeling of oscillating motion, in order to exploit the superior performance of nanofluids for heat transfer enhancement, a number of nanofluid OHPs shown in FIG. 18 was developed and tested in Dr. Ma's lab and found that the nanofluids significantly enhance the heat transport capability in an oscillating heat pipe. [Ma, H. B. and Peterson, G. P. 1997, "Temperature Variation and Heat Transfer in Triangular Grooves with an Evaporating Film," AIAA Journal of Thermophysics and Heat Transfer, 11, pp. 90-97; Ma, H. B., Maschmann, M. R, and Liang, S. B., 2002, "Heat Transport Capability in Pulsating Heat Pipes," Proceedings of the 8th AIAA/ASME Joint Thermophysical and Heat Transfer Conference, June 24-27, St. Louis, Mo.; and Ma, H. B., Wilson, C., Yu, Q, Choi, U.S., Tirumala, M., 2006 "An Experimental Investigation of Heat Transport Capability in a Nanofluid Oscillating Heat Pipe," ASME Journal of Heat Transfer, Vol. 128, November, pp. 1213-1216]. Experimental results show that the nanofluid can enhance the oscillating motion of working fluid in the OHP and the temperature difference between the evaporator and the condenser can be reduced significantly as shown in FIGS. 16 and 17. Clearly, the combined strengths of high-conducting nanofluids, superior evaporating heat transfer rate in thin nanofluid films, and oscillations have resulted in an excellent cooling rate. Examining the total thermal resistance from the evaporator to the condenser, the thermal resistances for the wall were the same for both cases. In other words, the decrease of temperature difference was only from the fluid phase. This means the nanofluids have much more of an effect than the data shown in FIGS. 16 and 17. While it was expected that when the input power was increased the temperature difference should be increased, the experimental results show that the temperature difference did not increase as the input power increased but was almost constant.

Oscillating Motions and Oscillating Heat Pipes

Oscillating single-phase fluid significantly enhances heat and mass transfer in a channel, and has been employed in a number of heat transfer devices. [S. Backhaus, et al., "A Thermo-acoustic Stirling Heat Engine," *Nature*, Vol. 399, p. 335 (1999); U. H. Kurzweg, "Enhanced Heat Conduction in Fluids Subjected to Sinusoidal Oscillations," ASME *Journal of Heat Transfer*, Vol. 107, p. 459 (1985); U. H. Kurzweg et al., "Heat Transfer by High-Frequency Oscillations: A New Hydrodynamic Technique for Achieving Large Effective Thermal Conductivities," *Physics Fluids*, Vol. 27, p. 2624 (1984); M. Kaviany, "Performance of a Heat Exchanger Based on Enhanced Heat Diffusion in Fluids by Oscillation: Analysis," ASME *Journal of Heat Transfer*, Vol. 112, p. 49 (1990); M. Kaviany, et al., "Performance of a Heat Exchanger Based on Enhanced Heat Diffusion in Fluids by Oscillation: Experiment," ASME *Journal of Heat Transfer*, Vol. 112, p. 56]. The oscillating motions generated by a variable-frequency shaker could result in thermal diffusivity for up to 17,900 times higher than those without oscillations in the capillary tubes; however, the use of mechanically driven shakers may limit its applications to miniature devices. Akachi [U.S. Pat. Nos. 4,921,041 and 5,219,020] pioneered a new device, called oscillating heat pipe (OHP), which utilizes the pressure change in volume expansion and contraction during phase change to excite the oscillation motion of the liquid plugs and vapor bubbles. This results in four unique features that do not exist in regular heat pipes: 1) OHP is an "active" cooling device, in that it converts intensive heat from the high-power generating device into kinetic energy of fluids in support of the oscillating motion; 2) liquid flow does not interfere with the vapor flow in high heat removal because both phases flow in the same direction; 3) the thermally-driven oscillating flow inside the capillary tube will effectively produce some "blank" surfaces that significantly enhance evaporating and condensing heat transfer; and 4) the oscillating motion in the capillary tube significantly enhances forced convection in addition to the phase-change heat transfer. Because of these features, the OHP has been extensively investigated in the past several years [H. B. Ma, et al., "Temperature Variation and Heat Transfer in Triangular Grooves with an Evaporating Film," *AIAA Journal of Thermophysics and Heat Transfer*, Vol. 11, p. 90 (1997); K. Park, et al., "Nanofluid Effect on the Heat Transport Capability in a Well-Balanced Oscillating Heat Pipe," AIAA Journal of Thermophysics and Heat Transfer, Vo. 21, No. 2, p. 443 (2007); H. B. Ma, et al., "Heat Transport Capability in an Oscillating Heat Pipe," ASME *Journal of Heat Transfer*, Vol. 130, No. 8, p 081501 (2008); S. M. Thompson, et al., "Experimental Investigation of Miniature Three-Dimensional Flat-Plate Oscillating Heat Pipe," ASME Journal of Heat Transfer, Vol. 131 (4) (2009); Y. Zhang, et al., "Heat Transfer in a Pulsating Heat Pipe with Open End," *International Journal of Heat and Mass Transfer*, 45, pp. 755-764 (2002)]. Additionally, there have been cryogenic demonstrations of oscillating heat pipes. [H. Xu, et al., "Investigation on the Heat Transport Capability of a Cryogenic Oscillating Heat Pipe and Its Application in Achieving ultra-Fast Cooling Rate for Cell Verification Cryopreservation," Cryobiology, Vol. 56, pp. 195-203 (2008)]. The results are so promising that the combination of high-conducting nanofluids with OHP will further the energy carrying capacities. But the current oscillating heat pipe operating only by the thermal excitation cannot produce an extra high level of oscillating frequency. As a result, it is not possible to remove higher thermal heat power flux level more than 0.3 kW/cm$^2$. A mechanically-controlled oscillation motion of two phase flow is shown herein.

High Heat Transport Capability of Nanofluids

High heat transport capability of nanofluids produced by adding only a small amount of nanoparticles into the fluid has qualified nanofluids as a most promising candidate for achieving ultra-high-performance cooling. It has been demonstrated that the dispersion of a tiny amount of nanoparticles in traditional fluids dramatically increases their thermal conductivities. [H. B. Ma, et al., "An Experimental Investigation of Heat Transport Capability in a Nanofluid Oscillating Heat Pipe," ASME Journal of Heat Transfer, Vol. 128, p. 1213 (2006); H. B. Ma, et al., "Nanofluid Effect on the Heat Transport Capability in an Oscillating Heat Pipe," Applied Physics Letters, Vol. 88 (14), p. 1161 (2006); H. B. Ma, et al., "An Investigation of Oscillating Motions in a Miniature Pulsating Heat Pipe," Microfluidics and Nanofluidics, Vol. 2, No. 2, pp. 171-179 (2006); K. Park, et al., "Nanofluid Effect on the Heat Transport Capability in a Well-Balanced Oscillating Heat Pipe," AIAA Journal of Thermophysics and Heat Transfer, Vo. 21, No. 2, p. 443 (2007)]. Since 1995, outstanding discoveries and seminal achievements have been reported in the emerging field of nanofluids. The key features of nanofluids discovered so far include (a) thermal conductivities far above those of traditional solid/liquid suspensions [J. A. Eastman, et al., "Anomalously Increased Effective Thermal Conductivities of Ethylene Glycol-Based Nano-Fluids Containing Copper Nano-Particles," *Applied Physics Letters*, Vol. 78, p. 718 (2001)]; (b) a nonlinear relationship between thermal conductivity and concentration [S. Choi, et al., "Anomalous Thermal Conductivity Enhancement in Nano-tube Suspensions," *Applied Physics Letters*, Vol. 79, p. 2252 (2001)]; (c) strongly temperature-dependent thermal conductivity [S. K. Das, et al., "Heat Transfer in Nanofluids—A Review," Heat Transfer Engineering, Vol. 27(10), p. 3 (2006)]; and (d) significant increase in critical heat flux (CHF) [Y. Xuan, et al., "Investigation on Convective Heat Transfer and Fluid Features of Nanofluids," *Journal of Heat Transfer,* 125, pp. 151-155 (2003); I. C. Bang, et al., "Boiling heat transfer performance and phenomena of Al$_2$O$_3$-water nano-fluids from a plain surface in a pool," International Journal of Heat and Mass Transfer, Vol. 48 (12), p. 2407 (2005)]. These key features make nanofluids strong candidates for the next generation of coolants to improve the design and performance of thermal management systems. Most recently, nanofluids were put into an oscillating heat pipe (OHP) and it was found that nanofluids significantly enhance the heat transport capability in the OHP. [Y. Zhang, et al, "Nano-particle Effect on the Thermal Conductivity of Nanofluids,": International Journal of Heat and Mass Transfer, Vol. 51 (19-20), p. 4862 (2008)]. As shown in FIG. 17 when the nanofluid (HPLC grade water containing 1.0 vol. % 5-50 nm of diamond nanoparticles) was charged to the OHP, the temperature difference between the evaporator and the condenser can be significantly reduced. For example, when the power input added on the evaporator is 100 W, the temperature difference can be reduced from 42° C. to 25° C. It appears that the nanofluid can significantly increase not only the effective thermal conductivity, but also the convection heat transfer and the thin film evaporation in the OHP. The heat transport capability in the nanofluid OHP depends on the operating temperature. When the operating temperature increases, the heat transport capability significantly increases. And the temperature difference between the evaporator and condenser as shown in FIG. 18 was almost constant as the input power increases, and the investigated OHP with charged nanofluids can reach 0.028° C./W at a power input of 336 W, which might set a record of thermal resistance in the similar cooling devices. FIG. 19 shows the effect of nanoparticles on the thin film evaporation of the working fluid within the OHP. This unique property of decreasing temperature variations with increased energy is a most fortuitous condition for the creation of an isothermal profile across a lasing mediums as the pumping power is increased.

BRIEF SUMMARY OF THE INVENTION

The present invention is of an integrated high power thin disk laser and a novel heat spreader having effective thermal conductivity $K_{eff}$≅10-20,000 W/m*K, which enables greatly improved thin disk laser (TDL) performance, as well as concomitant methods.

The near isothermal behavior applied using this heat spreader on the lasing thin disk greatly reduces TDL dynamic focusing, temperature induced-stress-birefringence resulting in potential TDL laser beam quality performance. The heat exchanger employs a mechanically controlled, two phase oscillating motion of the working fluid of heat pipe to achieve much higher effective thermal conductivity and resultant heat transfer, greater than kW's/cm$^2$, a value never before conceived nor demonstrated. Further enhanced performance is achieved via use of nanoparticles and nano-fluids dispersed in the working fluid to acquire the near isothermal control of the thin disk laser. In addition, this integrated laser-unique heat pipe thermal management system allows good CTE (coefficient of thermal expansion) between the various optical components in the lasing thin disk assembly. This condition exists since the material used to make the heat pipe system can be made from basically any material including the laser material itself as like Yb:YAG lasing material and ceramic YAG, an arrangement which could provide nearly perfect CTE matching over the entire operating temperature range from sub-cryogenic to greater than room temperatures. Applications of this novel heat spreader can be implemented with other solid-state lasers and optical system components.

The effects of temperature variations in the lasing thin disk shown in FIG. 3 create conditions not desirable for achieving good BQ in TDL and single transverse mode operation. These effects, namely (1) transient dynamic focus, (2) OPD difference across the thin disk, (3) deformation of the thin disk and its supporting structure and (4) the stress induced birefringence are the reason for poor BQ and multi-transverse mode operation. Since all of the effects are directly attributable to the temperature variation across and throughout the thin disk and its supporting mechanical structure, it is important to have an alternate thermal management system for the thin disk to create nearly isothermal temperature control. Direct jet impingement cooling of the thin disk will not fulfill the need. The desired features can be achieved using a "Heat Spreader" having an effective, very large thermal conductivity K=10-20,000 W/m*K as shown in FIGS. 20-21 and the "Heat Spreader" performance, FIG. 22 plus internal structure of such a OHP, FIG. 23. Such a "Heat Spreader would provide a nearly isothermal temperature profile in the lasing thin disk. The analysis of temperatures in the TD plus the deformations, OPD's (meaning integrated refractivities (Δn) in the axial lasing direction in the thin disk and low stress-induced birefringence clearly illustrate the value of such of a "heat spreader". These excellent optical conditions are very conducive to produce a good BQ, single transverse mode operation at high power for a thin disk laser. Previously, a much lower power, heat pipe having micro-surface capillaries was shown to give somewhat similar thermal conductivities but it is limited to a maximum heat transfer of 25-50 watts, an operation never suitable for higher power laser requiring heat transfer of greater than this and sometimes more than a kW/cm$^2$. [D L. Thomas, "Thin Planar Heat Spreader", U.S. Pat. No. 6,158, 502; and D. L. Thomas, "Thin, Planar Heat Spreader", U.S. Pat. No. 6,167,948.] FIG. 24 shows two variations of the mounting of a thin disk on to an advanced heat spreader described in this invention.

The method of making such a "heat spreader" is to use a "mechanically-controlled, two-phase heat pipe as shown in FIGS. 19-20 and 34. Certain properties of this novel-high performance system are listed next.

The mechanically-controlled two-phase oscillating motion can reach a very high flow rate, which can reach an extra high level of temperature uniformity resulting in higher than all other kinds of heat pipes including the standard vapor chamber.

The proposed hybrid system will utilize both the sensible and latent heats to transport heat from the hot area to the cold area while the conventional heat pipes including the vapor chamber transport heat only by the latent heat. Due to the latent heat, the temperature distribution can reach a high level of uniformity. The proposed nano-structures will modify the evaporating surface and maximize the thin film evaporation, resulting in an unprecedented evaporating heat transfer rate.

Due to the oscillating motion, the nanofluid can be used, which will significantly increase the heat transport capability.

The plasma-nano-coated surface can modify the condensing surface resulting in high condensing heat transfer rate.

Due to the two phase system, the pressure drop is much lower than that of single liquid phase, which can produce an extra high flow rate.

The proposed system will effectively integrate extra high level of heat transfer rate of thin film evaporation, high thermal transport capability of nanofluids, low pressure drop, and strong oscillating motions controlled by mechanical system, which can result in an extra high heat transport capability.

In addition to the phase change heat transfer, the strong oscillating motion of nanofluids existing in the proposed system will result in additional vortex in the liquid plugs significantly enhancing the heat transfer rate.

Advanced Heat Pipe Manufacturing

In addition to the proposed directions to increase the rate of heat removal from the thin disk, there are two more methods that optimize operation of the heat spreader.

First, several materials with high values of heat conductivity are utilized to produce the heat spreader prototypes. Criterion for this optimization is to achieve the highest heat removal rate. The heat-pipe elements from those materials are produced by femtosecond laser micromachining that is not sensitive to mechanical properties of those materials. This approach allows removing most requirements on mechanical properties of the materials characteristic of the currently employed mechanical machining methods and employing several non-standard materials for production of the heat-spreader prototypes. In particular, silicon nitride ceramics are used for prototype fabrication since they have demonstrated outstanding thermal properties combined with extremely low CTE. The high hardness of the ceramics limits accuracy and quality of their mechanical machining preventing fabrication of microstructures (e.g., micro-channels) on them.

Secondly, the design of the heat pipe is also optimized employing the unique capabilities of femtosecond laser micromachining providing excellent quality and precision of micro-machining. Recently, a prototype of a micro-channel was fabricated on a thin glass plate at the femtosecond laser facility of CoE Center of Ultrafast, Ultraintense Lasers (CUUL) at the University of Missouri. That result demonstrates the unique capability to make several thin or ultra-thin plates with the heat pipes and stack them together to increase the heat removal rate. The unique capabilities of the femtosecond micromachining allow other multiple ways to optimize the heat spreader design, e.g., by decreasing size of the micro-channels and making them of complicated shape. Besides this unique method of fabricating OHP, trade-offs with other approaches like chemical etching, electric discharge plasma cutting and cw and pulsed laser method be conduction provides alternatives.

Detailed Description of Advanced Heat Spreader

In FIG. 22 shows recent data on the performance of a newly developed oscillating heat pipe (OHP) by Prof. Ma's group at MU. It shows the first demonstration of an oscillating heat pipe having a thermal conductivity greater than 10,000 W/m*° K. This particular referred to as three-dimensional, flat plate oscillating heat (3D-FP-OHP), shown in FIG. 23, was tested in the following procedure: Heat was applied by a 1 square inch heating element on one side of the heat spreader's evaporator section, and heat was removed from both sides of the spreader's condenser section with good insulation surrounding the adiabatic sections. Two cooling blocks attached to one side of the spreader's condenser area, respectively, with constant 60° C. incoming coolant. The oscillating heat pipe has a dimension of 13 cm×4 cm and 0.3 cm. [S. M. Thompson, et al, "Effect of Localized Heating on Three-Dimensional Flat-Plate Oscillating Heat Pipe", J. of Heat Transfer, Vol. 131 (4), 2009]. The key to fast flow is due to narrow grooves, nominally 700 microns diameter. The method for making such a "heat spreader" at higher powers, kW/cm$^2$, and preferred for a high power thin disk laser, is to use a "mechanically-controlled, two-phase heat pipe as shown in FIG. 21. An integrated high power thin disk laser and a novel heat spreader having effective thermal conductivity $K_{eff} \cong 10$-20,000 W/m*K enables greatly improved thin disk laser (TDL) performance. The near isothermal behavior of the heat exchanger (really "heat spreader") on the lasing thin disk will greatly reduce the TDL dynamic focus, temperature induced-stress-birefringence resulting in potential TDL laser beam quality performance. The heat exchanger employs a mechanically controlled, two phase oscillating motion of the working fluid of heat pipe to achieve much higher effective thermal conductivity and resultant heat transfer, greater than kW/cm$^2$, a value never before conceived or demonstrated. Further enhanced performance is achieved via use of nanoparticles and nano-fluids inside of the working fluid to acquire the near isothermal control of the thin disk laser. In addition, this integrated laser-unique heat pipe thermal management system allows good CTE (coefficient of thermal expansion). This condition exists since the material used to make the heat pipe system can be made from basically any material including the laser material itself as like Yb:YAG lasing material and ceramic YAG, an arrangement which could provide nearly perfect CTE over the entire operating temperature range from sub-cryogenic to greater than room temperatures.

Design of Advanced Heat Spreader System

Due to the limitations existing in the conventional single phase flow, vapor chamber, and oscillating heat pipe, a novel mechanically-controlled hybrid oscillating two-phase system, as shown in FIG. 20, is described, which consists of a 3-D mechanically-controlled two-phase nanofluid oscillating flow and thin film evaporation. The design utilizes the extra-high evaporating heat transfer of thin film evaporation, strong oscillating motion, higher heat transport capability of nanofluids, and nanostructure-modified surfaces and wicks to significantly increase the heat transport capability in the proposed hybrid phase-change heat transfer device. FIG. 20 illustrates one specific design of the hybrid mechanically-controlled oscillating two-phase system. In order to form a very strong oscillating motion with high frequency, the oscillating motion will be mechanically controlled using fluid pumps including piezo-electric actuated pumps. A train of vapor bubbles and liquid plugs will flow through the channel with high speed. The channel wall 987, which can be fabricated from a microstructured wick, also acts as an evaporating surface. The channel shape, channel arrangement, and channel number will depend on the total power, heat flux level, and heat sources. The open region between the liquid plugs will have an extra fast evaporation rate through nanostructure wicks. The pore size in the evaporating section is optimized in order to have the maximum number of the thin film regions, excellent wetting characteristics, and optimum thickness for the maximum boiling limit. These wicks in the condensing area must be optimized to significantly increase the condensing heat transfer by using hydrophobic surfaces. The wetting characteristics gradually vary from the perfectly wetting condition (hydrophilic) in the evaporating section to the partially wetting (hydrophobic) in the condensing section. The flow path for the liquid flow from the condensing section to the evaporating section is optimized to significantly reduce the pressure drop.

When heat is added on the evaporating region of the microstructured surface from the heat source, as shown in FIG. 15, the heat is transferred to both the liquid plugs (sensible heat) and the region between the liquid plugs (latent heat). As the heat reaching the region between the liquid plugs, it is transferred through the nanostructure wicks and to the liquid-vapor interface, where the thin evaporation heat transfer occurs. The vapor generated in these areas will be immediately removed by the mechanically-controlled two-phase flow, and directly brings the heat from the evaporating (hot) area to the condensing (cold) area and condenses into liquid. The condensate will be pumped back by the mechanical controlled oscillator. When the total power and the heat flux level are high, the capillary force produced in the wick cannot overcome the pressure drop in the wick, the vapor chamber will reach the capillary limit, which is the reason why the current available heat pipe, although it is much better than single phase heat transfer cannot remove the heat at an extra-high level of heat flux such as occurring in the high power TDLs. When the input power is higher, while the oscillating motions of liquid plugs and vapor bubbles produced by the mechanically controlled oscillator can remove heat by the forced convection, it can directly help to bring condensate back to the evaporating surface.

Equally important, the oscillating motion makes it possible to use nanofluid as the working fluid. Although the nanofluid was introduced only about 10 years ago, no application for its use was available until the nanofluid oscillating heat pipe is developed. The reason is that the nanoparticles can collect on the walls and thus the effect on the heat transport capability of displaced nanofluid significantly reduces. For the system described in this invention, the oscillating motion excited existing in the oscillating heat pipe (which can achieve high frequency) directly disturb the nanoparticles and make the nanoparticles to be suspended in the base fluid. The addition of nanoparticles into the working fluid in the OHP can further increase the heat transport capability of the thin film evaporator on the microstructured surface. Again due to the oscillating motions, the nanoparticles will not separate from the working fluid of the OHP. It should be noted that the nanoparticles will be added to the working fluid while the heat spreader is be filled prior to it being sealed off. Finally, it is also very important to note that cryogenic operation has already been demonstrated in oscillating heap pipe system.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 30. Single "Spiral"-Hybrid Fluid-Pump Oscillating Heat Pipe as Advanced Heat Spreader for Thin Disk Laser.

FIG. 40. Schematic of advanced heat spreader for establishing specific "starting conditions" for OHP providing enhanced thermal management for solid-state lasers including thin disk lasers, bulk solid-state lasers, fiber lasers and microchip lasers in either cw, pulsed and ultrashort operating mode.

FIG. 41. Specific example show "thermal electrical load" in alternate "spokes" of FC-OHP to establish quick thermal response of advanced heat spreader using forced convective flow of OHP "working fluid" and plugs and bubbles.

DETAILED DESCRIPTION OF THE INVENTION

Figure 20A:
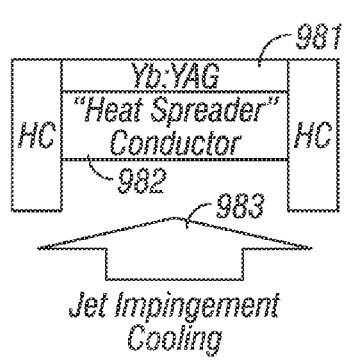
FIG. 20. Inventive mechanically-controlled oscillating two-phase flow system serving as a "heat spreader". A "Heat Spreader" for thin disk (Yb:YAG for this example case) comprises a specialized heat pipe having effective thermal conductivity of 10-20,000 W/m*K, which is much higher than diamond. "HC" refers to hollow cylinder which provides coolant to the heat spreader.
Figure 20B:
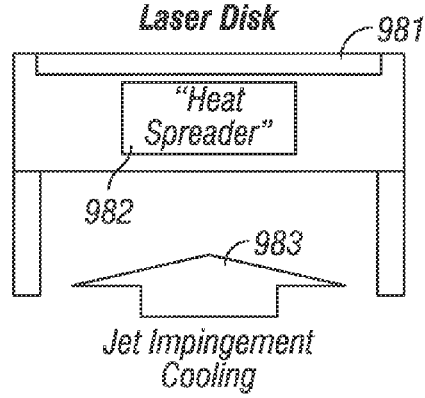
Figure 21:
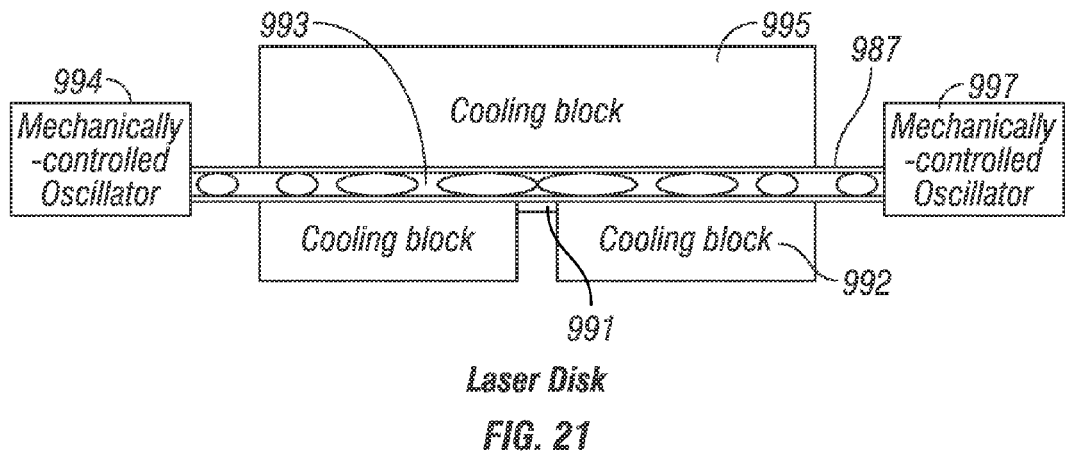
FIG. 21. Conceptual configuration of lasing thin disk on mechanically controlled oscillating two-phase flow system serving "heat spreader" using micro-heat pipes having super-high effective thermal conductivities with much higher heat fluxes, >kW/cm². Note: The "heat spreader" of the invention does not require jet impingement cooling. A specialized heat pipe goes to "cold finger-plate" for heat removal from system as illustrated in FIG. 25.

The encompassing methodology of making a "heat spreader" according to the invention is preferably to use a "mechanically-controlled, two-phase heat pipe as shown in FIGS. 20-21. An integrated high power thin disk laser and a novel heat spreader having effective thermal conductivity $K_{eff} \cong 10$-20,000 W/m*K enables greatly improved thin disk laser (TDL) performance. The potential near isothermal behavior of the heat exchanger (really "heat spreader") on the lasing thin disk should greatly reduce the TDL dynamic focus, temperature induced-stress-birefringence resulting in potential TDL laser beam quality performance. The heat exchanger employs a mechanically controlled, two phase oscillating motion of the working fluid of heat pipe to achieve much higher effective thermal conductivity and resultant heat transfer, greater than kW/cm$^2$, a value never before conceived or demonstrated. Implementing a closed cycle fluid pump into the oscillating heat pipe (OHP) structure greatly improves the thermal conductivity at high fluencies due to the enhanced convection of the working liquid-vapor fluid than capable using the internal pressure created during the vaporization process of the OHP. Further enhanced performance is achieved via use of nanoparticles and nano-fluids inside of the working fluid to acquire the near isothermal control of the thin disk laser. In addition, this integrated laser-unique heat pipe thermal management system allows good CTE (coefficient of thermal expansion). This condition exists since the material used to make the heat pipe system can be made from basically any material including the laser material itself as like Yb:YAG lasing material and ceramic YAG, an arrangement which could provide nearly perfect CTE over the entire operating temperature range from sub-cryogenic to greater than room temperatures.

The method of making such a "heat spreader" is preferably to use a mechanically-controlled, two-phase heat pipe as shown in FIG. 21. An integrated high power thin disk laser and a novel heat spreader having effective thermal conductivity $K_{eff} \cong 10$-20,000 W/m*K enables greatly improved thin disk laser (TDL) performance. The near isothermal behavior of the heat exchanger (really "heat spreader") on the lasing thin disk greatly reduces TDL dynamic focus, temperature induced-stress-birefringence resulting in potential TDL laser beam quality performance. The heat exchanger employs a mechanically controlled, two phase oscillating motion of the working fluid of heat pipe to achieve much higher effective thermal conductivity and resultant heat transfer, greater than kW/cm$^2$, a value never before conceived or demonstrated. Further enhanced performance is achieved via use of nanoparticles and nano-fluids inside of the working fluid to acquire the near isothermal control of the thin disk laser. In addition, this integrated laser-unique heat pipe thermal management system allows good CTE (coefficient of thermal expansion). This condition exists since the material used to make the heat pipe system can be made from basically any material including the laser material itself as like Yb:YAG lasing material and ceramic YAG, an arrangement which could provide nearly perfect CTE over the entire operating temperature range from sub-cryogenic to greater than room temperatures.

The properties of this novel-high performance system include:

- The mechanically-controlled two-phase oscillating motion can reach a very high flow rate, which can reach an extra high level of temperature uniformity resulting in higher than all other kinds of heat pipes including the standard vapor chamber.
- The hybrid system utilizes both the sensible and latent heats to transport heat from the hot area to the cold area while the conventional heat pipes including the vapor chamber transport heat only by the latent heat. Due to the latent heat, the temperature distribution can reach a high level of uniformity. Nanostructures used modify the evaporating surface and maximize the thin film evaporation, resulting in an unprecedented evaporating heat transfer rate.
- Due to the oscillating motion, the nanofluid can be used, which significantly increase the heat transport capability.
- The plasma-nano-coated surface can modify and improve the condensing surface resulting in high condensing heat transfer rate.
- Due to the two phase system, the pressure drop is much lower than that of single liquid phase, which produces an extra high flow rate.

The hybrid system effectively integrates extra high level of heat transfer rate of thin film evaporation, high thermal transport capability of nanofluids, low pressure drop, and strong oscillating motions controlled by mechanical system, which results in an extra high heat transport capability.

In addition to the phase change heat transfer, the strong oscillating motion of nanofluids existing in this hybrid system will result in additional vortex in the liquid plugs that significantly enhancing the heat transfer rate.

Referring to FIG. 21, this unique integrated thermal management system for a thin disk laser in its simplest form consists of a thin disk (TD) 991, nominally 0.2 millimeters (mm) in thickness and 1-2 cm diameter which is mounted on a supporting structure, like a nominally 1 mm copper-tungsten material or an undoped host material identical to the thin disk laser material like YAG for Yb:YAG laser system. This integrated TD is then placed on an advanced heat spreader 993 as also shown in FIG. 20 as 982 which is cooled (i.e., heat removed from it) in its simplest form by jet impingement water cooling 983 or other coolants like acetone, ammonia and liquid nitrogen. The heat spreaders 993 and 995 action-oscillating liquid plugs and vapor bubbles, however, have a very high thermal conductivity created by the vaporization-condensation of a closed cycle oscillating heat pipe system. Various types of fluid pumps 997 can be used including piezoelectric fluid pumps where the flow is closed loop, unidirectional and can flow from left to right in FIG. 20 or the opposite but one of these directions as part of closed loop flow in this convection driven (via inline fluid pump) OHP.

Second Embodiment

Figure 24A:
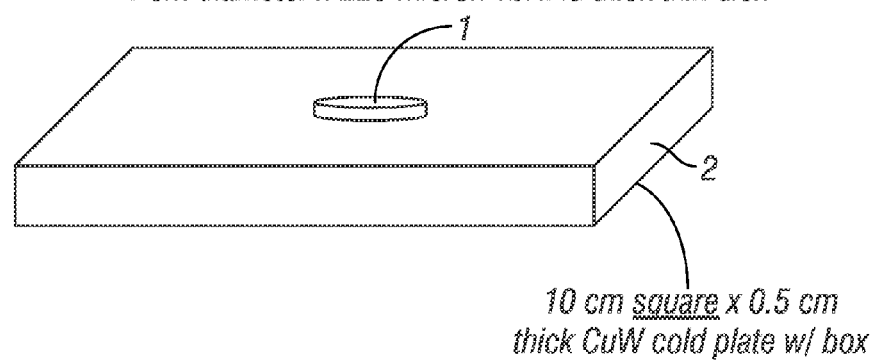
FIG. 24. Various thin disk mounting configurations with Advance Heat Spreader-Oscillating Heat Pipe with forced convection using mechanically driven fluid pump: Cases 1 and 2 for square (or rectangular) and circular, respectively, advanced heat spreader plate.
Figure 24B:
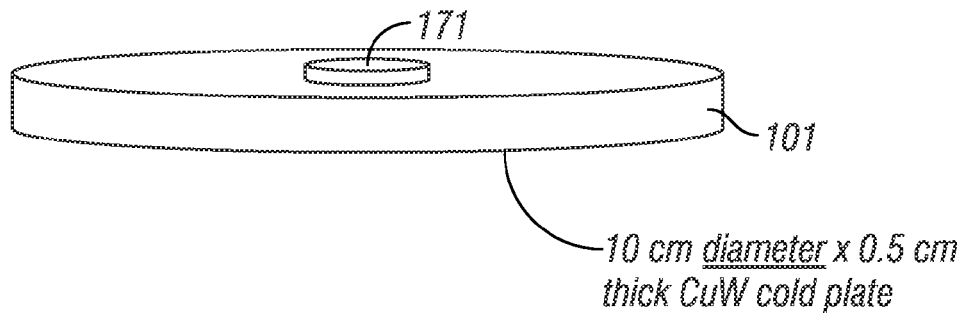

This embodiment comprises use of either a square or rectangular array of parallel oscillating heat pipes configured very close to each other to create a near isothermal condition on the heat spreader top surface at high power including greater than kW's/cm². FIGS. 24-a and 26 illustrate square/rectangular linear array system for a very high thermal conductivity heat spreader for use with a high power, good operating thin disk laser system. The thin disk 1 and/or 899 is mounted on the oscillating closed loop heat pipe 2 and/or 41, which is internally integrated and coupled with ports 48 and 45 to the working fluid pump not shown. FIG. 26-b shows this linear array advanced heat spreader system (hereafter AHS system) consisting of the top 54, two sides 51 and 55 and the inlet coolant connection 52 and outlet connection 79 for heat removal from the integrated advanced heat spreader system 982 in FIG. 20-b. The coolant can be water or liquid coolants like acetone, ammonia or nitrogen (cryogenic). It is very important to recognize this coolant removes thermal heat from the AHS system that has heat "conducted diffusively" via the heat spreader from the warm lasing thin disk 1. The integrated AHS system shown in FIG. 26-d consists of four sections, 71, 41, 73 and the bottom cooling section consisting of components 78, 76, 46, 74, 77 and 89. The thin disk 1 in FIG. 24-a is mounted on optically polished section 71 in FIG. 26-d and is typically about 1 mm thick. Section 41 is the operating region top view of the AHS systems and the details are shown in FIGS. 26-c (top view of section 41) and 25-e (top view of section 41) and f (sliced sectional top view of section 41). FIG. 26-f is bottom view of section 41. Sidewalls 78 and 89 are part of the lowest section of the AHS system. The working fluid move within the slots like 42, typically 0.7 mm square, as the warm thin disk 1 causes this fluid to be vaporized causing the fluid to flow though the AHS structure via (1) the liquid plugs and vapor bubbles action of the OHP and (2) convective flow from the fluid pump connecting exit working fluid outlet port 48 and inlet working fluid port 45. For this inlet 45 and outlet 48 configuration, the flow direction is from right to left in slot 42 traveling toward 67 and then down 62 into the corresponding slot 43 going toward the central "trough" slot 82 which is fed by each of the slots shown in FIG. 265-c and are parallel with slot 42. "Trough" slot 82 is connected to exit tubing 48 which transfer the AHS working oscillating heat pipe to a closed loop fluid pump (not shown). This cooled working fluid is then returned to the AHS via tubing 45 into trough 81 which simultaneously feeds all of the channel slots parallel to 42 OHP channel.

The efficient heat spreading occurs via the OHP action in all the parallel slots like slot 42 and via the external fluid pump. The latent heat of vaporization of the working fluid greatly increases the heat transfer from the top of 41 to its bottom by the condensation of this fluid as it flows in the lower slots cooled in the coolant reservoir of section 74 which has heat removed from the system via tubing 52 and 79 illustrated in FIG. 26-b and the top view of 41. Note that the pump out port 951 (FIG. 26-c) is used to evacuate the entire closed loop OHP plus fill it with the desired working fluid prior to sealing it off.

Figure 1:
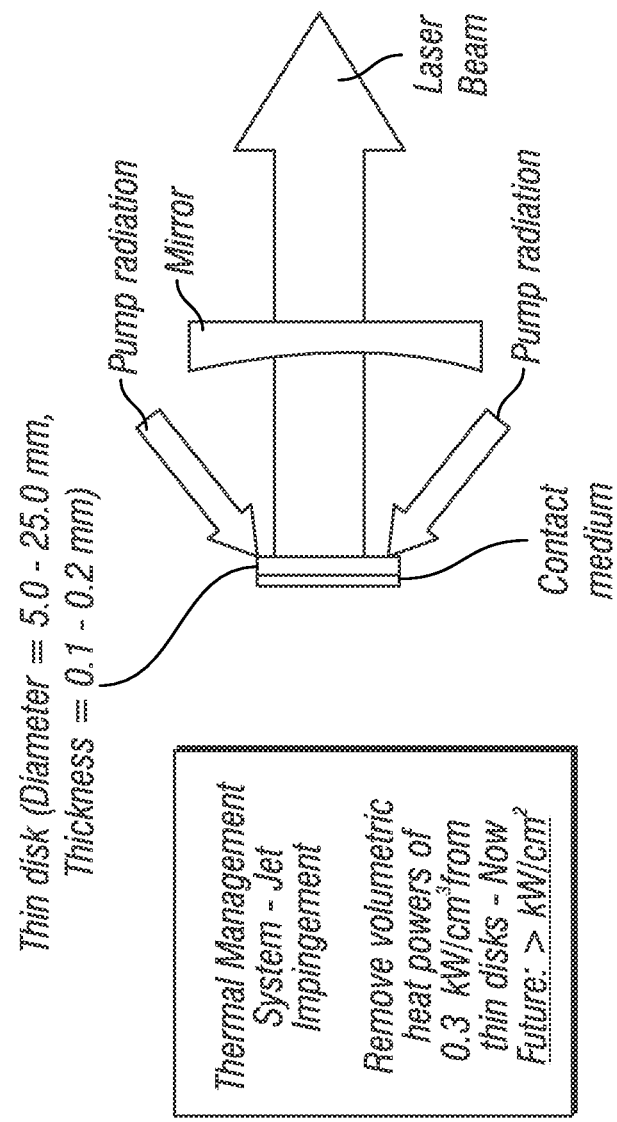
FIG. 1. Schematic setup of a thin disk laser head. The pump optics, parabolic mirror and retro-reflectors are arranged for multiple passes of the pump radiation. (Prior Art.)
Figure 2:
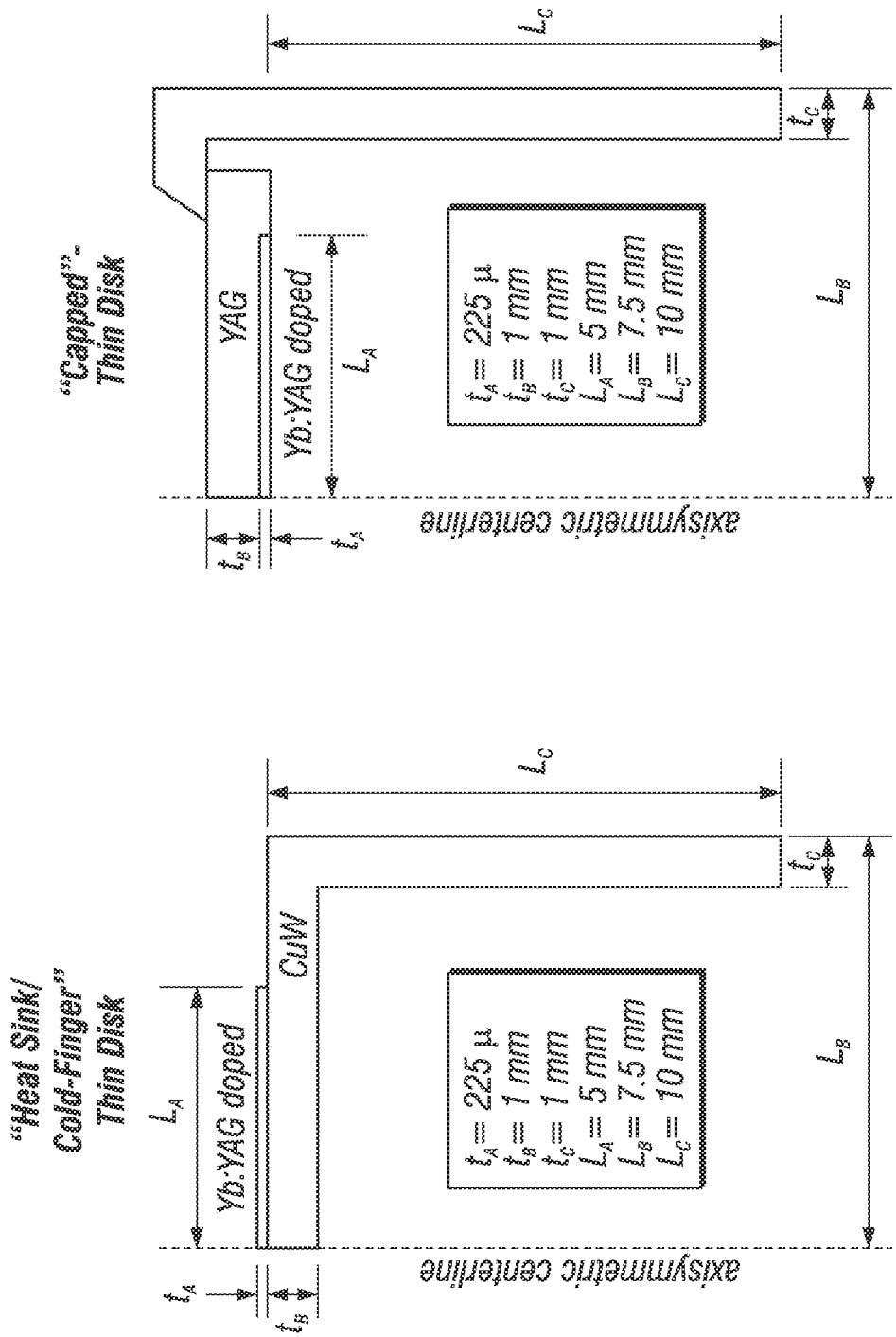
FIG. 2. Geometry of "Heat Sink" and "Capped" configuration for cooling of Yb:YAG thin disk, 225 μm thick with a pumping power loading of 5 kW/cm². Excited thin disk diameter was 10 mm (2×$L_A$). (Prior Art.)
Figure 3:
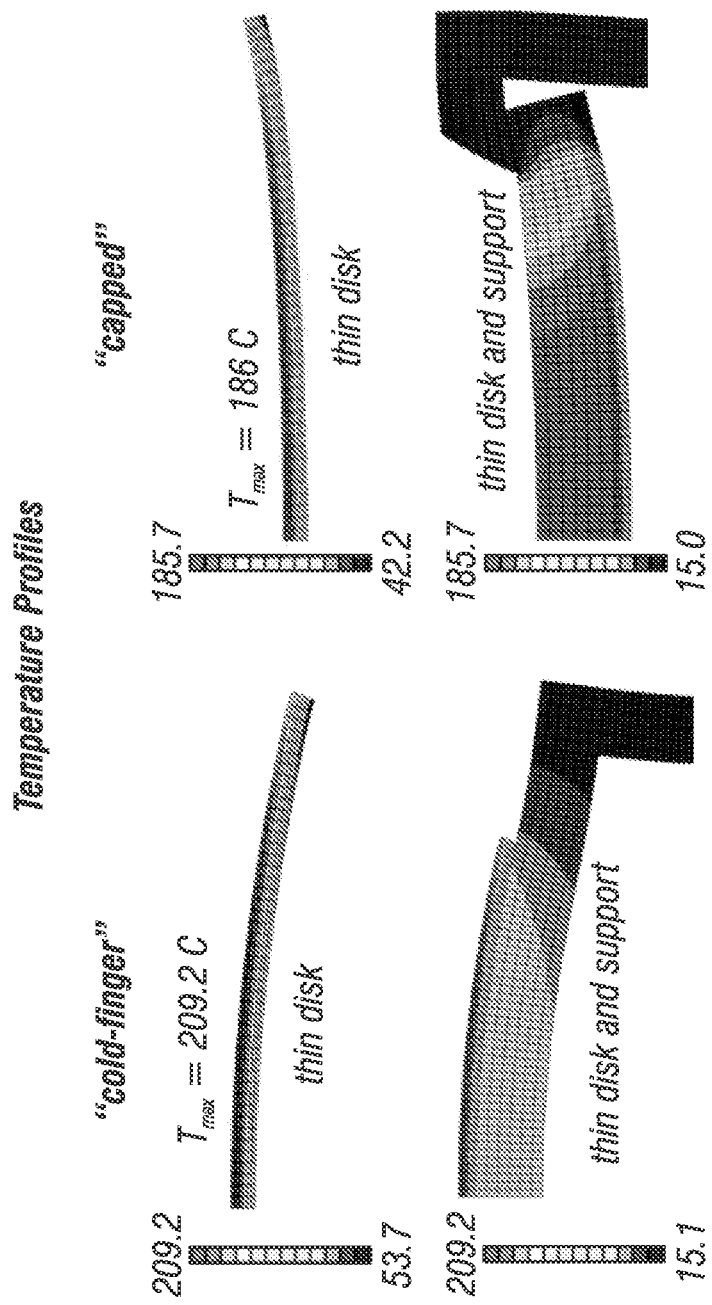
FIG. 3. Temperature contours across radial direction and along supporting structure for "cold-finger" and "capped" Yb:YAG thin disk, 225 μm thick with a pumping power loading of 5 kW/cm². Excited thin disk was 10 mm diameter. (Prior Art.)
Figure 4:
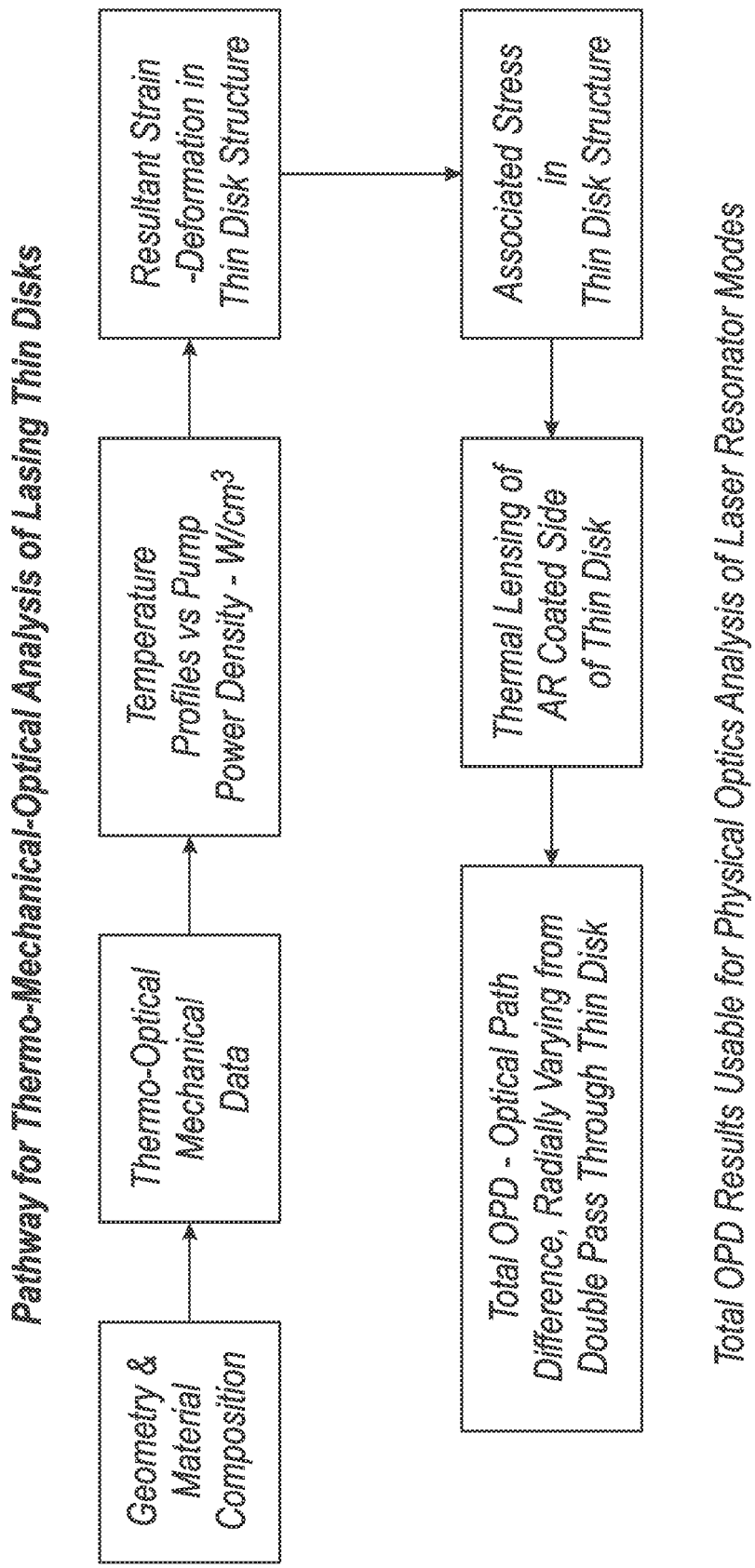
FIG. 4. Pathway for thermo-mechanical-optical analysis for thermal, stress and OPD parameter of thin disk amplifiers and/or laser.
Figure 5:
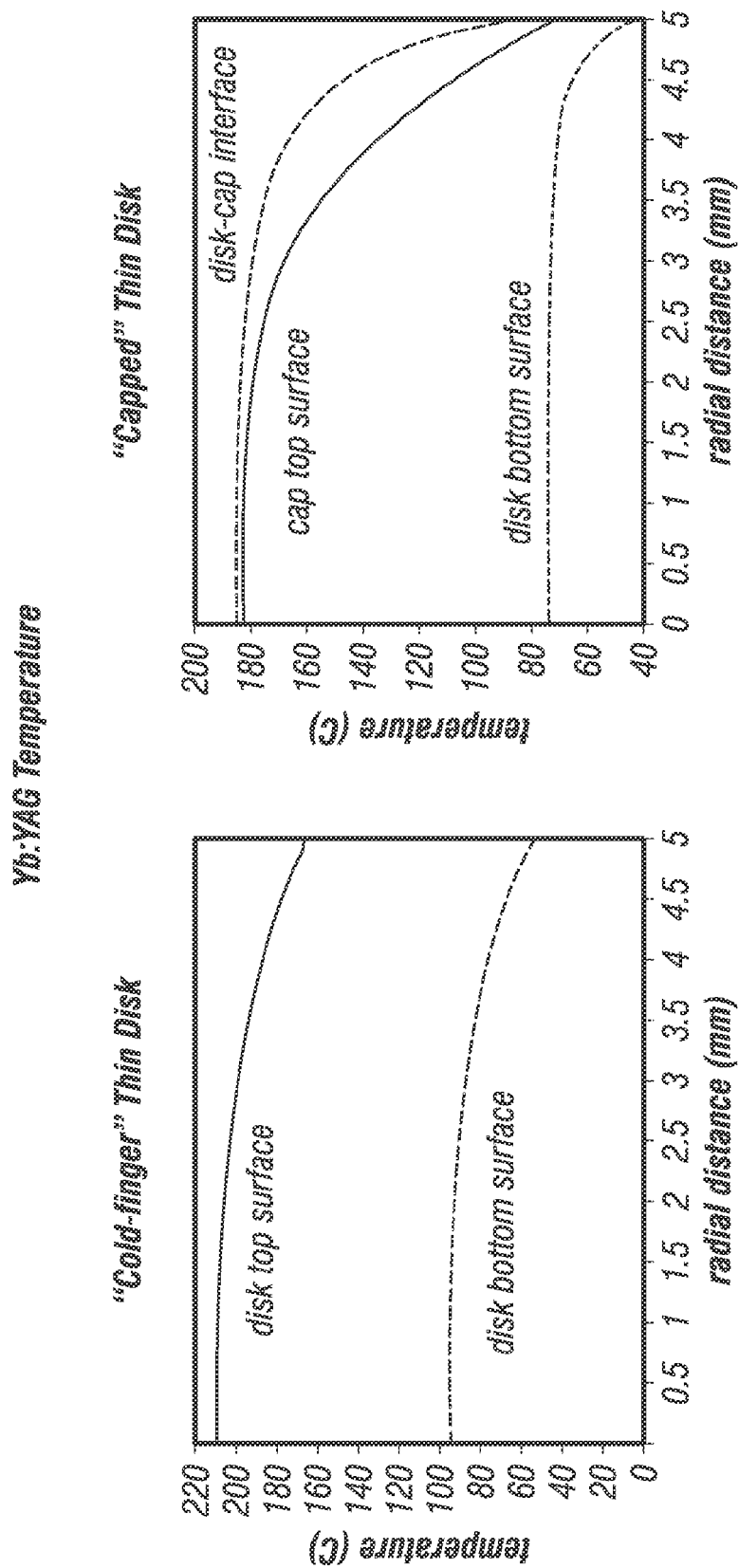
FIG. 5. Temperature variation across radial direction and along supporting structure for Yb:YAG thin disk, 225 μm thick with a pumping power loading of 5 kW/cm². (Prior Art.)
Figure 6:
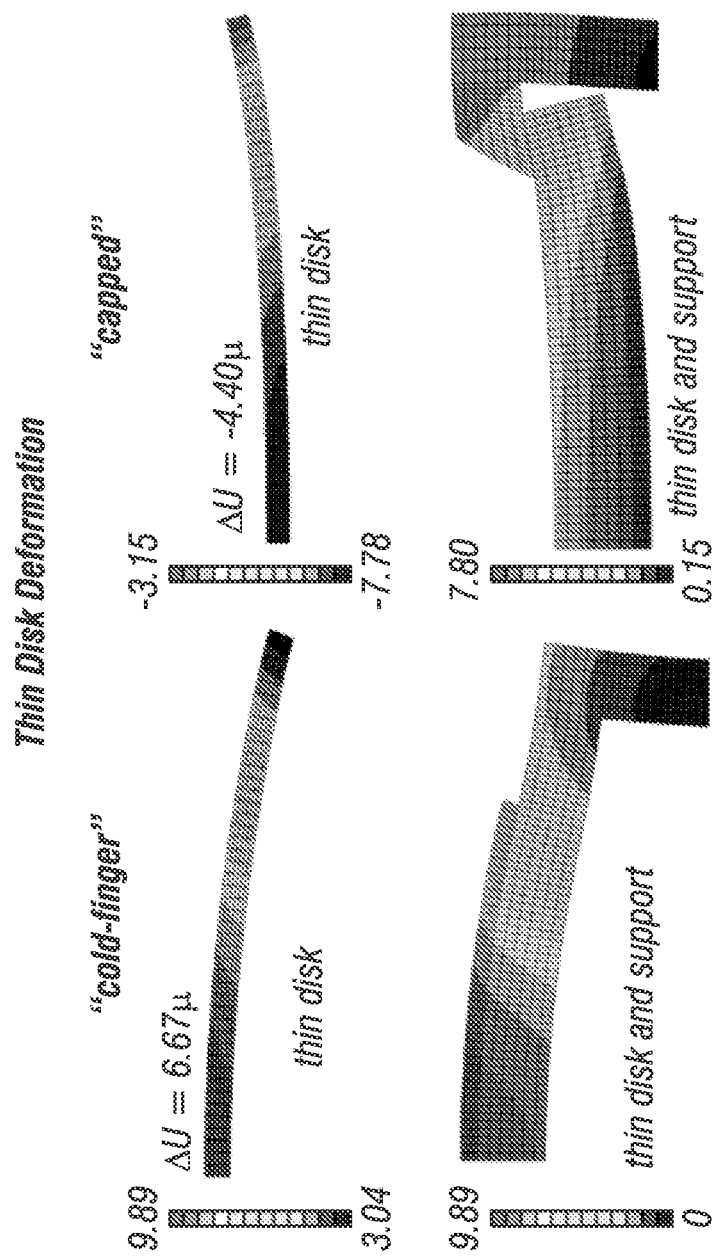
FIG. 6. Deformation (micro-meters—μ) for both "cold finger" and "capped" Yb:YAG thin disk of 225 μm thickness and 5 kW/cm² for geometrical shape of FIG. 2. (Prior Art.)
Figure 7:
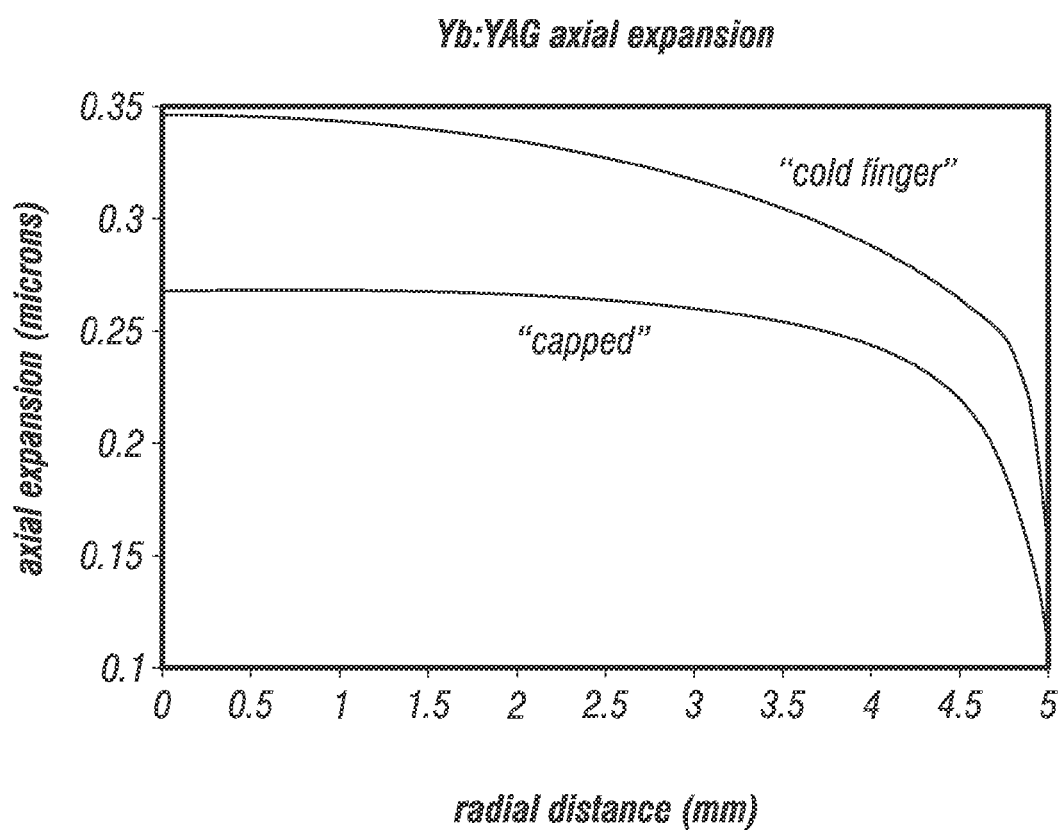
FIG. 7. Yb:YAG thin disk amplifier axial expansion creating thermal lens as function radius for both "cold finger" and "capped"Yb:YAG configuration at 5 kW/cm² and 225 micron thickness. (Prior Art.)
Figure 8:
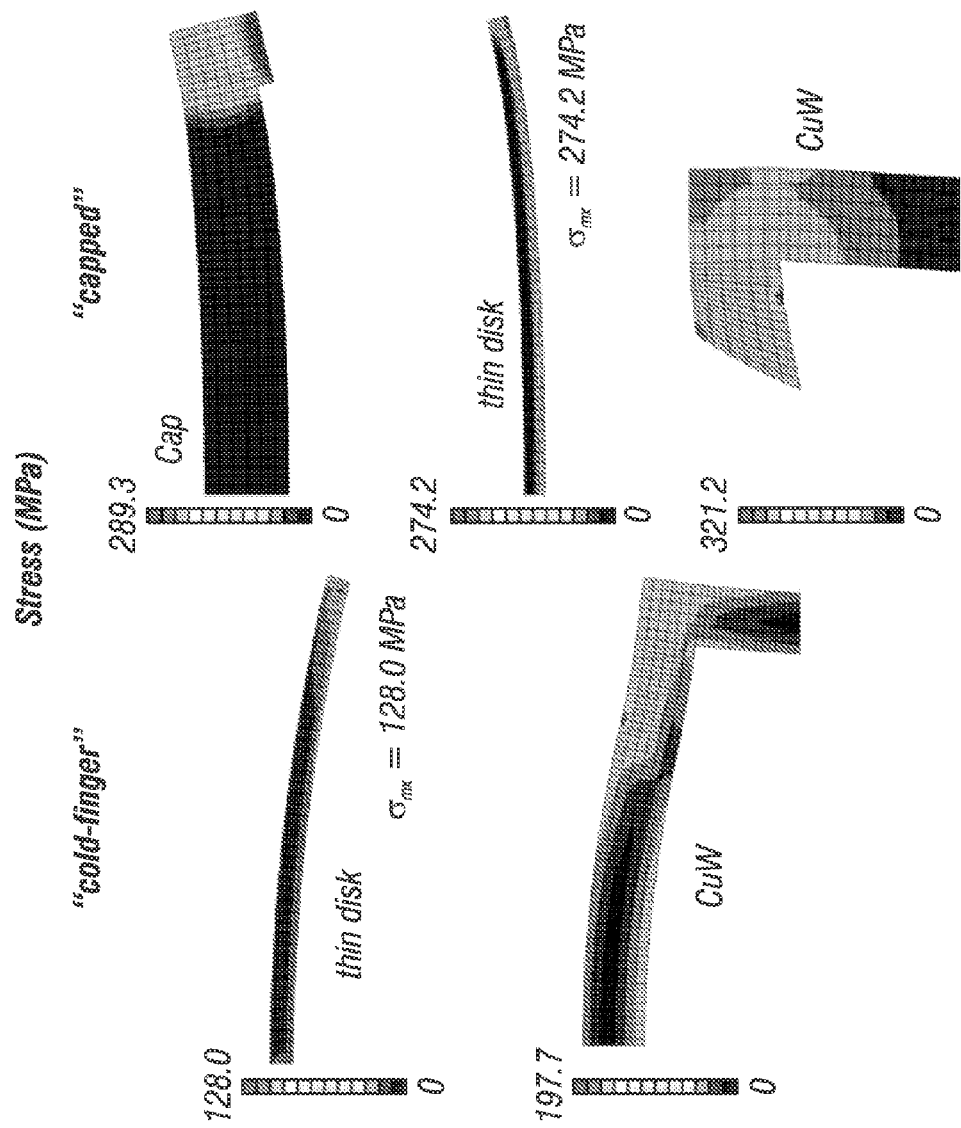
FIG. 8. Stress experience for both "cold finger" and "capped" Yb:YAG thin disk of 225 μm thickness and 5 kW/cm² for geometrical shape of FIG. 2. (Prior Art.)
Figure 9:
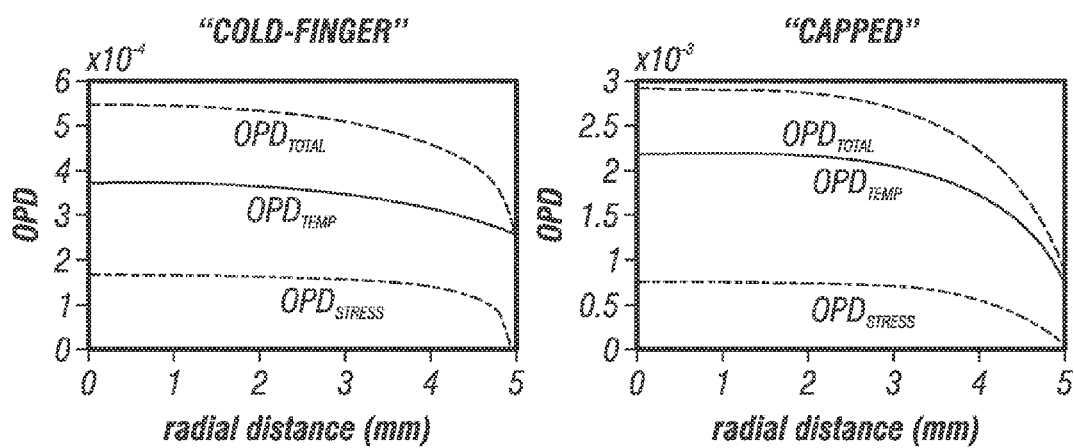
FIG. 9. Δn (OPD) for both "cold finger" and "capped" Yb:YAG thin disk of 225 μm thickness and 5 kW/cm² for geometrical shape of FIG. 2 and room temperature ambient conditions. (Prior Art.)
Figure 10:
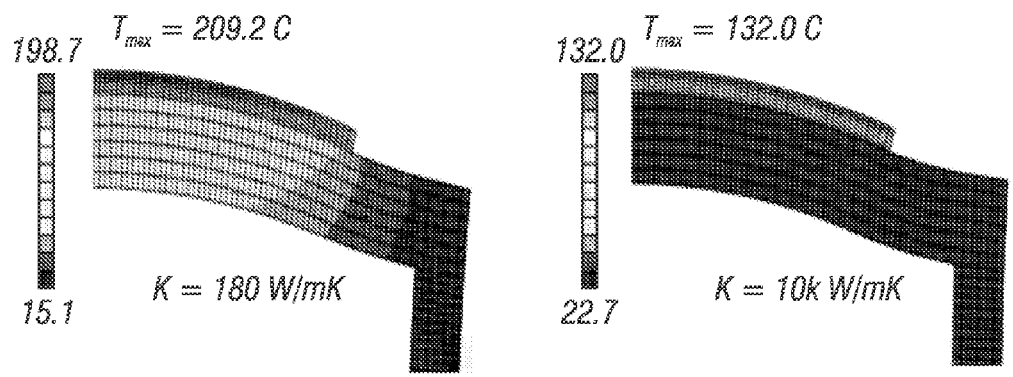
FIG. 10. "Cold finger" thin disk amplifier temperature comparison with low (180 W/m*° K.—CuW) and higher 10 kW/m*° K) thermal conducted values based on advanced heat spreaker technology described in this invention. (Prior Art.)
Figure 11:
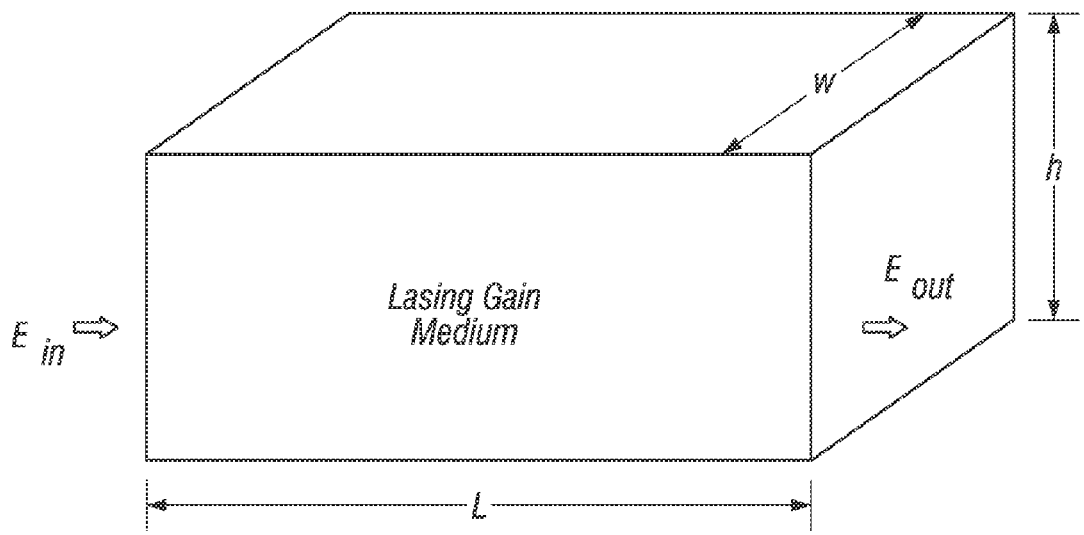
FIG. 11. Computational approach for analyzing optical path difference (OPD) for propagation of optical beam through abberrated gain medium like that in thin disk laser. (Prior Art.)
Figure 12A:
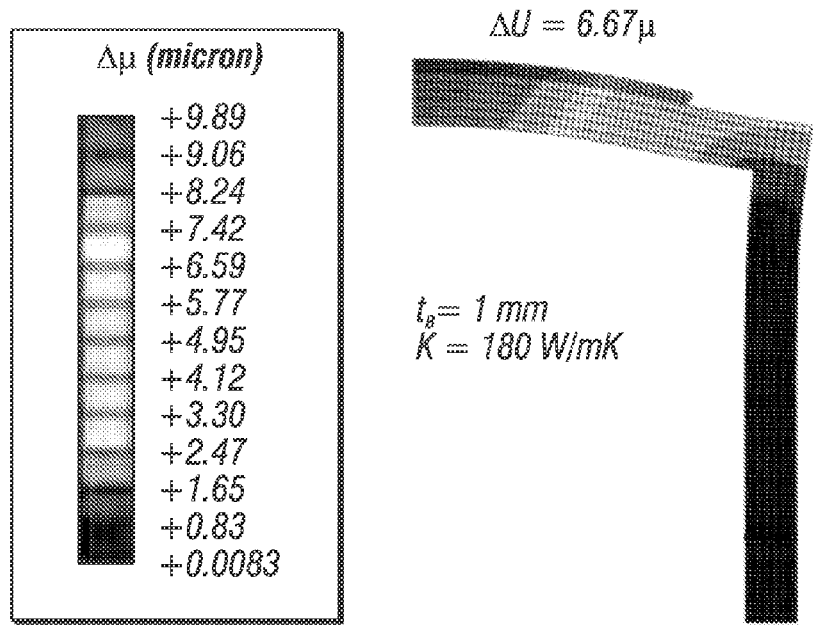
FIG. 12. Thin disk amplifier deformation comparison with a low (180 W/m*K.—CuW) and higher 10,000 W/m*K values using advanced heat pipe technology reported in this patent. (Prior Art.)
Figure 12B:
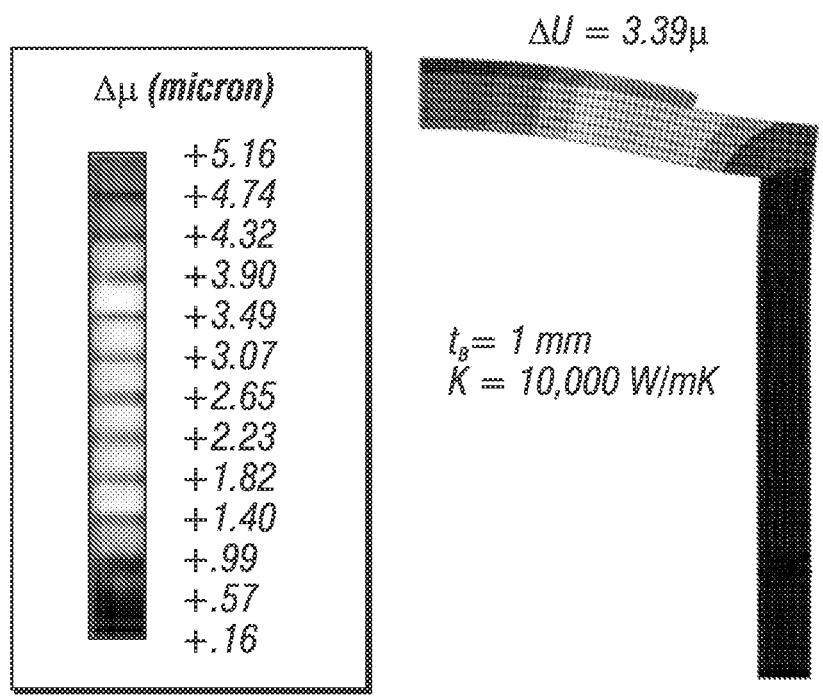
Figure 13A:
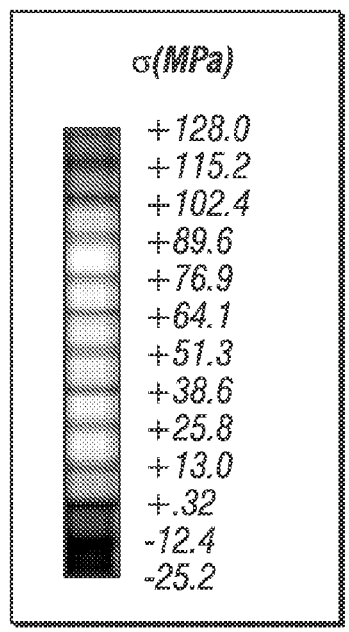
FIG. 13. Stress behavior comparison with "heat spreader" having K=180 and 10,000 W/m*K. (Prior Art.)
Figure 13A:
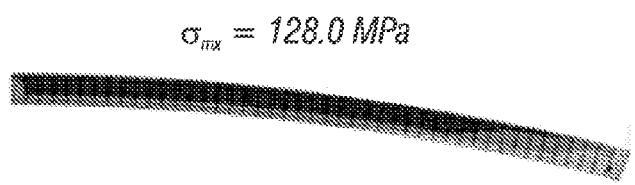
Figure 13A:
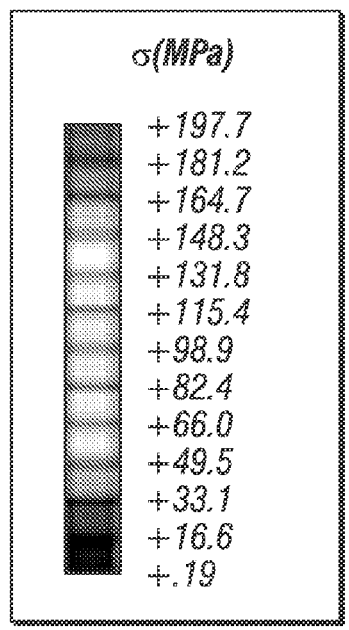
Figure 13A:
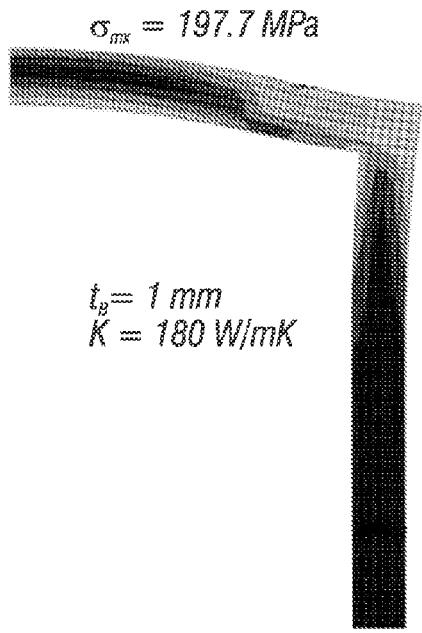
Figure 13B:
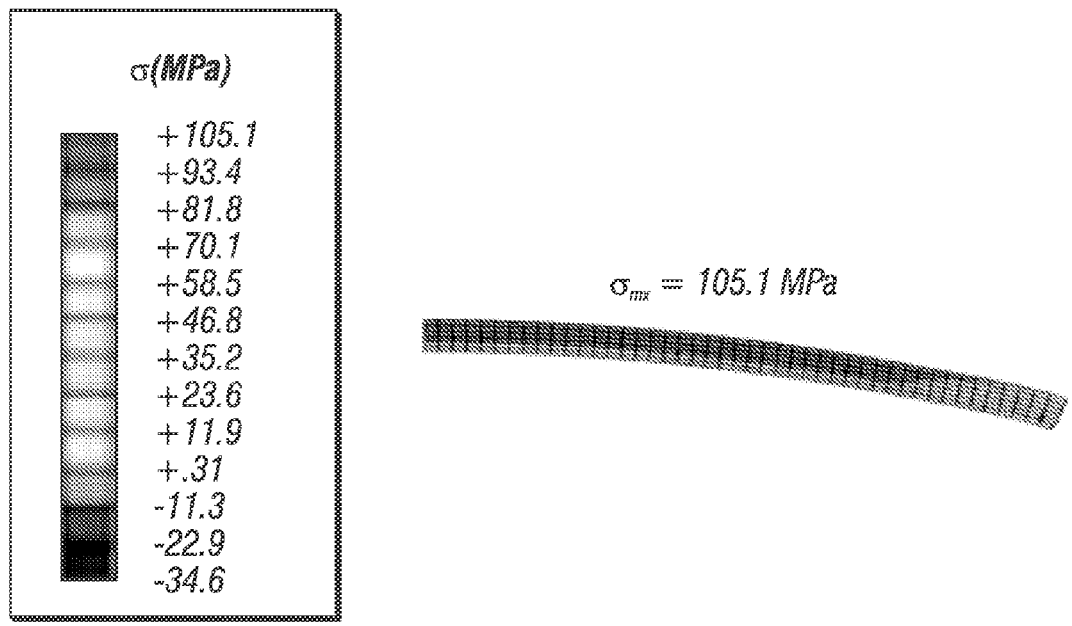
Figure 13B:
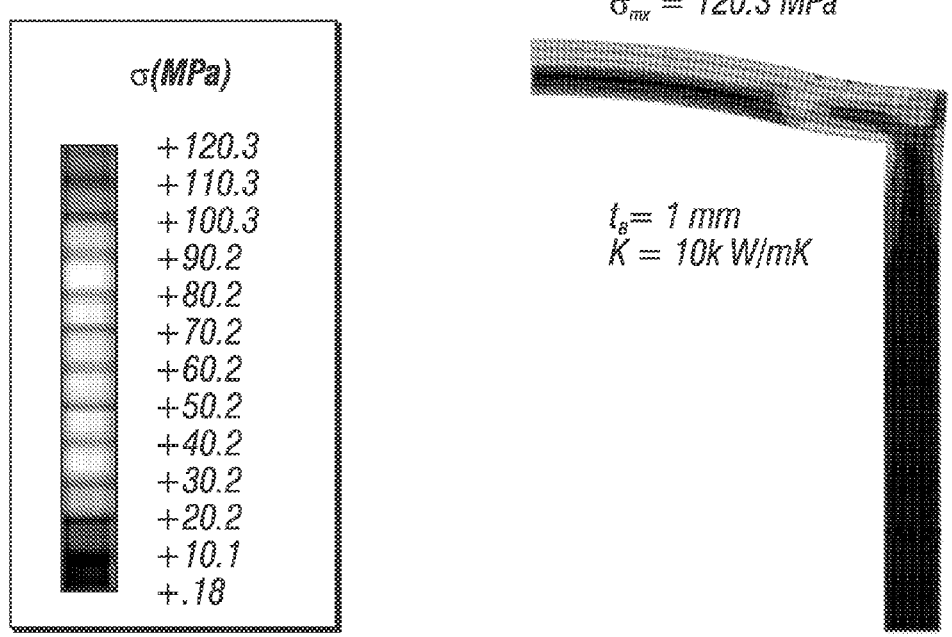
Figure 14:
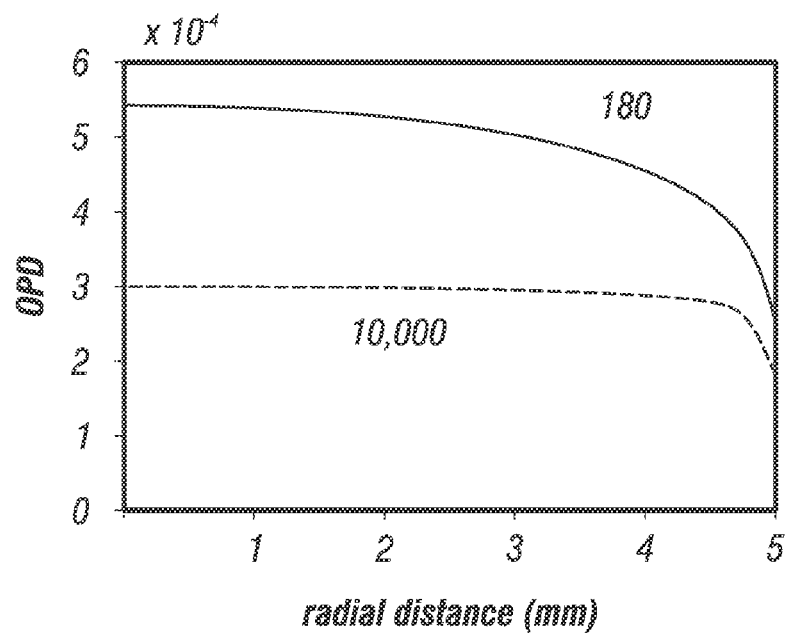
FIG. 14. "Cold-finger" thin disk OPD comparison with low (180 W/m*° K.—CuW and higher AHS higher effective 10 kW/m*° K) thermal conductivity values based on advanced heat spreaker technology described in this invention. (Prior Art.)
Figure 15:
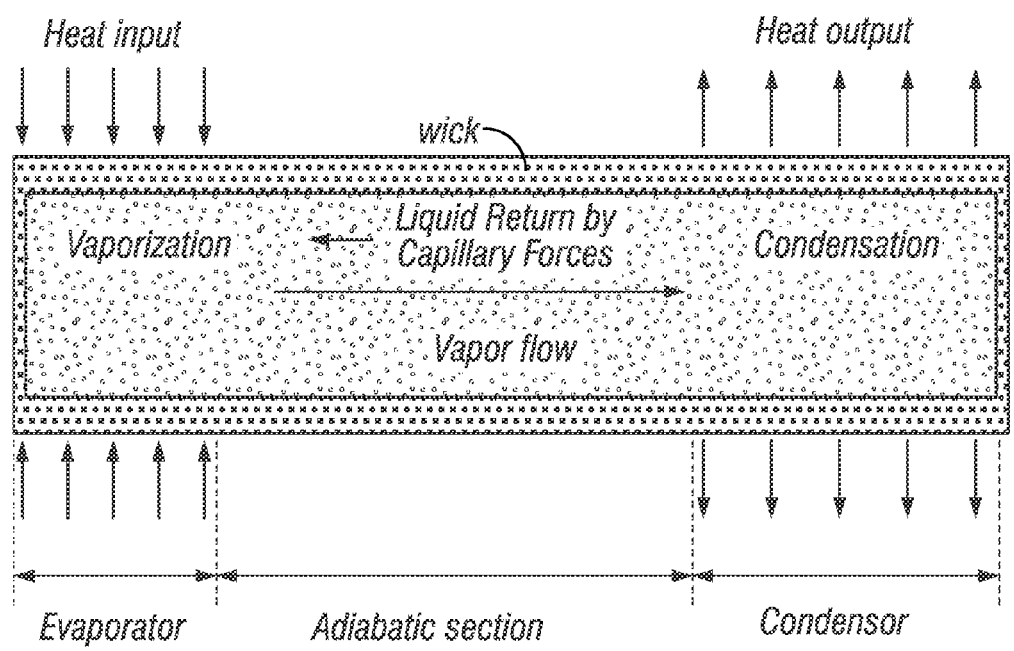
FIG. 15. Conventional "wicked" heat pipe with vapor-working counter flow. (Prior Art.)
Figure 16:
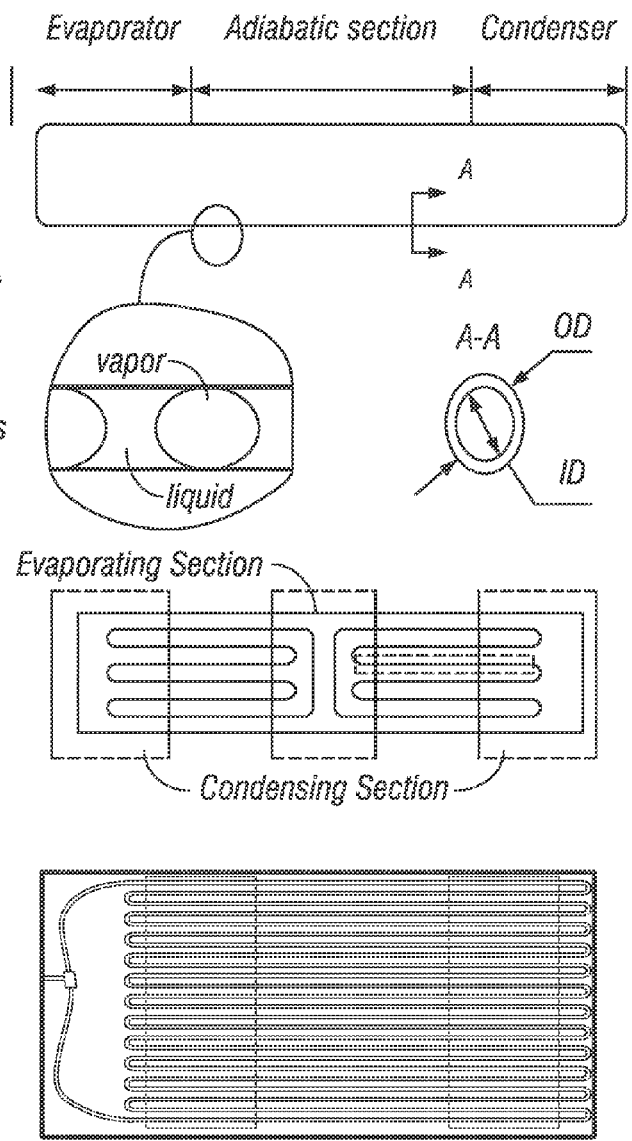
FIG. 16. Oscillating heat pipe (OHP) basic principles and examples, (a) miniaturized OHP—upper right (1×2 in²) and larger, 1×2 ft² (lower right). (Prior Art.)
Figure 17:
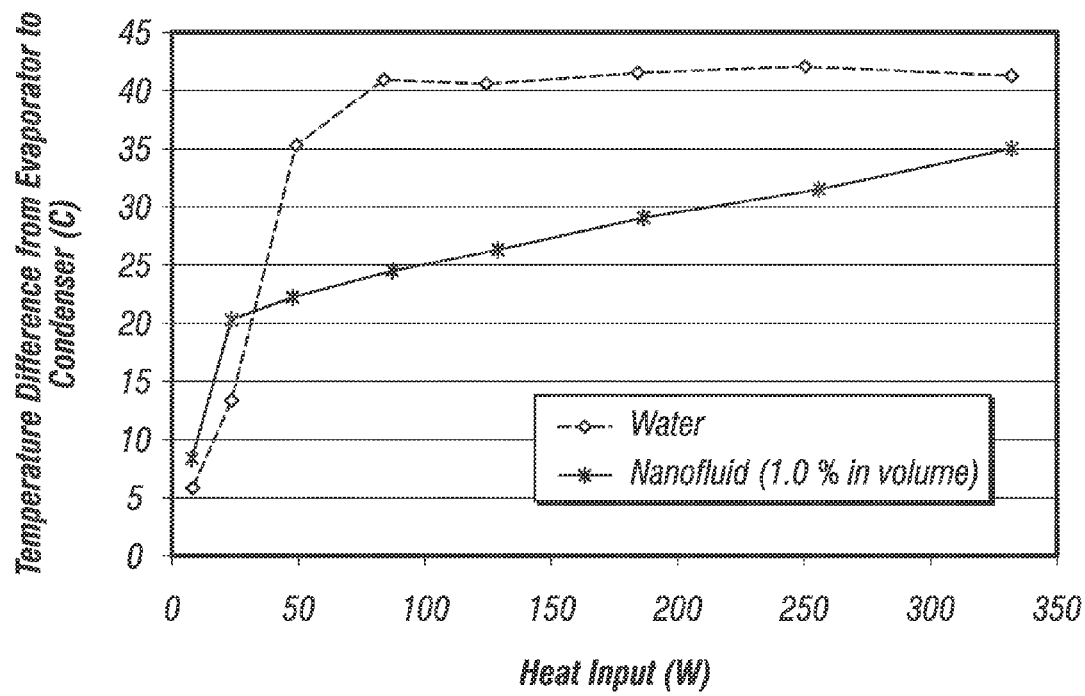
FIG. 17. Nanofluid Effect on the Heat Transport Capability in an Oscillating Heat Pipe (Filled Ratio=50%, Nanoparticles: Diamond, 5-50 nm, 1.0% in volume). (Prior Art.)
Figure 18:
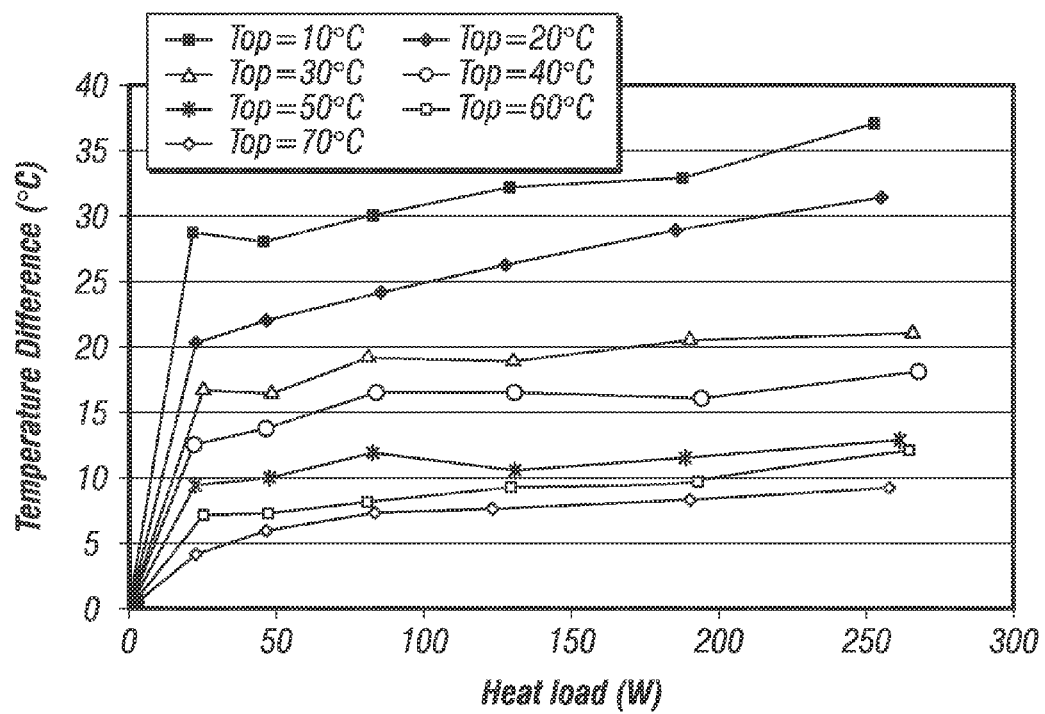
FIG. 18. Operating temperature effect on the thermal resistance at various heat loads. (Prior Art.)
Figure 19:
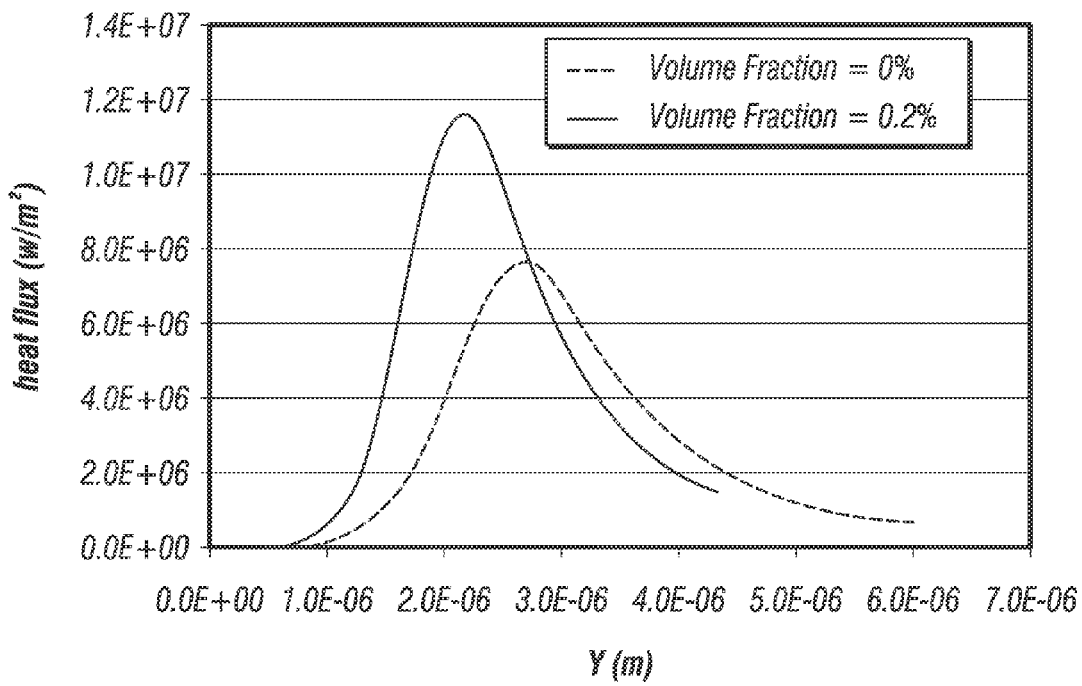
FIG. 19. Nano-particle effect on thin film evaporation. (Prior Art.)
Figure 25A:
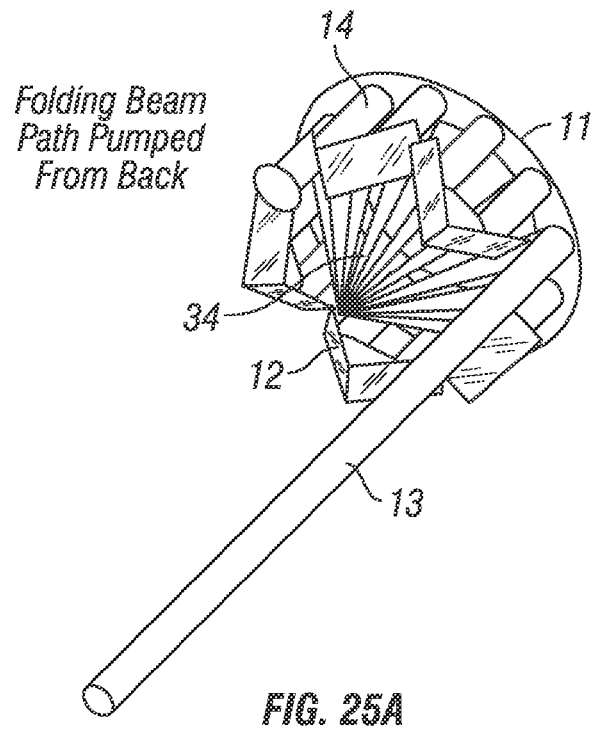
FIG. 25. Variation for thin disk mounting within Thin Disk Laser Gain Module.
Figure 25B:
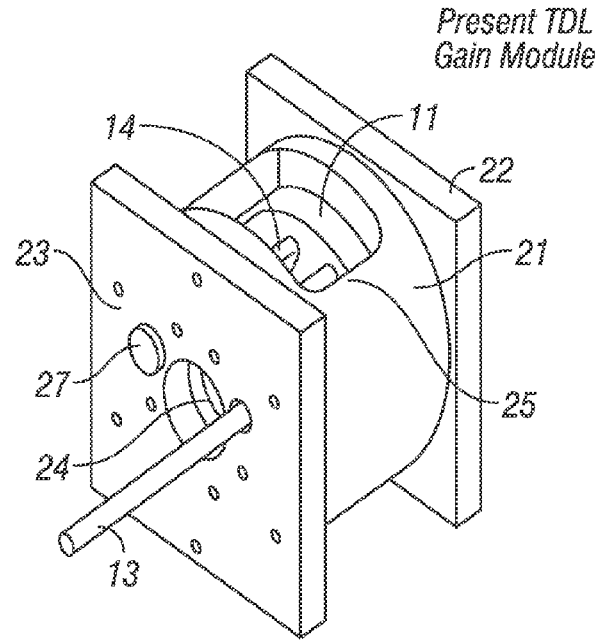
Figure 25C:
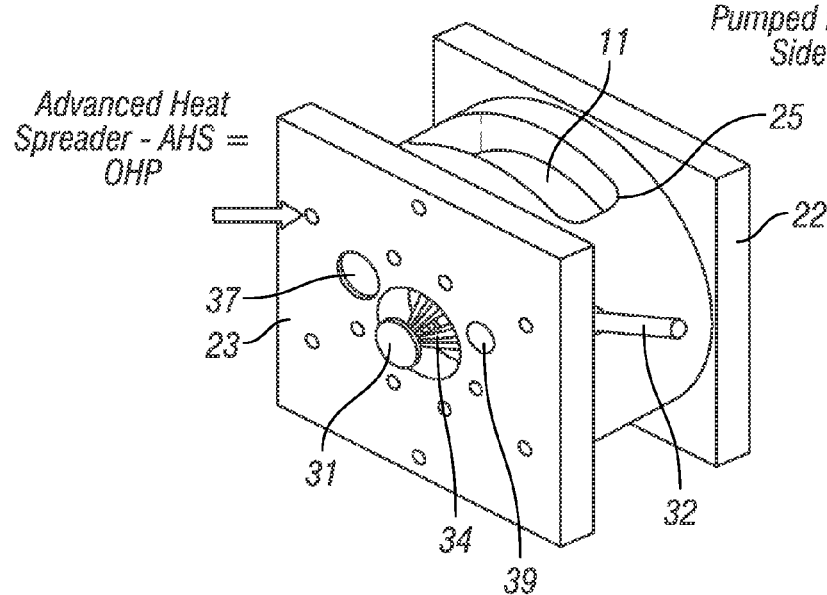
Figure 26A:
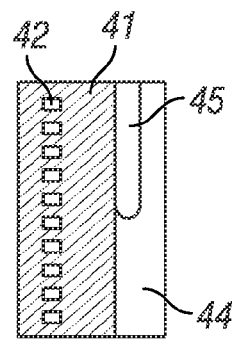
FIG. 26. Design schematic for linear array mechanically driven oscillating heat pipe for TDL.
Figure 26B:
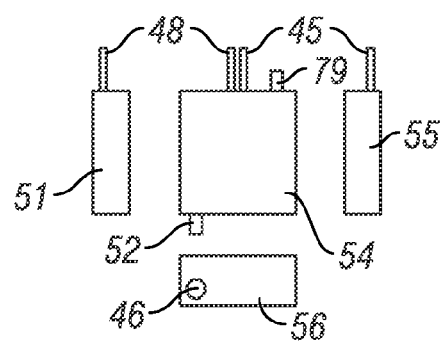
Figure 26C:
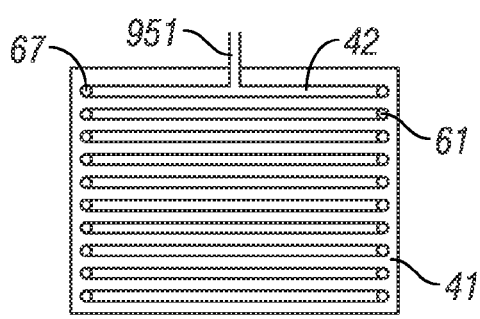
Figure 26D:
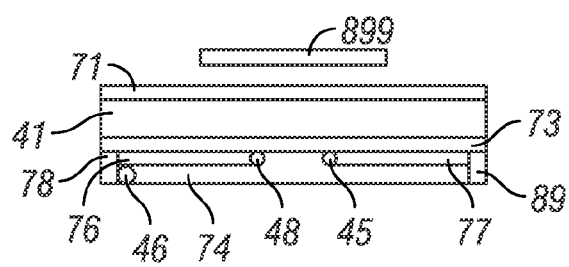
Figure 26E:
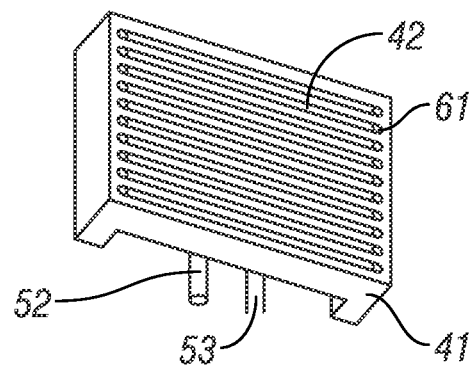
Figure 26F:
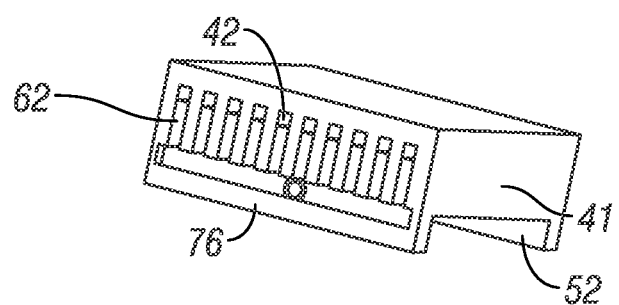
Figure 26G:
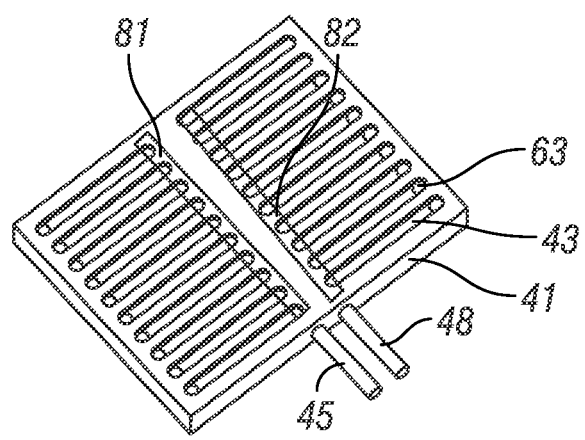
Figure 27A:
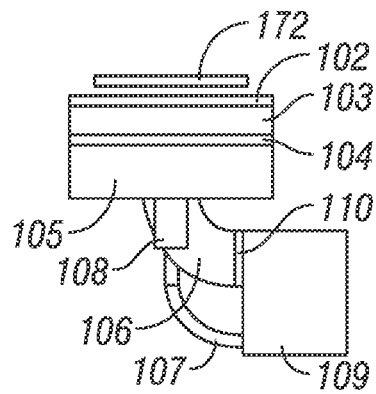
FIG. 27. "Spoked"-Hybrid Fluid-Pump Oscillating Heat Pipe-AHS: Option A.
Figure 27B:
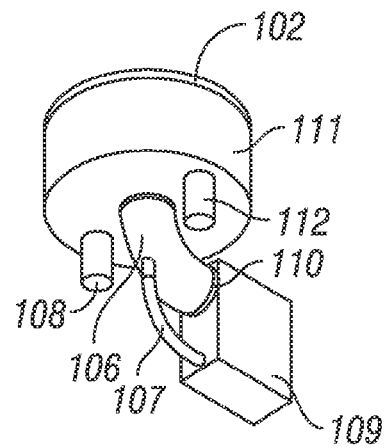
Figure 27C:
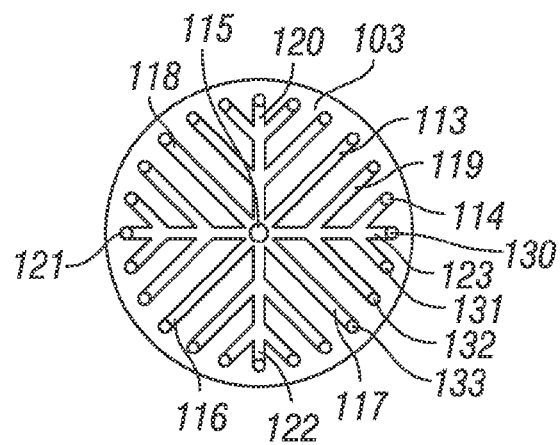
Figure 27D:
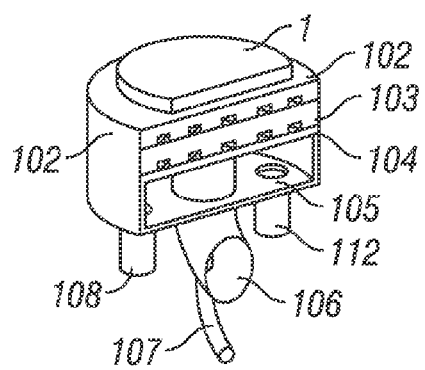
Figure 27E:
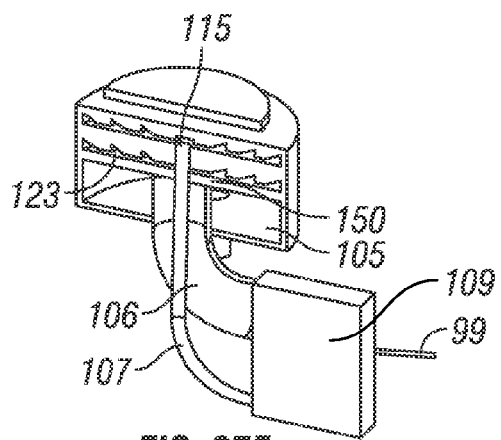
Figure 27F:
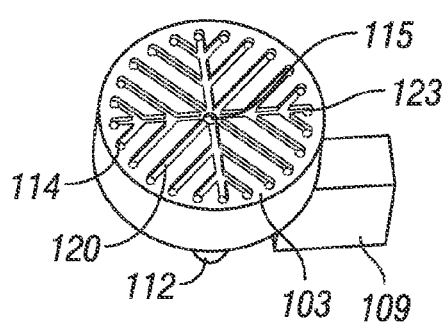
Figure 27G:
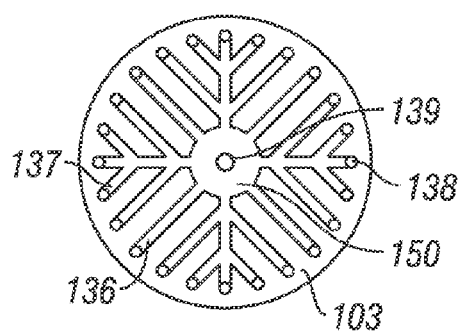

There is an important second aspect of this embodiment dealing with the placement of the linear array configured advanced heat spreader illustrated in FIG. 25. FIG. 1 shows thin disk laser prior art citing the critical issues in a high power TDL system. In FIG. 25-b, the configuration shows that the laser diode pump radiation 13 enters through hole 39 of the back side of the retro-reflector plate 23 holding the critical retro-reflectors 12. As the laser diode pump radiation 13 propagates (FIG. 25-a) toward the parabolic mirror 11, this radiation is reflected making multiple passes 34 into the thin disk 24 inside the TDL gain module 21 before finally reflecting from the flat mirror 27 and then making return pass 14 for increased excitation of the thin disk 24. This description is for the presently used mode of operating a thin disk laser. Due to the compactness of these TDL's with the multiple pass pumping of the lasing thin disk, a square or rectangular advanced heat spreader cooling a thin disk is very difficult to implement for such a gain module 21 in the present FIG. 25-b configuration. Therefore, for this embodiment, a practical method shown in FIG. 25-c is to have the focusing position for pumping thin disk 31 moved toward the rear of the retro-reflector plate 23, i.e., further away from the backplate 23. This adjustment is easily performed by increasing the focal length of the parabolic mirror 11 mounted on the parabolic plate 22. By this operation, the linear array AHS disclosed here can be integrated with nearly any type of thin disk laser system. Also, note that the OHP advanced heat spreader, like FIG. 24-a or -b is will normally be non-transparent to the pumping radiation normally injected into the TDL gain module trough 39. This complication can easily be overcome by injected the pump radiation along the path 32 into the gain module 25 and then reflected off a 45 degree mirror and then follow a path identical to 13 in FIG. 25-a. This mirror would be mounted either to the side of the gain module 25 or the backplate 23.

Depending on the desired temperature of the advanced heat spreader as governed by the coolant used, the entire TDL and new AHS system should be enclosed in an evacuated and sealed container to minimize air turbulence and condensation from ambient atmospheric constituents. Such an operation is imperative for any embodiment of this invention especially for temperature below and near 0° C. and absolutely for cryogenic operation.

The rectangular and square configuration of this embodiment of this linear array of oscillating heat pipe driven by an internal pump/blower also has many applications for cooling solar photovoltaic cells, large flat panel displays, slab lasers, microchip lasers, rf waveguides and laser mirrors.

Third Embodiment

The previous embodiment of the use of a square or rectangular configured, high power heat spreader with prior art thin disk laser requires changes in the gain module 25 design illustrated in FIG. 25. This embodiment of the invention offers an alternative, namely a circular configured system that can be inserted into the "present-day" thin disk laser designs as shown in FIG. 24-*b*. FIG. 24-*b* depicts such a circular or round advanced heat spreader with a circular lasing thin disk 171. The embodiments and its other versions can be readily made to operate as a lasing thin disk 24 performs shown in FIG. 25-*b* and is nearly inside the backside plate 23. FIG. 27-*a* shows the various parts of this new embodiment which consists of the lasing thin disk 172, an alternative OHP based heat spreader 103, a coolant chamber 105 removing the thermal heat from the heat spreader 103 which has a top plate 102 and lower plate 104. In addition, this heat spreader system is integrated with fluid pump 109 that increases the working fluid convection velocity through the slots 118 (for example) at much high flow rates than that created by the vaporization-condensation operation created in an oscillating heat pipe. FIG. 27-*c* illustrates the top view of the "spoked" configuration of the heat spreader 103 having the typical 0.7 mm square slots which are radially placed such that the working fluid (liquid and vapor) travels from the center 103 to the outer edge toward circular holes 114, 130-133 plus all other holes on same circular radius. The reason for the many main paths 116,122,117,130,113,120,118 and 121 plus the "spokes" 137 from the main slot channels going from the central work fluid inlet 115 to the outside holes is to promote more uniform temperature profile in the top plate 102. Through these circular holes the working fluid flows into the bottom side of the heat spreader section (FIG. 27-*g*) through holes like 138 which is in direct contact with coolant water or other liquids like acetone, ammonia or nitrogen.

Flowing through these slots on both of heat spreader section 103, the working fluid enters at top 150 of collection tube 106. The coolant liquids enter and exit through inlets 108 and 112. The flow of the working fluid through the return slots 183 on the bottom of heat spreader section 103 enter the collection tube 106 on its way to fluid pump 109. The advanced heat spreader pump-out/filling tube 99 is used to control the volume of working fluid in the heat spreader, assure that minimal impurities are introduced to the working fluid and sealed off or valved shut after filling. The fluid pump 109 increases the flow rate through the entire OHP system by flowing through the return tube 107 going through the entrance region 139 and exiting at distributing opening 115 into the rectangular slot paths. Note that the return tube 106 is concentric with return tube 107 and are separate volumes via welding of the two pieces. The types of fluid pumps are identical to that highlighted in the first embodiment.

The important features of this embodiment include its circular design, potential compact size and future direct insertion into present thin disk laser systems. The multiple pathways for the OHP processes of vaporization and condensation of the working fluid plus the enhanced convective flow by the fluid pumps should make it perform as a nearly isothermal surface for cooling the thin disk 172 plus improve the beam quality of the thin disk laser at high power with negligible dynamic focusing, near isothermal temperature profile across lasing thin disk, and stress-induced birefringence induced polarization losses.

Fourth Embodiment

Figure 28A:
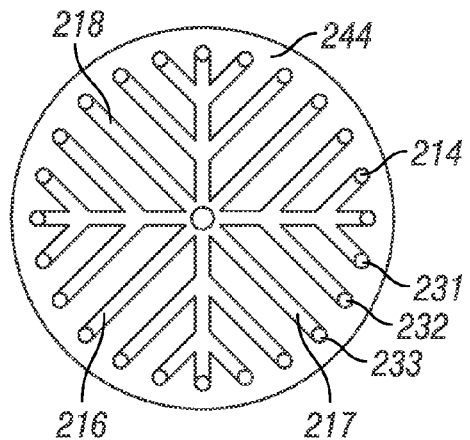
FIG. 28. "Spoked"-Hybrid Fluid-Pump Oscillating Heat Pipe-AHS: Option B.
Figure 28B:
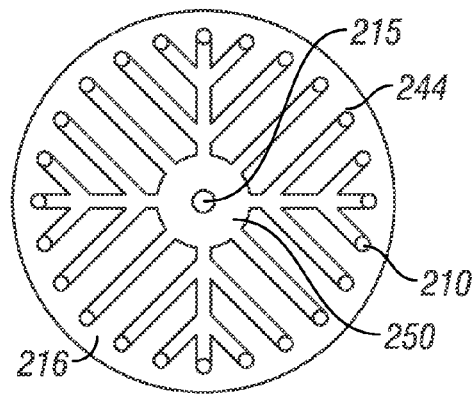
Figure 28C:
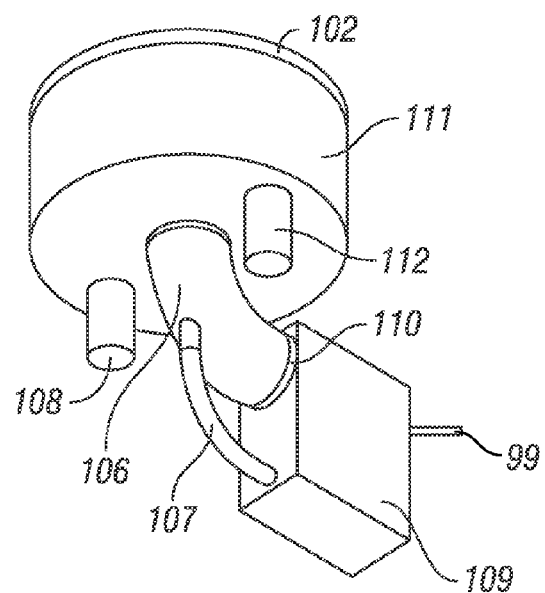

This embodiment is close to the previous third embodiment but the changes can provide significant improvement by providing improved isothermal temperature profile across the thin disk. Important to note that the many main OHP slot paths 121,120,130,122 and 121 all have a direct path toward the outer return holes down to the bottom side of the heat spreader 103 shown in FIGS. 27-*c* and 27-*d*. This condition can create less flow into the main "spoke" arms originating from these main slot pathways. In FIG. 28-*a* and 28-*b*, these return holes like 130 in FIG. 27-*c* and 27-*g* were removed thus forcing the working fluid to always return through the cited "side spokes" via exit hole 210. All of the additional operation is like that described in FIG. 27.

Again, like the above third embodiment, the important features of this embodiments is its circular design, potential compact size and future direct insertion into present thin disk laser systems. The multiple pathways for the OHP processes of vaporization and condensation of the working fluid plus the enhanced convective flow by the fluid pumps should make it perform as a nearly isothermal surface for cooling the thin disk 172 using this embodiment of the invention plus improve the beam quality of the thin disk laser at high power with negligible dynamic focusing, near isothermal temperature profile across lasing thin disk, and stress-induced birefringence induced polarization losses.

Fifth Embodiment

Figure 29E:
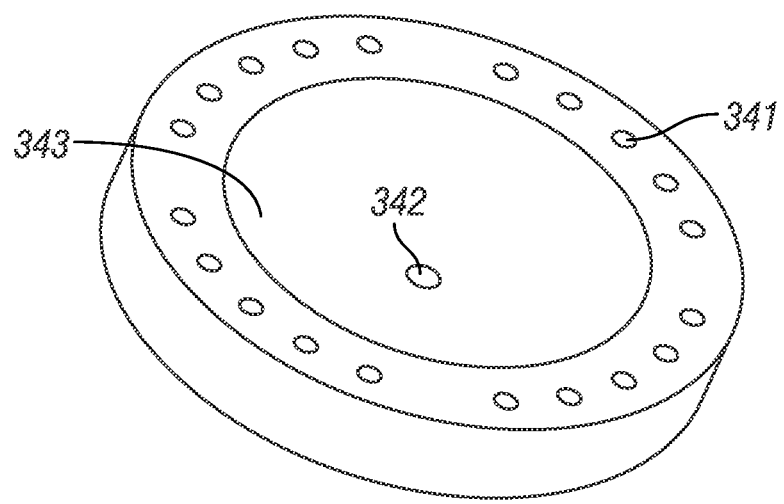
FIG. 29. "Spoked"-Hybrid Fluid-Pump Oscillating Heat Pipe-AHS: Option C.
Figure 29F:
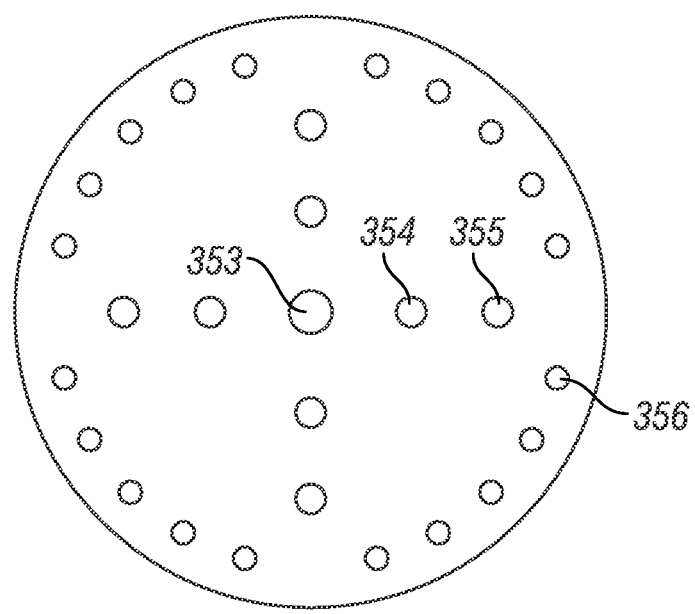

The fifth embodiment shown in FIG. 29 offers improved thermal profile uniformity and higher heat removal or heat spreading and is also very similar to the second embodiment. In this embodiment, the input position of the working fluid into the slotted cooling channels 361-363 are not all at the center of the heat spreader section 302. Instead they are distributed at various radial position to possibly provide enhanced working fluid flow velocity and thus improved temperature uniformity across the thin disk 173. FIGS. 29-*c* and 29-*d* illustrate several working fluid injection holes 333, 334 and the center hole 335. The return holes like 331 are identical to FIG. 28 along with the other parts of the fluid pump system.

The major difference in this design is fabrication of heat spreader system shown in FIGS. 29*a*, -*b* and -*e*. The heat spreader comprises five sections the top plate 301 (nominally 1 mm) on which the thin disk 173 is mounted, the heat spreader section 302, the working fluid distributing cone 303, the returning working fluid component 304 and the coolant section 305 removing heat from entire heat spreading system. The remainder of the system including fluid pump 109, working fluid collector 106, filling-evacuation tube 99, and returning working fluid tube 107 are identical to the previous second embodiment.

The working fluid distributing cone section 303 has the working fluid injected into it at the injection hole 342. From this filled cone section 303, the nozzle tubing like 308 and 309, the heat spreader 302 has the working fluid injected through the nozzles like 335, 334 and 333 into the rectangular slots similar to 361, 362 and 363 enabling the oscillating heat pipe action which spreads the heat from the thin disk 173. This working fluid then returns through the outer holes of the bottom plate (FIG. 29-*f*) holes like 356 into the returning working fluid section 304 and then into the fluid pump for the forced convection fluid flow. The coolant system removing heat from the entire heat spreader system is cooled via the exit and entrance tubing 321 and 322.

Again like the above third embodiment, the important features of this embodiments include its circular design, potential compact size and future direct insertion into present thin disk laser systems. The multiple pathways for the OHP processes of vaporization and condensation of the working fluid plus the enhanced convective flow by the fluid pumps should make it perform as a nearly isothermal surface for cooling the thin disk 173 using this embodiment of the invention plus improve the beam quality of the thin disk laser at high power with negligible dynamic focusing, near isothermal temperature profile across lasing thin disk, and stress-induced birefringence induced polarization losses.

Sixth Embodiment

This next embodiment utilizes a single, spiral configuration of the slotted grooves used for the forced convection of the oscillating heat pipe action inside of another advanced heat spreader system. FIG. 30 shows the details of the differences from the five previous embodiments. This embodiment's approach is an alternative toward improving the near isothermal temperature profile for the thin disk 1 and 171. All of the forced convection working fluid system including fluid transfer parts are preferably the same. A preferred difference from the embodiments in FIG. 27-29, respectively, is a different heat spreader section 403 from 103, 244 and 302. Here, a single section spiral having nominal diameter of 0.7 mm is placed in the top side of 403 which has a center 415 on top view corresponding to 471 on the bottom view of section 403. The returning paths are six holes 461-466 placed equally around the last spiral. The working fluid then is re-cycled by the same fluid pump system described above.

Figure 31A:
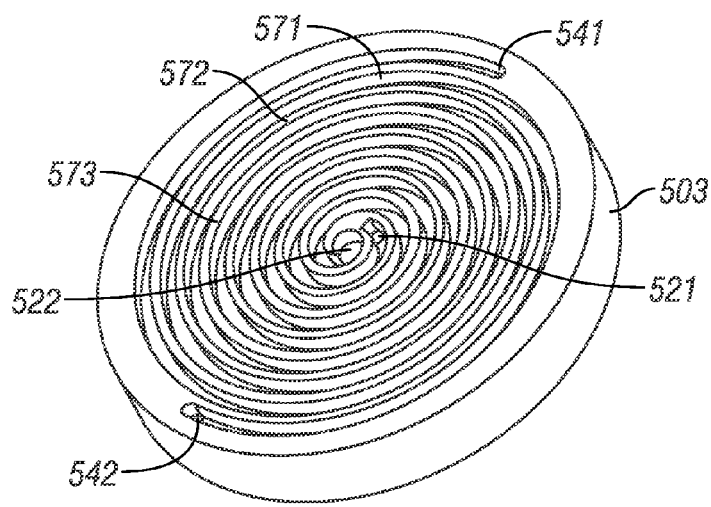
FIG. 31. Double "Spiral"-Hybrid Fluid-Pump Oscillating Heat Pipe as Advanced Heat Spreader for Thin Disk Laser.
Figure 31B:
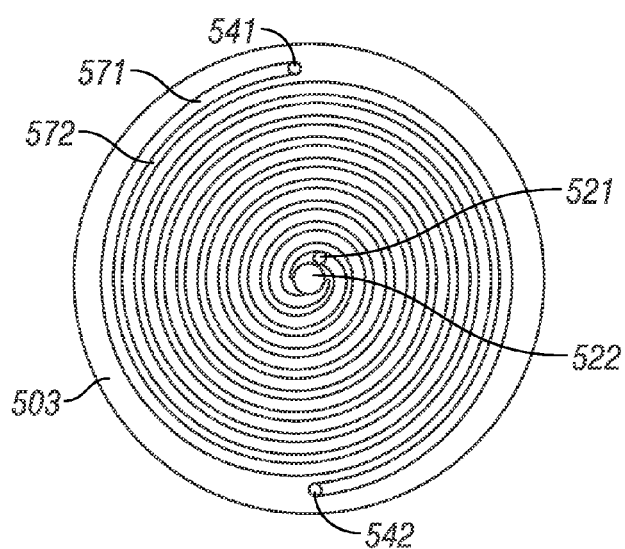
Figure 31C:
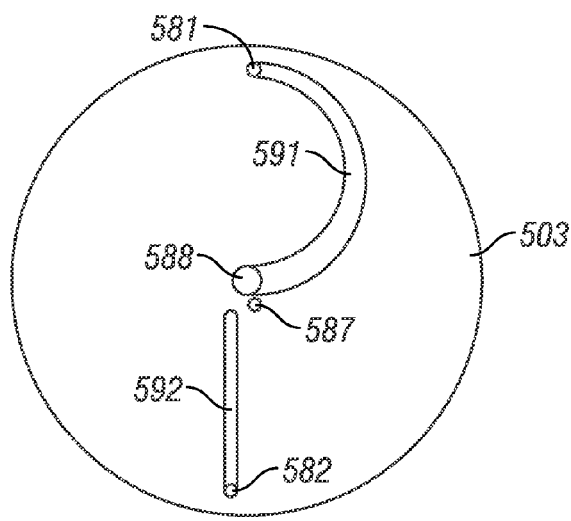
Figure 32A:
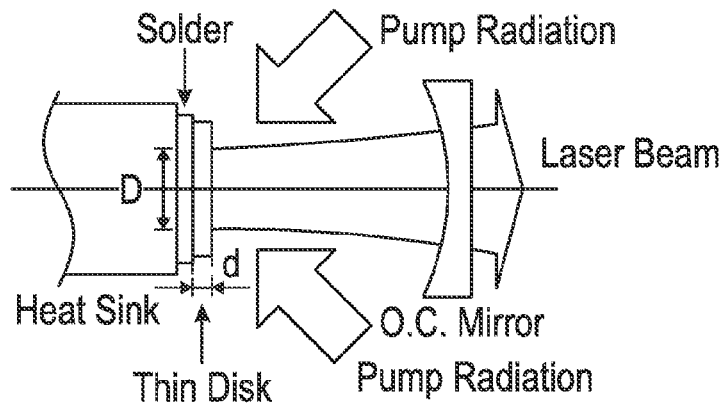
FIG. 32. Specific solid-state laser configurations and laser diodes for implementation of OHP and forced convective-OHP for enhanced thermal management to enhance performance and scaling laser power.
Figure 32B:
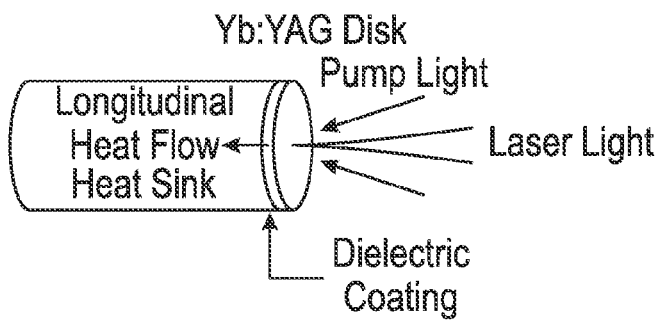
Figure 32C:
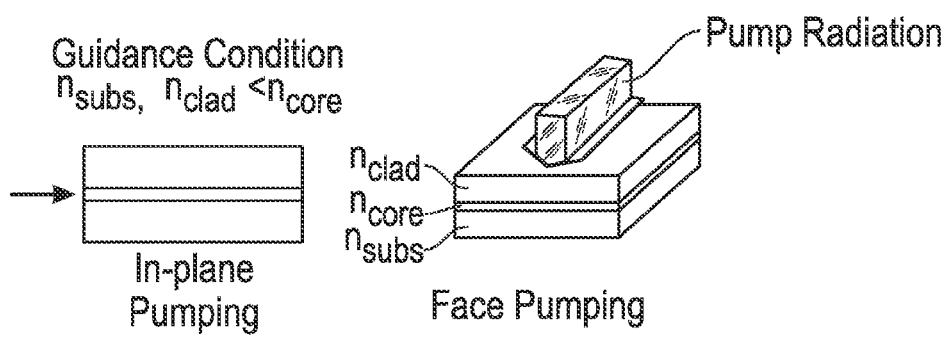
Figure 32D:
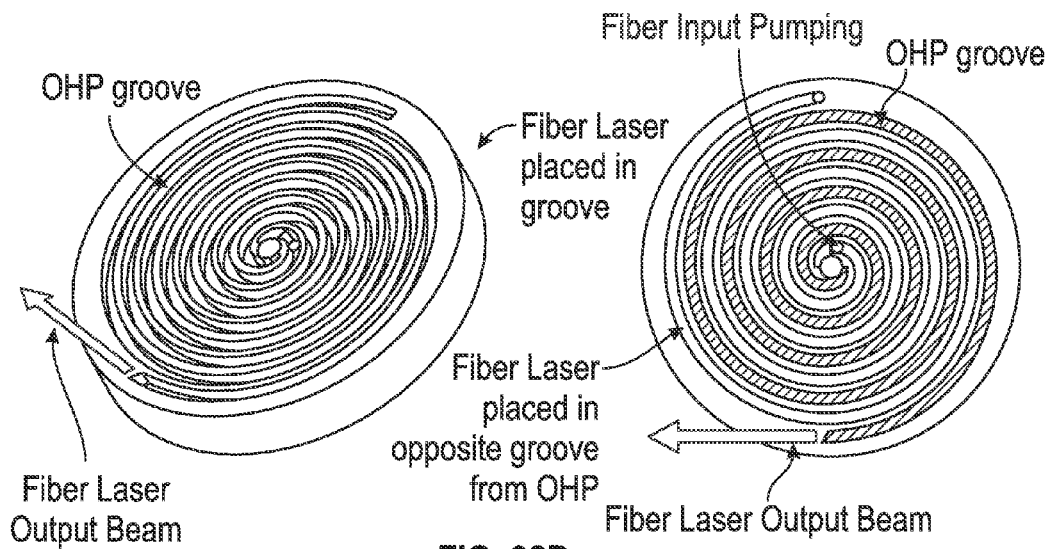
Figure 32E:
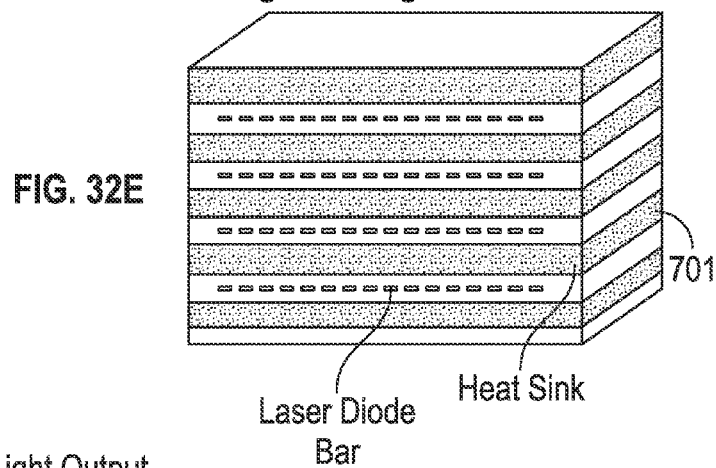
Figure 32F:
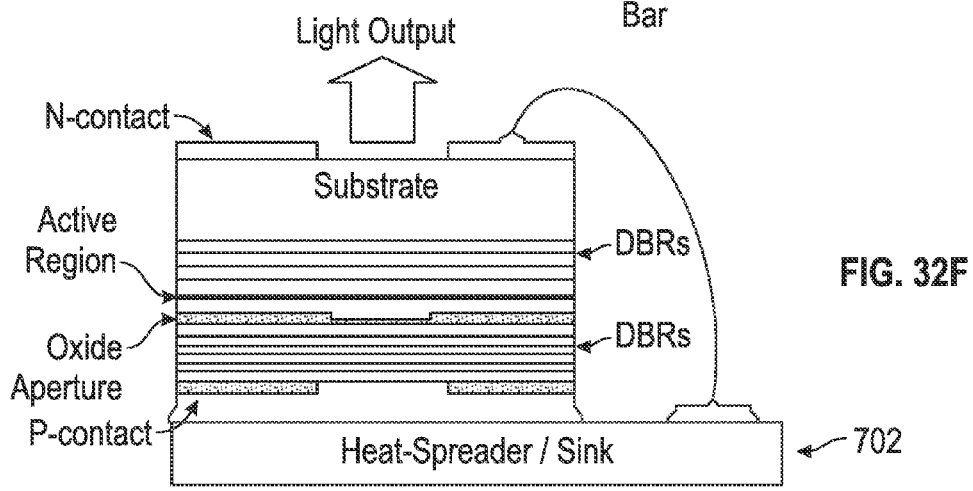
Figure 33A:
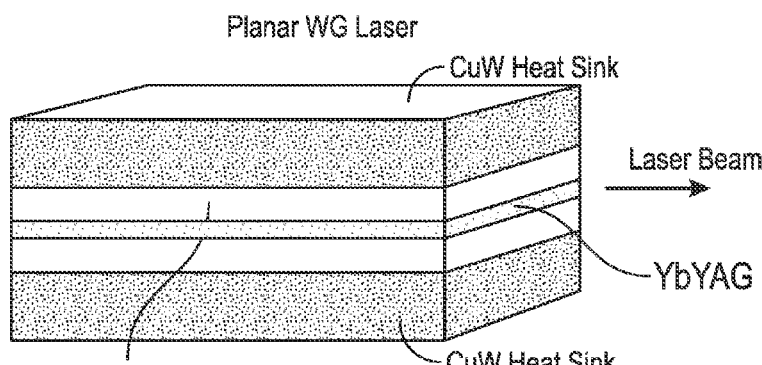
FIG. 33. Temperature behavior in Yb:YAG planar waveguide solid-state laser having 500 micron×4 mm wide thin slab with a 50 mm using CuW heat sink, (a) schematic of planar WG solid-state laser, (b) temperature along cross section of slab, (c) isothermal bars of (b) and (d) temperature profile along cross section. The pumping power was 4.8 kW/cm$^3$.
Figure 33B:
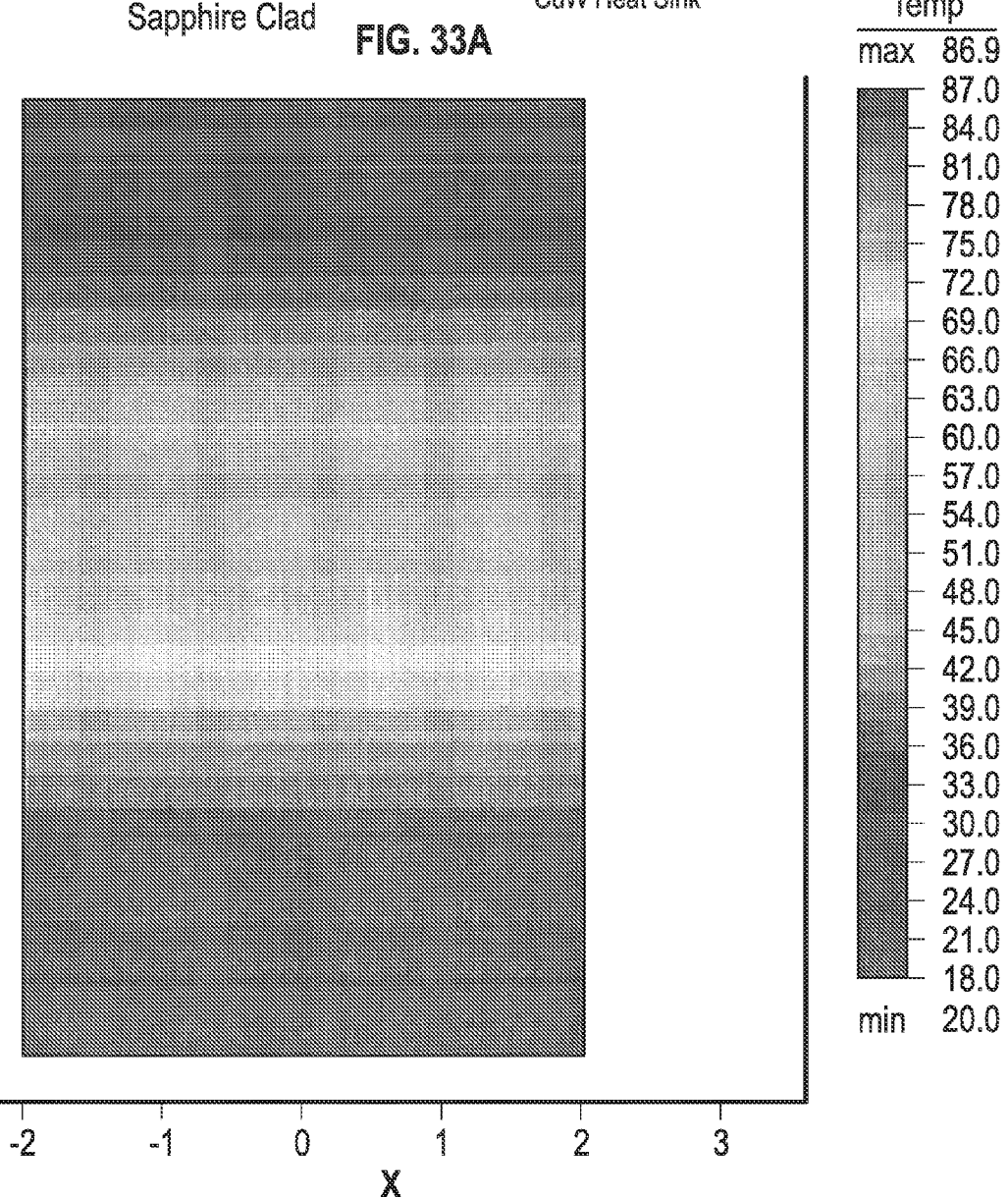
Figure 33C:
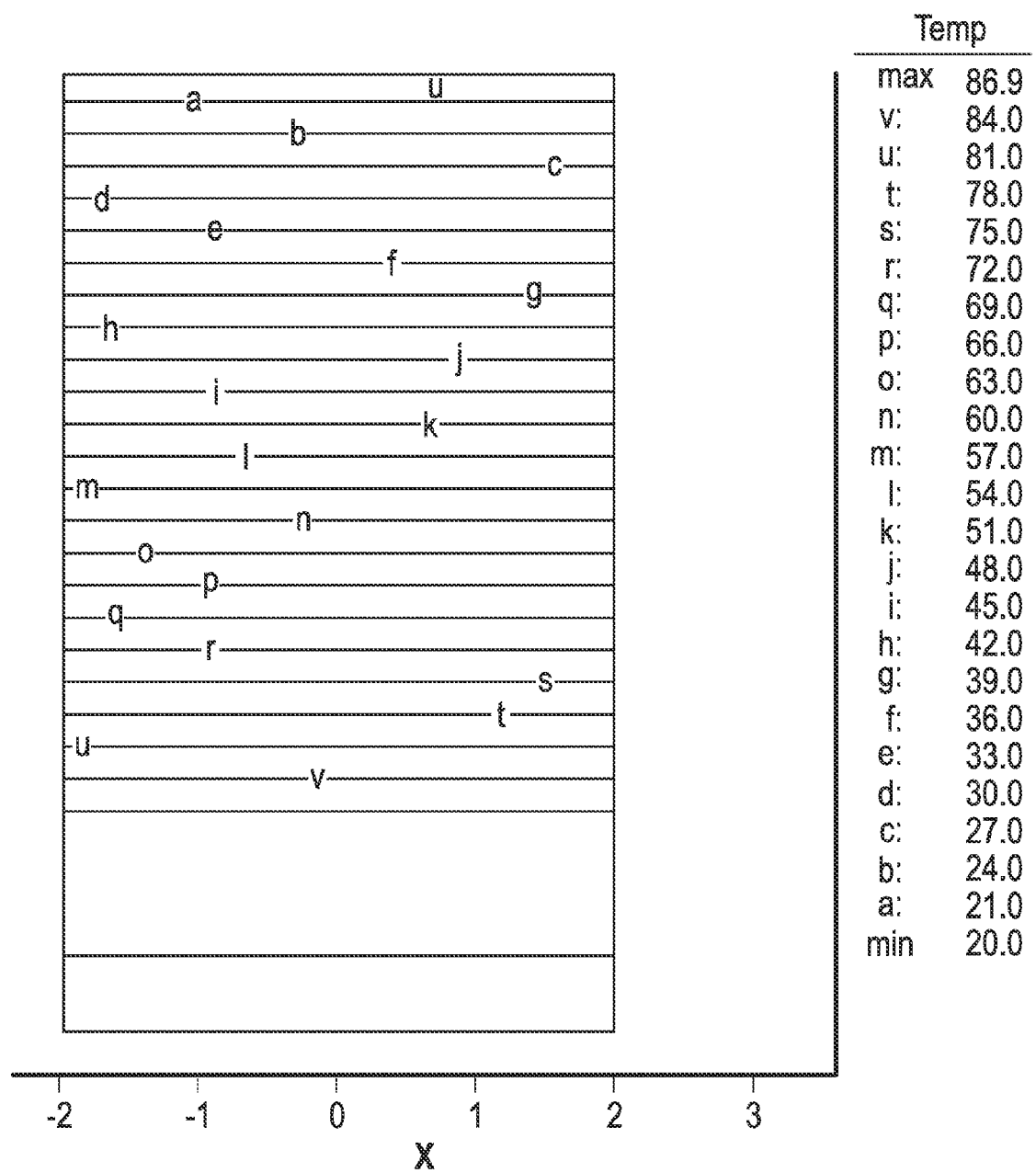
Figure 33D:
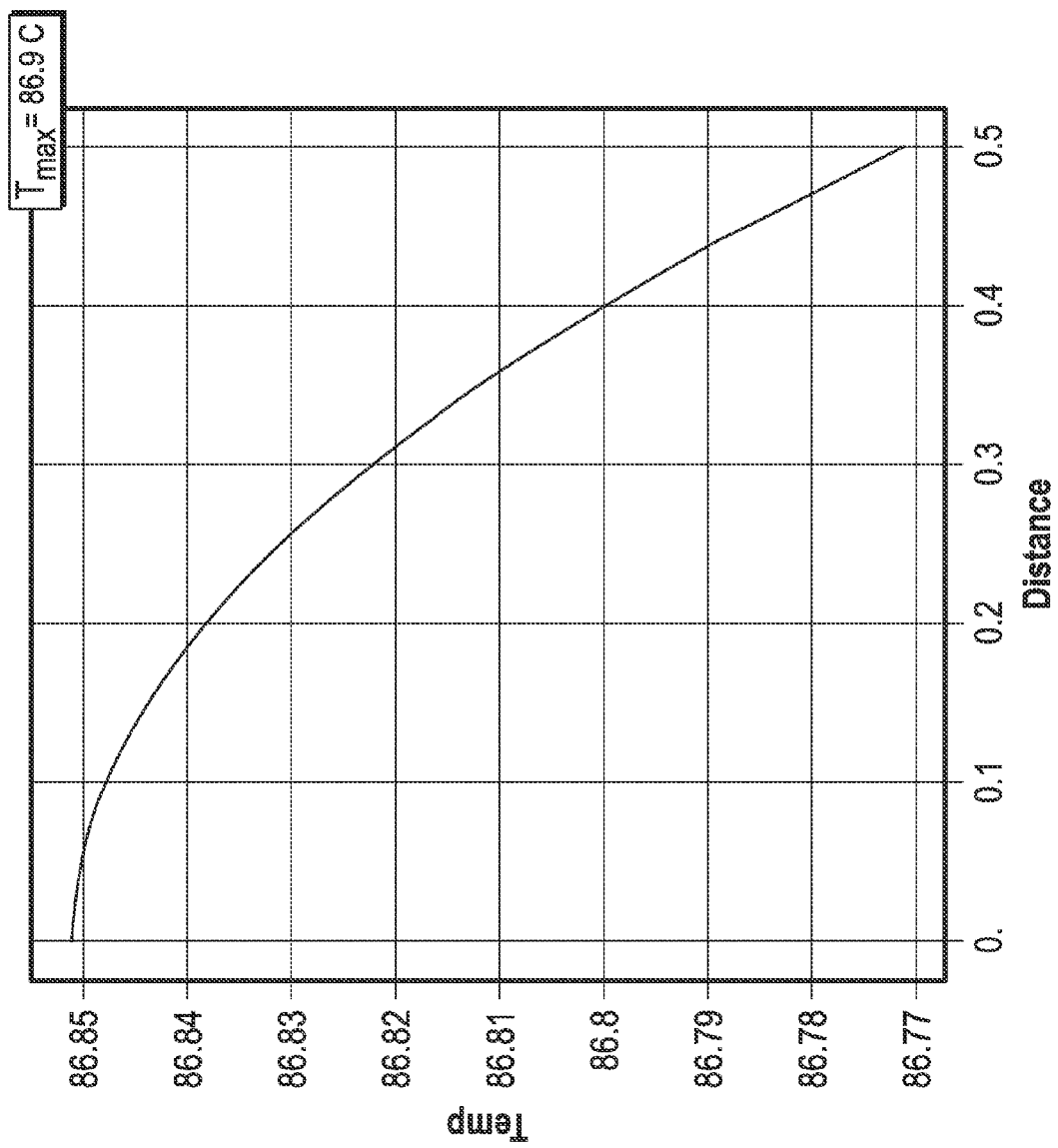

Again, like the above third embodiment, the important features of this embodiments is its circular design, potential compact size and future direct insertion into present thin disk laser systems. The multiple pathways for the OHP processes of vaporization and condensation of the working fluid plus the enhanced convective flow by the fluid pumps should make it perform as a nearly isothermal surface for cooling the thin disk 173 using this embodiment of the invention plus improve the beam quality of the thin disk laser at high power with negligible dynamic focusing, near isothermal temperature profile across lasing thin disk, and stress-induced birefringence induced polarization losses Seventh Embodiment The last embodiment shown in FIG. 31 is very similar to the sixth one except a double spiral configuration of the slots 571 and 572 is used and the working fluid flows in opposing directions. This arrangement is another attempt to provide better isothermal conditions on the lasing thin disk. Through holes 541 and 542 at the end of each slotted spirals, the working fluid flows back into the collecting tube and the fluid pump. The two injection holes 587 and 588 provide the convectively enhanced flow into each of the two spiral grooves for them to have the working fluid flow to go from the center of the advanced heat spreader to the outside radial positions. An alternative is to have the working fluid in each of these spiral to be opposing or in opposite directions. This can be enabled by having port 522 have the working fluid be injected into it and port 541 also be injected with its outlet being 541 as another method to improve the isothermal conditions on the thin disk. In the latter configuration, the injected flow through tube 107 would have part of its fluid be transferred through 591.

Again like the above third embodiment, the important features of this embodiments is its circular design, potential compact size and future direct insertion into present thin disk laser systems. The multiple pathways for the OHP processes of vaporization and condensation of the working fluid plus the enhanced convective flow by the fluid pumps should make it perform as a nearly isothermal surface for cooling the thin disk 173 using this embodiment of the invention plus improve the beam quality of the thin disk laser at high power with negligible dynamic focusing, near isothermal temperature profile across lasing thin disk, and stress-induced birefringence induced polarization losses.

Due to the limitations existing in the conventional single phase flow, vapor chamber, and oscillating heat pipe, a novel mechanically-controlled hybrid oscillating two-phase system, as shown in FIG. 21, is proposed, which will consist of the 3-D mechanically-controlled two-phase nanofluid oscillating flow and the thin film evaporation. The proposed design will utilize the extra-high evaporating heat transfer of thin film evaporation, strong oscillating motion, higher heat transport capability of nanofluids, and nanostructure-modified surfaces and wicks to significantly increase the heat transport capability in the proposed hybrid phase-change heat transfer device. FIG. 21 illustrates one design of proposed hybrid mechanically-controlled oscillating two-phase system. In order to form a very strong oscillating motion with high frequency, the oscillating motion will be mechanically controlled. A train of vapor bubbles and liquid plugs will flow through the channel with high speed. The channel wall, which will be fabricated from the microstructured wick, the solid line shown in FIG. 21 will be used as the evaporating surface. The channel shape, channel arrangement, and channel number will depend on the total power, heat flux level, and heat sources. The open region between the liquid plugs will have an extra fast evaporation rate through nanostructure wicks. The pore size in the evaporating section must be optimized in order to have the maximum number of the thin film regions, excellent wetting characteristics, and optimum thickness for the maximum boiling limit. The wicks in the condensing area must be optimized to significantly increase the condensing heat transfer by using hydrophobic surfaces. The wetting characteristics will gradually vary from the perfectly wetting condition (hydrophilic) in the evaporating section to the partially wetting (hydrophobic) in the condensing section. The flow path for the liquid flow from the condensing section to the evaporating section will be optimized to significantly reduce the pressure drop.

When heat is added on the evaporating region of the microstructured surface from the heat source, as shown in FIG. 21, the heat is transferred to both the liquid plugs (sensible heat) and the region between the liquid plugs (latent heat). As the heat reaching the region between the liquid plugs, it is transferred through the nanostructure wicks and to the liquid-vapor interface, where the thin evaporation heat transfer occurs. The vapor generated in these areas will be immediately removed by the mechanically-controlled two-phase flow, and directly brings the heat from the evaporating (hot) area to the condensing (cold) area and condenses into liquid. The condensate will be pumped back by the mechanical controlled oscillator. When the total power and the heat flux level are high, the capillary force produced in the wick cannot overcome the pressure drop in the wick, the vapor chamber will reach the capillary limit, which is the reason why the current available heat pipe, although it is much better than single phase heat transfer cannot remove the heat at an extra-high level of heat flux such as occurring in the high power TDLs. When the input power is higher, while the oscillating motions of liquid plugs and vapor bubbles produced by the mechanically controlled oscillator can remove heat by the forced convection, it can directly help to bring condensate back to the evaporating surface.

And more importantly, the oscillating motion can make it possible to use nanofluid as the working fluid. Although the nanofluid has been introduced about 10 years ago, no application is available until the nanofluid oscillating heat pipe is developed [29-31]. The reason is that when the nanoparticles settle down, the heat transport capability of nanofluid significantly reduces. For the proposed system, the oscillating motion excited by the oscillator (which can reach a high frequency) directly disturb the nanoparticles and make the nanoparticles to be suspended in the base fluid. The addition of nanoparticles into the base fluid can further increase the heat transport capability of the thin film evaporator on the microstructured surface. Due to the oscillating motions, the nanoparticles will not settle down. It should be noted that the nanoparticles will be added into the base fluid to be used in the proposed system.

Operation of AHS with OHP for Other SSL—Planar Waveguide and Fiber Lasers

FIG. 32 shows different laser system of which the closed loop, oscillating heat pipe described in this invention can provide very good thermal management with very good results. First, the thin disk laser of FIGS. 32-a and -b have been described extensively earlier in this disclosure, FIGS. 20-31. For this laser system having a very small diffusional disk thickness, 100-200 microns, the high thermal conductivity of the above described AHS, >10,000 W/m*K, is a excellent thermal management approach for thin disk laser or amplifier medium. For the larger gain medium sizes involved in both SLAB and rod SSL plus Micro-chip laser, such a small diffusion distance does not exist. Consequently, the AHS is not presently useful for most SLAB and rod SSL configurations. In the future, this condition could change with the development of new SSL materials having K-values of 100's W/m*K. This condition exist because of low K-values for the best laser materials like Yb:YAG and Nd:YAG, which are nominally around 5 W/m*K. However, for the planar waveguide laser, FIG. 32-c, and the fiber laser, FIG. 32-d, the use of the AHS can create very substantial improvement in the laser operation. Finally, another very useful application of the large thermal conductivities of the AHS of this invention are both the Edge Emitting Laser Diodes, FIG. 32-e, Vertical-Cavity Surface-Emitting Diode Laser (VCSEL), FIG. 32-f and Vertical External-Cavity Surface-Emitting Laser (VEC-SEL).

Planar Waveguide Laser

Figures 34A, 34B:
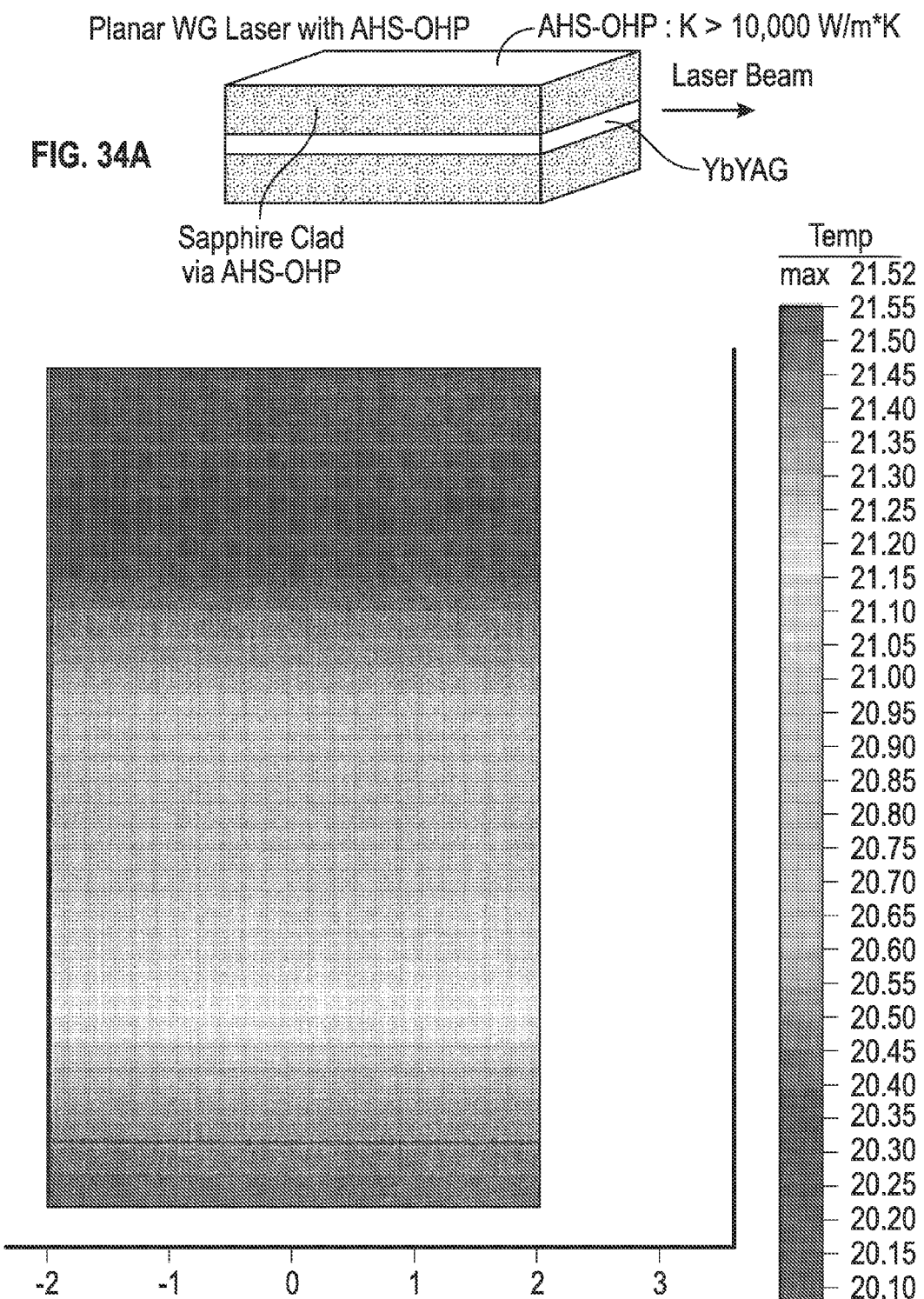
FIG. 34. Temperature behavior in Yb:YAG planar waveguide solid-state laser having 500 micron×4 mm wide thin slab with a 50 mm using advanced heat spreader using OHP and having effective K=10,000 W/m*K, (a) schematic of planar WG solid-state laser, (b) temperature along cross section of slab, (c) isothermal bars of (b) and (d) temperature profile along cross section. The pumping power was 4.8 kW/cm$^3$.
Figure 34C:
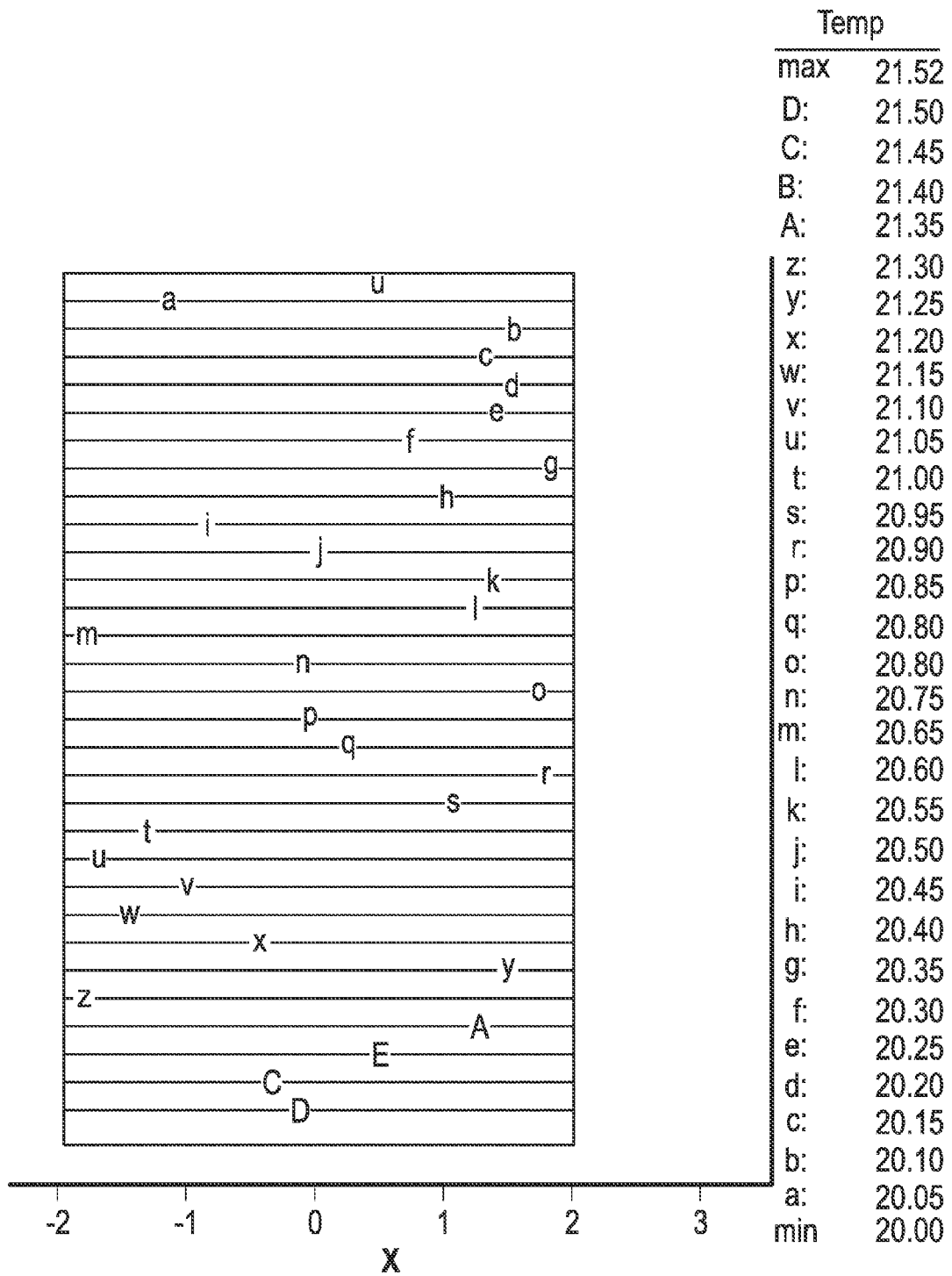
Figure 34D:
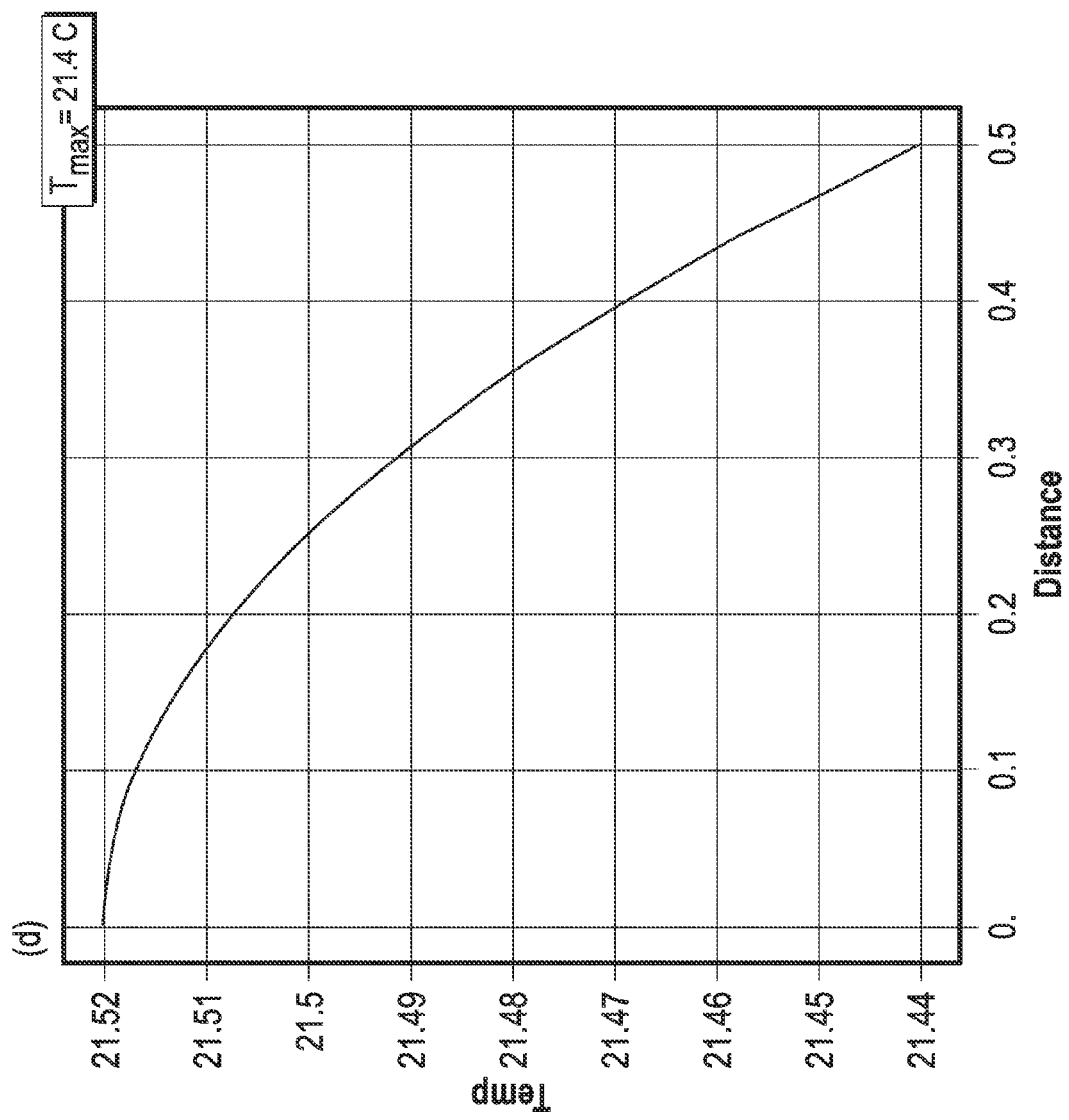

The planar waveguide laser (PWL) has made significant advances during the last 10 years with cw powers of 250 W from an active gain medium of 0.1 cm$^3$. This result is particularly impressive since PWL are relatively easy to fabricate. [J. Mackenzie, "Dielectric Solid-State Planar Waveguide Lasers: A Review", IEEE J. of Quant. Electr, Vol 13, pp. 626-637 (2007); and K. Sueda, et al., "High-efficiency laser-diodes-pumped microthickness Yb:Y$_3$A$_{15}$O$_{12}$", Vol 87, Appl. Phys. Lettl, pp 151110-1-3 (2005)] FIG. 33-a shows a typical PWL solid-state laser. The central rectangular Yb:YAG region of 300-500 microns thick and 3-5 mm wide is end pumped from either end of the waveguide. Above and below this region is a sapphire clad promoting total internal reflection (TIR) since the refractive index of sapphire ($\cong$1.77) is lower than Yb:YAG ($\cong$1.815) for laser wavelength near 1.3 microns. Above and below these cladding regions is a CuW heat sink. The resulting temperature behavior for an absorbed pumping power density of 4.8 kW/cm$^3$ is illustrated in FIGS. 33-b-d with a maximum temperature 86.9° C. at the center y-axis position in the gain region. Replacing the CuW heat sink with a K=180 W/m*K values with the advanced heat spreader-OHP having an effective thermal conductivity of 10,000 W/m*K produces significant reduction in the temperature. FIG. 34 shows the behavior with the T$_{max}$ reduced to 21.4° C.

Eight Embodiment

Figure 22:
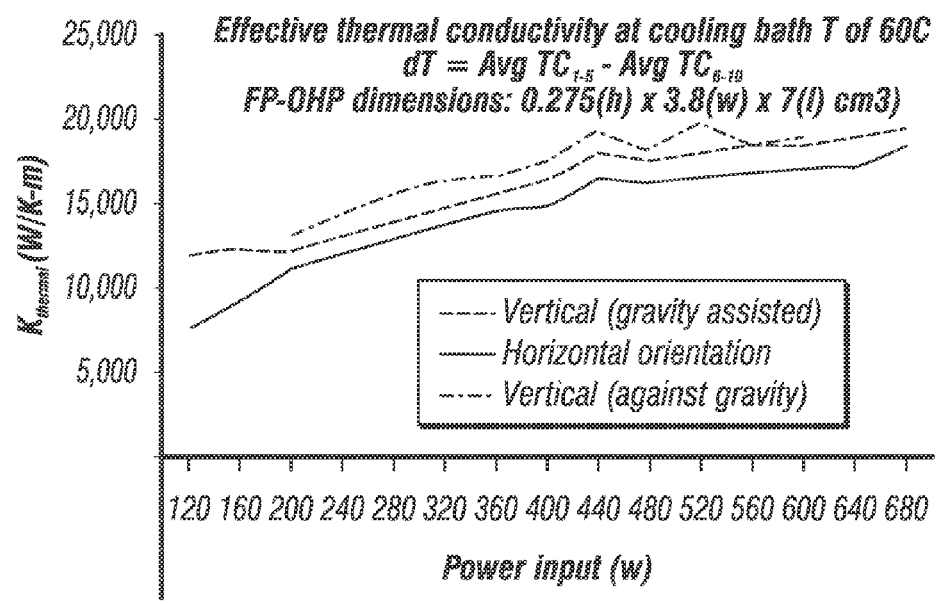
FIG. 22. "Effective" thermal conductivity of three dimensional, flat plate oscillating heat pipe (3D-FP-OHP) operating with effective K-values greater than 10,000 W/m*K and photo of OHP used for data shown in FIG. 22. "Working fluid" and vacuum port not shown.
Figure 23:
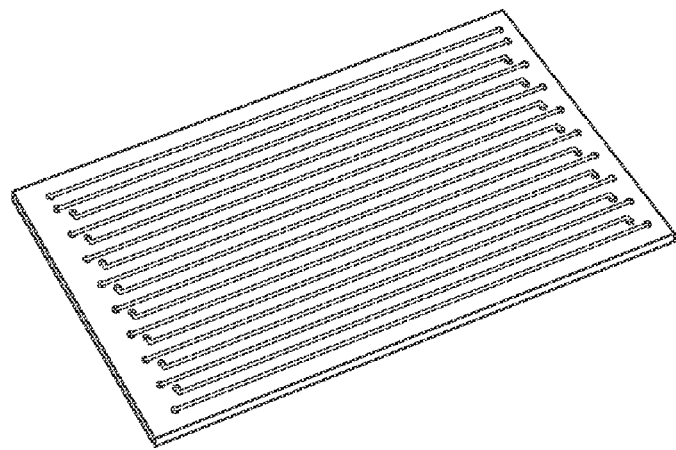
FIG. 23. Photo of OHP used for data of FIG. 21—top grooves in plate. Bottom—top cover with vacuum—"working-fluid" fill port 3D-FP-OHP.
Figure 35A:
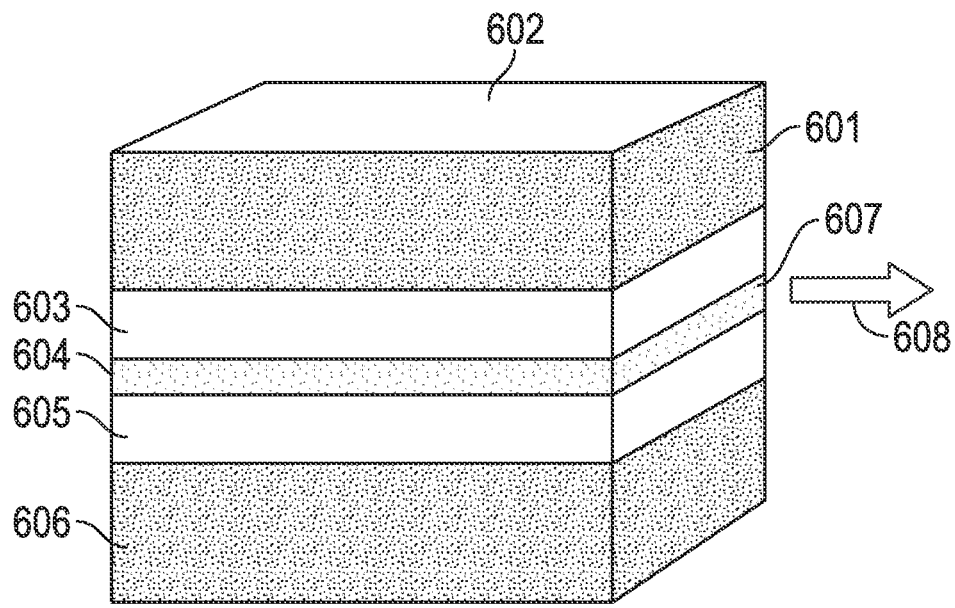
FIG. 35. Schematic of eighth embodiment of this invention showing basics of (a) Prior Art of planar waveguide SSL and (b) the details of this invention for greatly advancing thermal management of Plana WG SSL using the advanced heat spreader using OHP as described previously in this invention.
Figure 35B:
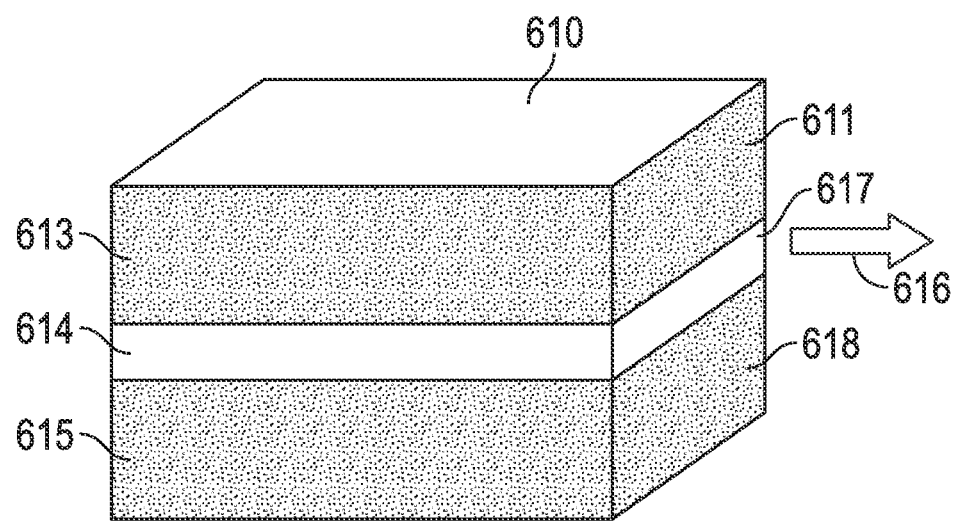

This next embodiment comprises an advanced heat spreader as described in FIGS. 20-22 and all aspects of the previous embodiments to advance and improve the thermal management of planar waveguide solid-state lasers. In FIG. 35-a, the previous PWL schematic is shown. Here, the SSL laser gain medium 604 like Yb:YAG and Nd:YAG and other previously mentioned in this invention has above and below it sapphire clad 603 and 606 to promote total internal reflection of both the pump radiation and the laser. On both sides of the PWL structure are mirrors not shown with the resulting laser beam 608. S. The CuW heat sinks 602 and 606 remove heat through the top 602 and bottom surfaces which are both cooled normally by water or some other liquid or thermoelectric coolers.

In this embodiment, FIG. 35-b, an advanced heat spreader with the high K-values shown in FIGS. 20-22 and FIGS. 26-31 replaces either (a) both the heat sinks 601 and 606 or (b) both of these heat sinks 601 and 606 plus the typically sapphire dads 603 and 605. For option (a) the AHS-OHP system can be fabricated from any material since the sapphire clad 603 and 606 will assure that TIR exists within the waveguide region. Option (b) makes the PWL structures simpler since the entire PWL system consists of only 3 parts, the AHS-OHP 610 and 615 and the solid-state laser gain medium 614. However, the advanced heat spreader has to be fabricated from sapphire or any other material that has a refractive index at both the pumping and laser wavelengths that is less than that of the laser gain medium 614/617.

Fiber Lasers

Figure 36A:
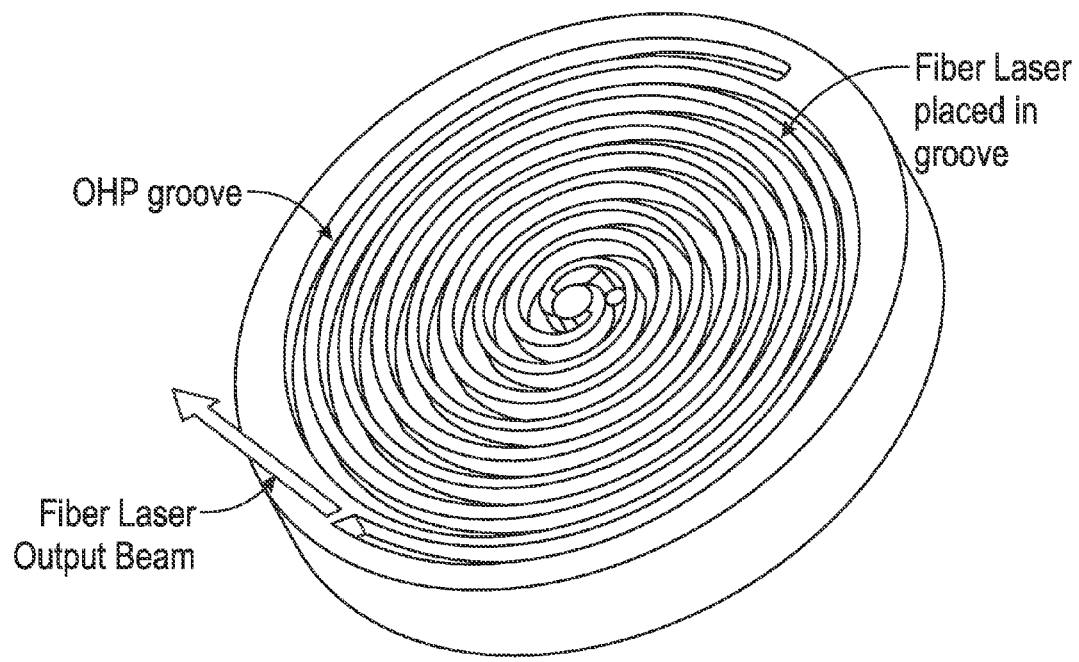
FIG. 36. Conceptual concept for use of AHS with fiber laser to assure near isothermal condition to enhance laser performance and enable phase coupling of multiple fibers where (a) shows 2 fiber laser (FL) pumped from center of groove spiral, fiber layers are placed in grooves and laser output beams are shown as output at edge of spiral groove mount, and (b) shows the two FL's in the groove mount.
Figure 36B:
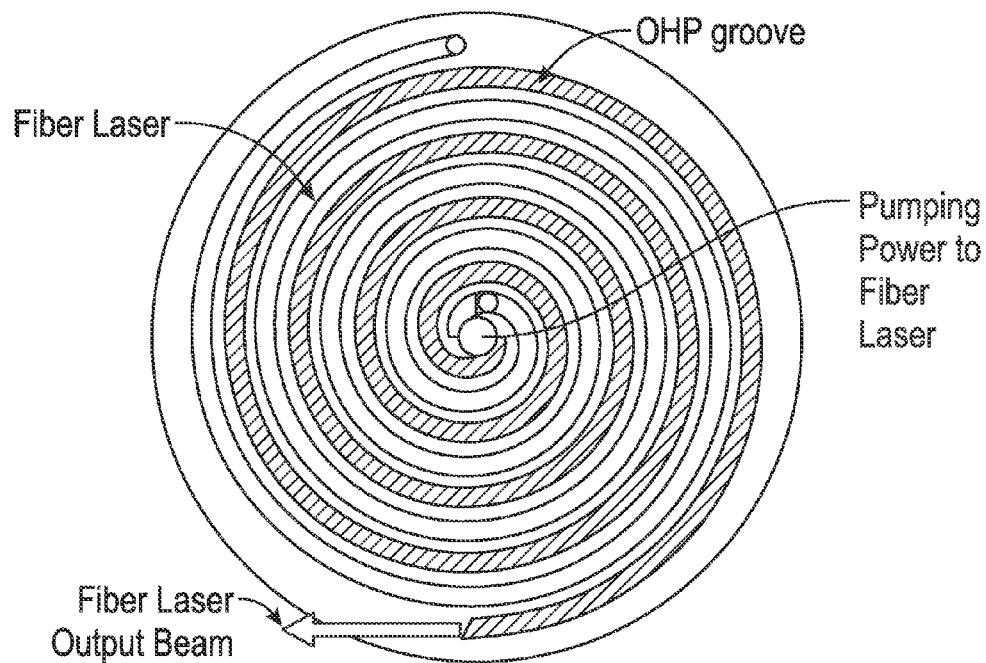
Figure 37A:
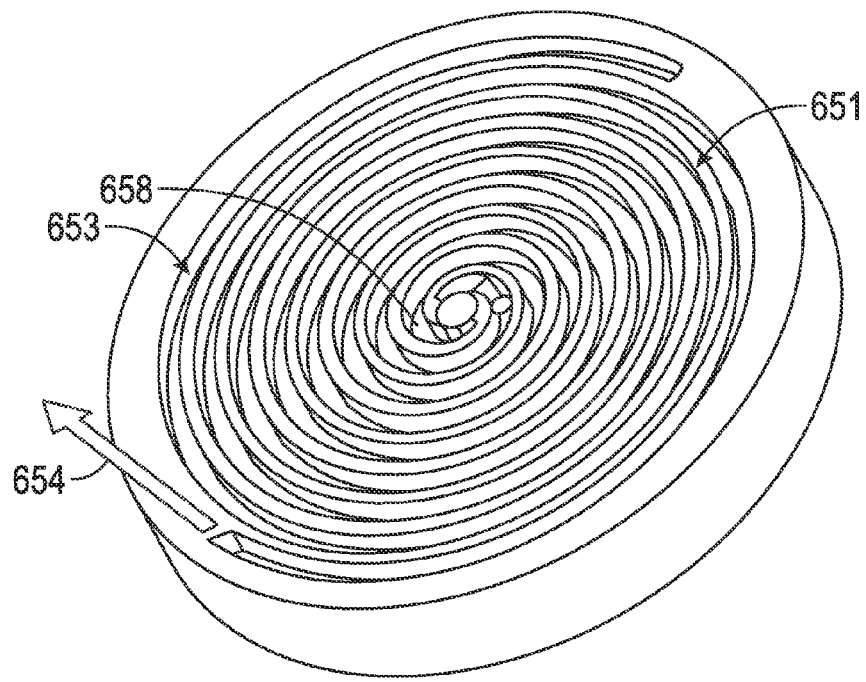
FIG. 37. Schematic of ninth embodiment of this invention showing Conceptual concept for use of AHS with fiber laser to assure near isothermal condition to enhance laser performance and enable phase coupling of multiple fibers using the advanced heat spreader using OHP as described previously in this invention.
Figure 37B:
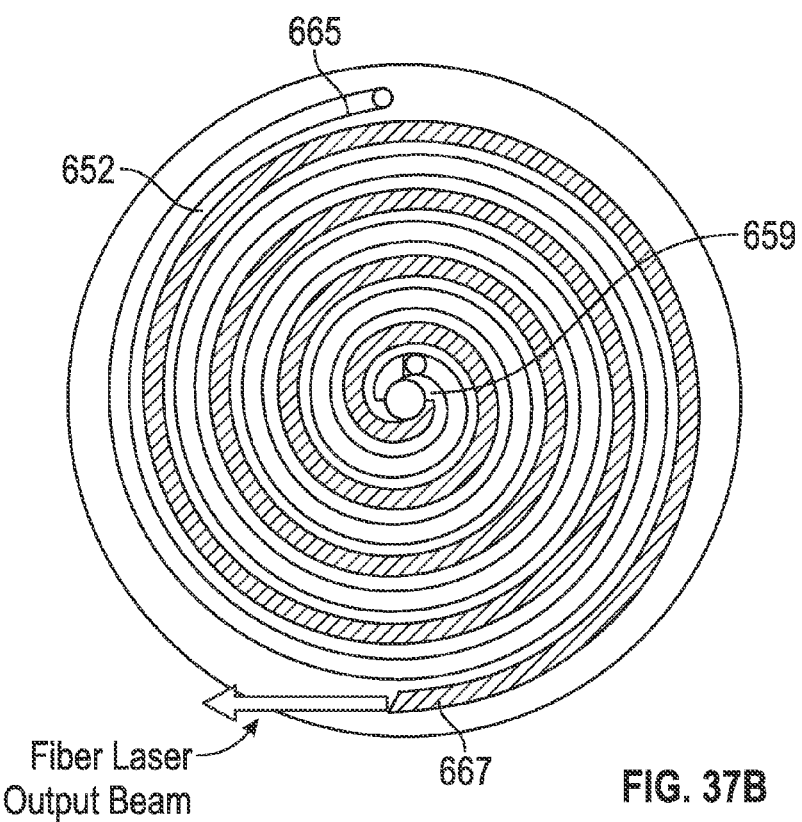
Figure 37C:
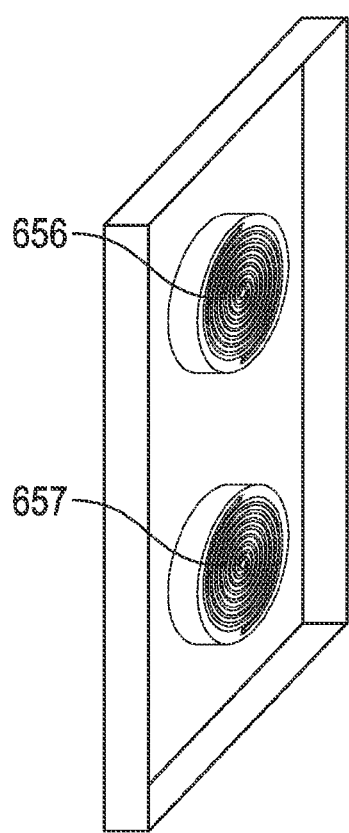
Figure 37D:
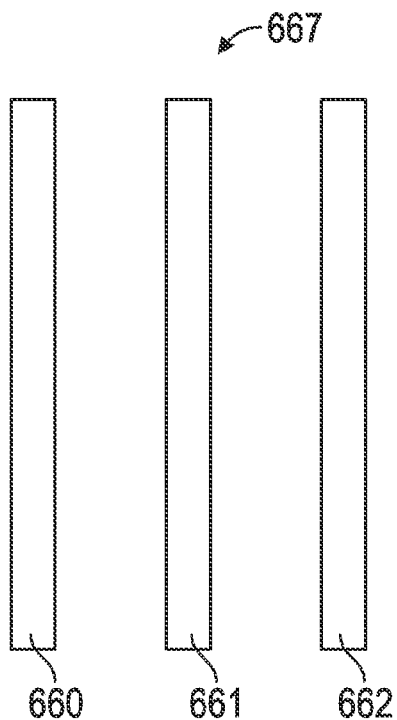
Figure 37E:
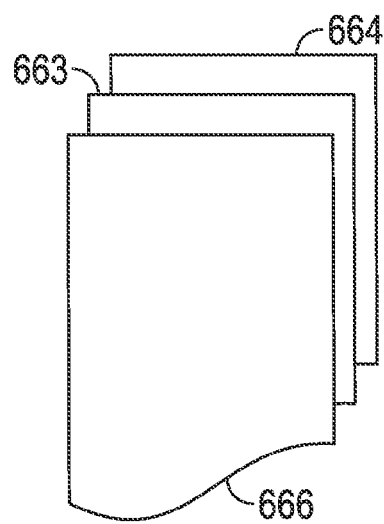

FIG. 36 illustrates the use of the Seventh Embodiment as shown in FIG. 31 to enhance the operation of fiber lasers. In FIG. 31, a double "Spiral" configured advanced heat spreader depicted a method and apparatus to improve the temperature uniformity of a thin disk by having the "working fluid" flow in opposite direction in the adjacent grooves of the OHP. Another embodiment of this invention is to only use one of these "spiral" grooves for the OHP and in the other groove place a fiber laser without its polyimide protective coating since it has a lower thermal conductivity. This arrangement is shown in FIG. 36-a. The valuable aspects of this approach are (a) much better temperature uniformity of the fiber length useful for phase coupling many fiber lasers, (b) enhanced heat removal from the fiber lasers and (c) a very robust system and (d) removal of large amount of heat via the mechanically-controlled advanced heat spreader shown in FIGS. 20-22. FIG. 36 shows an unique use of AHS to more efficiency operate and phase couple multiple fiber lasers (2 shown here). Here two fiber lasers are placed in the grooves of a center structure between two each AHS system to generate very isothermal conditions for the laser operation. A similar system using only one AHS and a mirror replacing the 2 FL structure can also greatly improve the performance of high power laser mirrors.

Ninth Embodiment

In this next embodiment, FIG. 37 provides specific details of its methodology and the specific apparatus employed. In the "spiral" double advanced heat spreader configuration illustrated in FIG. 31, only one groove 663 and 665 are used as a OHP containing the "working fluid". Adjacent grooves to 663 and 665 like 652 and 659 contain the fiber laser and these will be smaller diameter and have contact to wall of OHP system using types of thermal paste. To have multiple fibers integrated into an AHS-OHP system, two or more fiber coupled-"spiral" systems 656 and 657 and be stacked as FIGS. 37-c and -d illustrate. Here, 660 and 662 "spiral" are coupled together containing a fiber 667. Similarly, in FIG. 37-e show the stacking method and apparatus of an integrated AHS-fiber 663 placed in alternate AHS 666 and 664.

For the three types of heat spreader groove configurations shown in FIGS. 32-1, -b and -c, each system can be integrated with an advanced heat spreader-OHP system to improve iso-thermal conditions for SSL thermal managements. Each of these configurations can be easily fabricated and shown significant value for very good thermal management of various thermal management of high power solid-state laser systems. Additionally, the fabrication cost are inexpensive Edge-Emitting Laser Diodes Edge emitting laser diodes are the most available laser diodes at high powers. These high power are achieved by packaging individual laser diode bars into stacks as illustrated in FIG. 32-e showing the basic features of single edge-emitting laser diode bar, which can be stacked as vertical bars or a combination of both horizontal and vertically stacked of laser diode bars. Due to the use of CuW heat sinks with these types of laser diodes, de-ionized water was required in the use of microchannel coolers due to resultant erosion and corrosion of the copper occurred while in direct electrical contact with the laser diodes. [R. Feeler, et al., "Next-Generation Microchannel Coolers", High-Power Diode Laser Technology and Applications VI, Proc. of SPIE, Vol. 6876, p. 687608 (2008)] A method and apparatus to overcome many of these obstacles is provided using the mechanically-coupled, advanced heat spreader-oscillating heat pipe described in FIGS. 20-22 and FIGS. 26-31.

Tenth Embodiment

In this embodiment shown in FIG. 32-e, the heat sink 701 is replaced by an advanced heat spreader with the high K-values shown in FIGS. 20-22 and FIGS. 26-31. The integration of the AHS-OHP coupled with the mechanically controlled flow provides very enhanced heat removal from the edge-emitting laser diodes which overcomes many of the existing shortcomings of microchannel coolers for laser diodes. Since these AHP-OHP can be fabricated from any type of material, the elimination of de-ionized water for cooling these laser diodes can be eliminated by using insulating materials like sapphire, BeO and other acting as good electrical insulator for the voltages and currents required to operate these devices. [R. Feeler, et al., "Next-Generation Microchannel Coolers", High-Power Diode Laser Technology and Applications VI, Proc. of SPIE, Vol. 6876, p. 687608 (2008)]

VCSEL: Vertical-Cavity Surface Emitting Lasers

FIG. 32-f illustrate the critical aspects and parameters for both Vertical-Cavity Surface-Emitting Lasers (VCSEL) and Vertical External-Cavity Surface-Emitting Laser (VECSEL). A method and apparatus to overcome many of these obstacles is provided using the mechanically-coupled, advanced heat spreader-oscillating heat pipe described in FIGS. 20-22 and FIGS. 26-31. VECSEL's can also be used with semiconductors to produce significant cw powers over 100 watts. [B. Heinen, et al., "106 W continuous-wave otput power from vertical-external-cavity surface emitting laser", Electronics Letters, Vol. 48, No 9, p. 515 (2012)]

Eleventh Embodiment

In this embodiment shown in FIG. 32-f, the heat sink 702 is replaced by an advanced heat spreader with the high K-values shown in FIGS. 20-22 and FIGS. 26-31. The integration of the AHS-OHP coupled with the mechanically controlled flow provides very enhanced heat removal from the edge-emitting laser diodes which overcomes many of the existing shortcomings of microchannel coolers for laser diodes. Since these AHP-OHP can be fabricated from any type of material, the elimination of de-ionized water for cooling these laser diodes can be eliminated by using insulating materials like sapphire, BeO and other acting as good electrical insulator for the voltages and currents required to operate these devices.

Specific Designs for Advanced Heat Spreaders for SSL Thermal Management

Figure 38A:
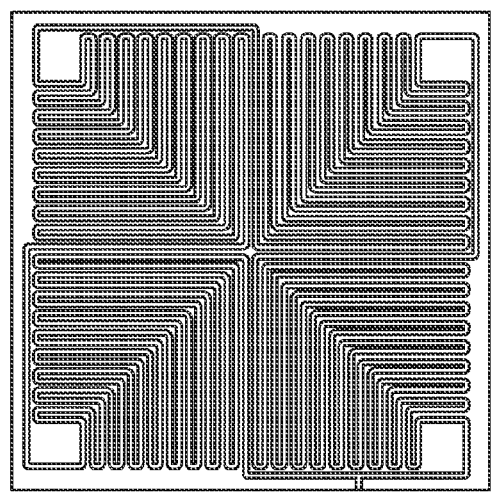
FIG. 38. Three specific designs for OHP for advanced heat spreader system for solid-state laser systems.
Figure 38B:
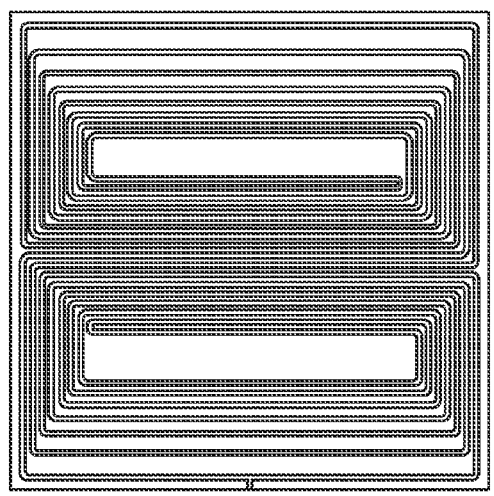
Figure 38C:
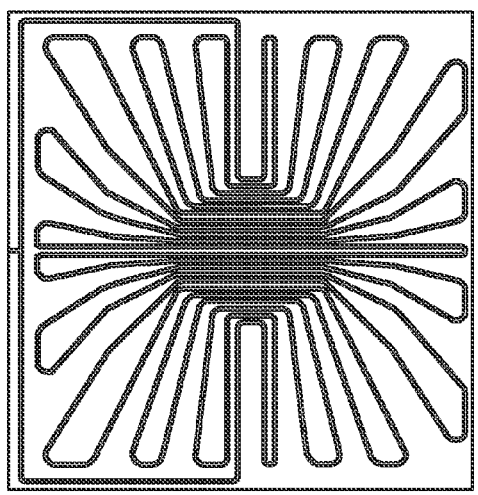

FIG. 38 shows three specific designs for OHP section for advanced heat spreader system for solid-state laser systems that can improve the uniformity of the advanced heat spreader that are alternate to those shown in FIGS. 26-31. The OHP action occurs as the "working fluid" moves through the grooves on the top side and the down to the bottom side by holes close to the edges connecting both sides. A thin top and bottom plate, nominally less than 1 mm thick, are bonded to both sides. Their operation are similar to that described in FIGS. 26-31.

Figure 39A:
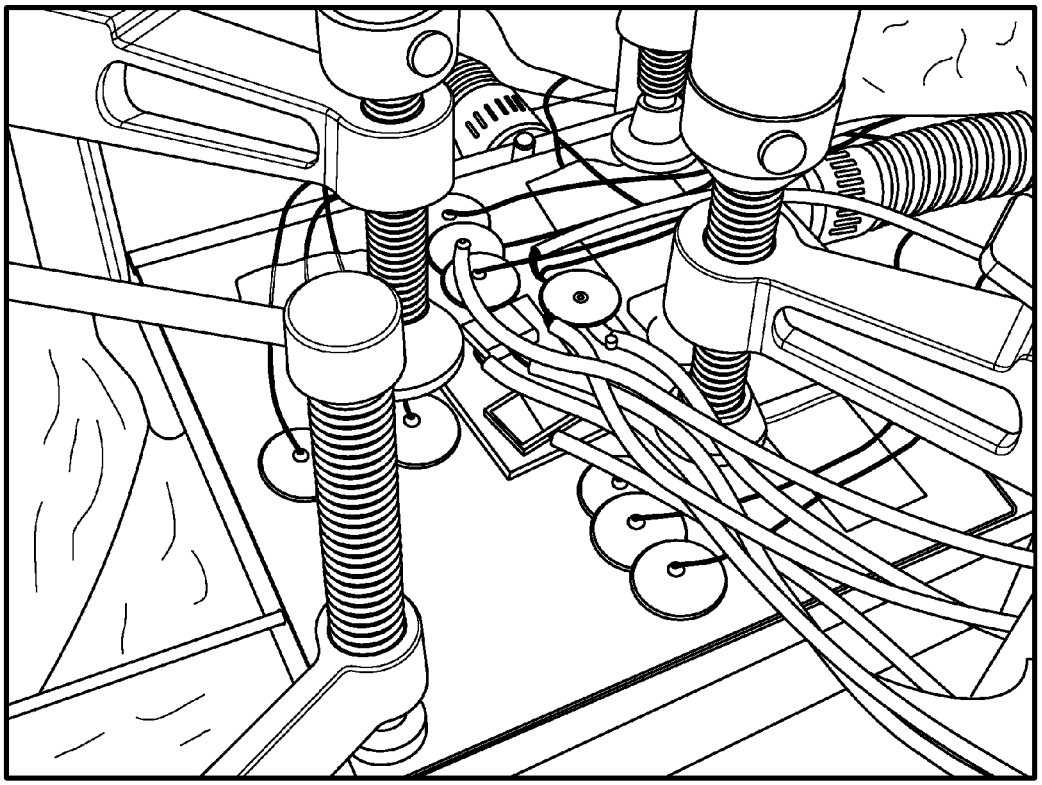
FIG. 39. Operating flat-plate oscillating heat pipe using acetone as the working fluid. System is "spoke" configurations. No external mechanical pump used here. (a) photo of OHP, (b) positioning of thermo-coupling measuring temperatures and (c) monitored temperatures.
Figure 39B:
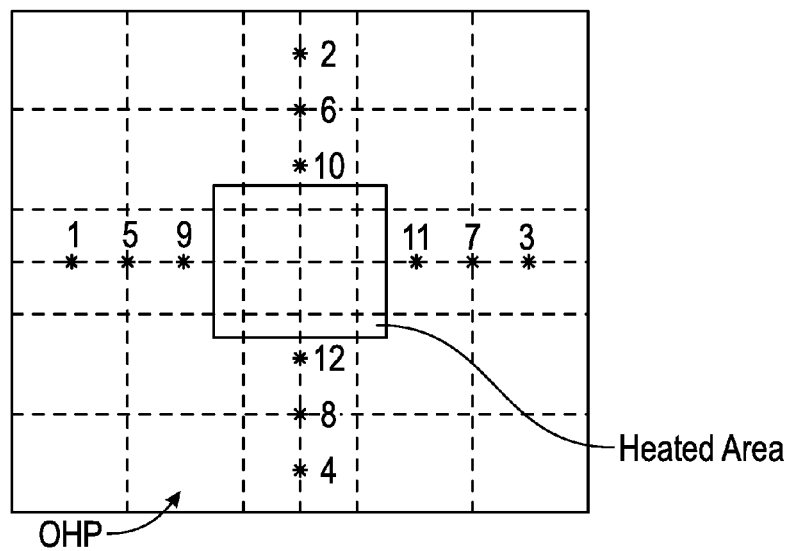
Figure 39C:
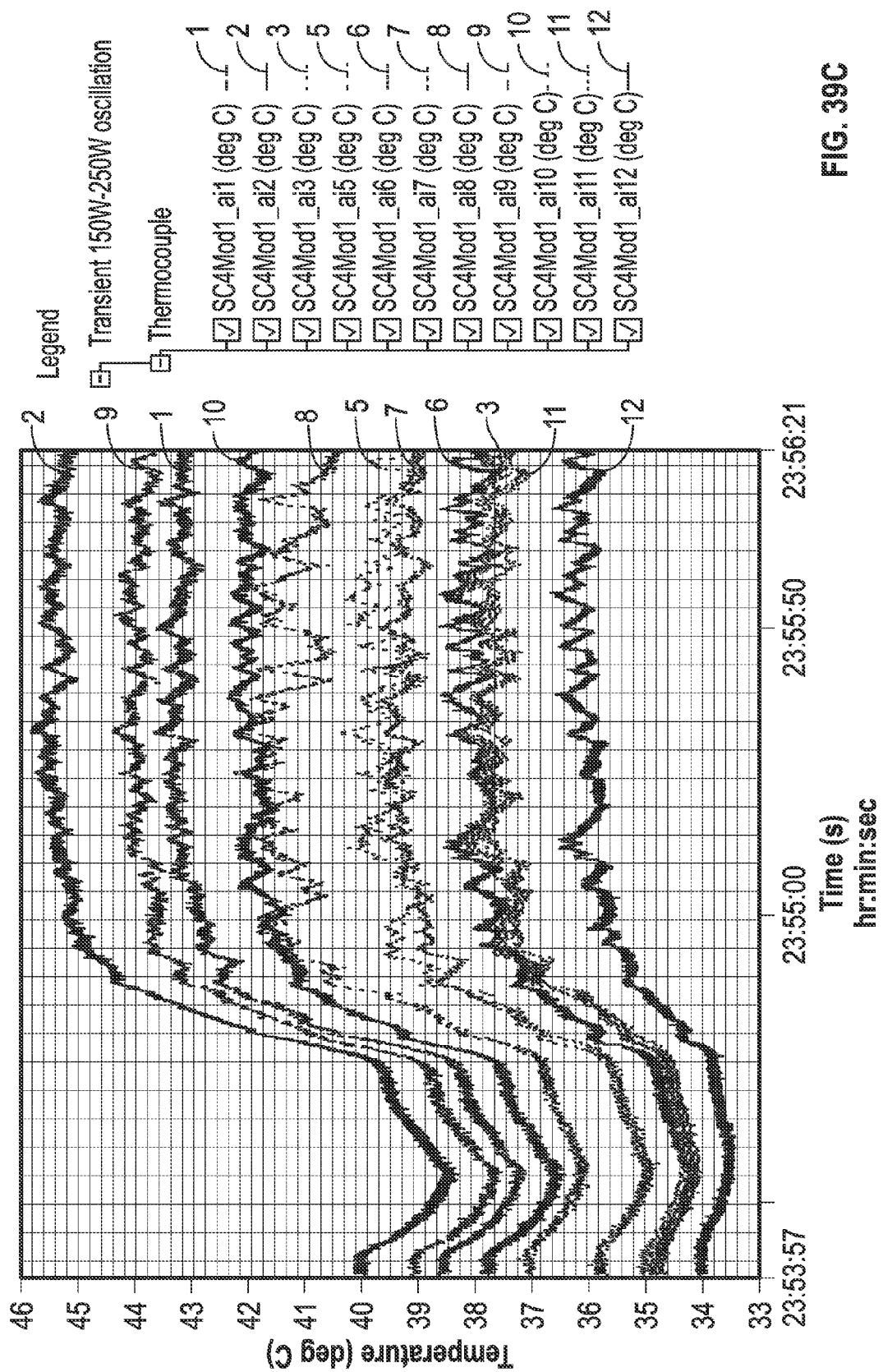

FIG. 39 shows the "start-up" performance of a "spoked" type of advanced heat spreader using an oscillating heat pipe with acetone as the working fluid. The legend on right side of FIG. 39-c gives correlation with FIG. 39-b as denoted by numbers. FIG. 39c illustrates the temperature values at various parts of the outer edges of the OHP shown if FIG. 39-b. Although they are slightly different temperature, the data clearly shows the stability of the temperatures plus less than 10 degrees Kelvin across the structure for a 250 watt thermal load. To improve and acquire even better iso-thermal conditions, a higher density of cooling grooves in the OHP is needed. Also, notice the "start-up" times are typically near seconds.

"Self-Starting" Advanced Heat Spreaders for SSL Thermal Management

FIGS. 40-41 show the integration of an "internal thermal load" condition which can enable an AHS to be ready for immediate use for the thermal management of a solid-state laser. During the non-lasing time of the SSL system, no thermal heat is released and thus there will be a delay in the AHS operation at high thermal conductivities as shown in data of FIG. 39-c that indicates several seconds of time to reach equilibrium. The approach in this invention is to incorporate an electrical load (i.e., wire or resistive sheet) 801 to continuously have the OHP be in equilibrium. Such an "thermal source" will be placed approximately equal distance below the OHP grooves and then decreased as an equal amount of thermal heat is compensated originating from the solid-state laser system.

Thirteenth Embodiment

This embodiment is similar to FIG. 36 involving fiber laser coupled to a "spoked" advanced heat spreader. In this case, however the OHP "working fluid" is placed in one groove, 802 and 804 in FIG. 41 and the electrical wire "thermal load" in placed in the adjacent groove like 803 and 805. Via computer control of monitoring this "thermal load", the thermal heat can simulate the SSL heat load to acquire faster "start-up" times.

System Description for Use of AHS at Sub-Zero Temperature: <0° C., −50° C. and 80° K.

Figure 42:
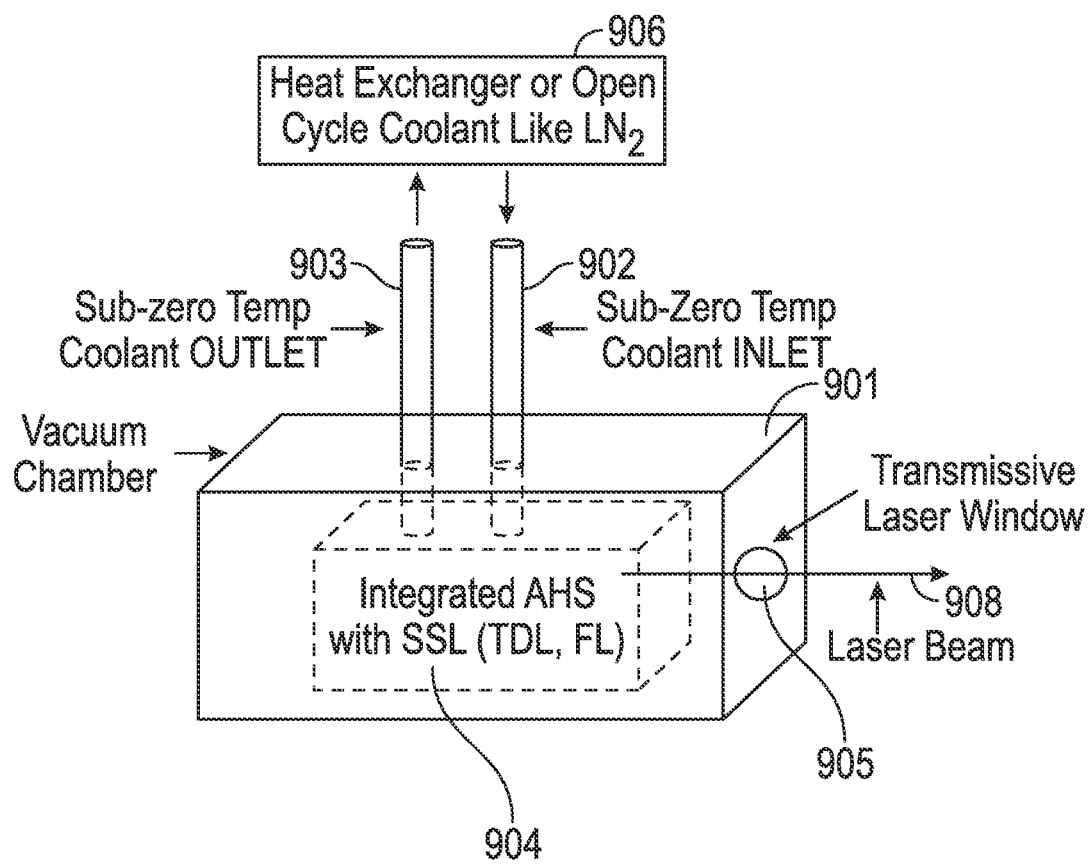
FIG. 42. Schematic of sub-zero use of AHS integrated with solid-state laser system to improve laser performance including efficiency and beam quality.

FIG. 42 shows how such an AHS would be employed at sub-zero temperature by placing it in a vacuum chamber to eliminate condensation of atmospheric constituents and efficient cooling of the thin disk or other SSL systems. With all of these AHS, advanced piezo-electric driven internal pumps can establish necessary pressures to insure high power operation of 2-phase, mechanically operated AHS systems.

Fourteenth Embodiment

In this embodiment show in FIG. 42, a solid-state laser coupled to an advanced heat spreader 904 shown if FIGS. 20-22 and FIGS. 26-31 and FIG. 38 is enclosed inside a vacuum container or chamber 901 which is evacuated typically less than a few microns of torr pressure. The cryogenic or sub-zero coolant is injected into the vacuum chamber 901 via port tube 902 and vented out through port tube 903. The laser beam 908 is propagated through a transparent window 905. Operating in this manner, the AHS-OHP system can be easily employed for sub-zero operation.

In the preferred embodiment, and as readily understood by one of ordinary skill in the art, the apparatus according to the invention will include a general or specific purpose computer or distributed system programmed with computer software implementing the steps described above, which computer software may be in any appropriate computer language, including C++, FORTRAN, BASIC, Java, assembly language, microcode, distributed programming languages, etc. The apparatus may also include a plurality of such computers/distributed systems (e.g., connected over the Internet and/or one or more intranets) in a variety of hardware implementations. For example, data processing can be performed by an appropriately programmed microprocessor, computing cloud, Application Specific Integrated Circuit (ASIC), Field Programmable Gate Array (FPGA), or the like, in conjunction with appropriate memory, network, and bus elements.

Note that in the specification and claims, "about" or "approximately" means within twenty percent (20%) of the numerical amount cited. All computer software disclosed herein may be embodied on any computer-readable medium (including combinations of mediums), including without limitation CD-ROMs, DVD-ROMs, hard drives (local or network storage device), USB keys, other removable drives, ROM, and firmware.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. Thermal management apparatus for a solid-state laser system enabling the laser system to have near isothermal temperatures across and throughout a solid-state gain material, said apparatus comprising:
   a mechanically controlled oscillating heat pipe having effective thermal conductivity of 10-20,000 W/m*K;
   a solid-state lasing crystal or ceramic bonded to said mechanically controlled oscillating heat pipe; and
   a supporting structure including a surface bonded to said solid-state lasing crystal or ceramic that matches the coefficient of thermal expansion of both said solid-state lasing crystal or ceramic and said mechanically controlled oscillating heat pipe.

2. Apparatus as defined in claim 1 wherein said apparatus causes isothermal conditions across and throughout said solid-state lasing crystal or ceramic to promote nearly equal phase fronts in an axial lasing direction.

3. Apparatus as defined in claim 1 wherein said solid-state lasing crystal or ceramic is selected from the group consisting of Yb:YAG, Nd:YAG, Yb:KYW, doped sesquioxides, tungstates, erbium and thullium doped crystals, doped Ca salts including Yb:CaF$_2$ and doped glass.

4. Apparatus as defined in claim 1 additionally comprising nano-fluids and nano-particles to enhance desired temperature conditions and specific spatial variations desired for specific laser performances.

5. Apparatus as defined in claim 1 wherein said apparatus is incorporated into a laser system selected from the group consisting of pulsed, cw and ultrashort laser systems.

6. Apparatus as defined in claim 1 wherein said apparatus minimizes initial thermal transient conditions in the solid-state laser system.

7. Apparatus as defined in claim 1 additionally comprising a heat spreader.

8. Apparatus as defined in claim 7 wherein said heat spreader establishes isothermal conditions necessary to improve high power operation of the laser system.

9. Apparatus as defined in claim 8 wherein said heat spreader establishes isothermal conditions necessary to improve high power operation of one or more of the group consisting of edge-emitting laser diodes, vertical-cavity surface-emitting lasers, vertical external-cavity surface-emitting lasers, and other electronic diodes.

10. Apparatus as defined in claim 8 wherein said heat spreader enhances start-up operations of the system to promote near isothermal behavior of the laser system.

11. Apparatus as defined in claim 8 wherein said head spreader improves phase coupling of multiple lasers by minimizing optical path differences in phase fronts of individual lasers thereby improving resultant high power laser output.

12. Apparatus as defined in claim 1 wherein said apparatus reduces a transient thermal lens for the solid-state laser system.

13. Apparatus as defined in claim 1 wherein said apparatus is capable of operating at sub-room temperature ambient conditions and also sub-zero temperature conditions by operating in a vacuum.

14. A computer comprising one or more of the apparatuses of claim 1.

15. Thermal management method for a solid-state laser system enabling the laser system to have near isothermal temperatures across and throughout a solid-state gain material, the method comprising the steps of:
   mechanically controlling an oscillating heat pipe having effective thermal conductivity of 10-20,000 W/m*K;
   bonding a solid-state lasing crystal or ceramic to the mechanically controlled oscillating heat pipe; and
   providing a supporting structure including a surface bonded to the solid-state lasing crystal or ceramic that matches the coefficient of thermal expansion of both the solid-state lasing crystal or ceramic and the mechanically controlled oscillating heat pipe.

16. The method as defined in claim 15 wherein the method causes isothermal conditions across and throughout the solid-state lasing crystal or ceramic to promote equal phase fronts in an axial lasing direction.

17. The method as defined in claim 15 additionally comprising the step of forming a heat spreader.

18. The method as defined in claim 17 wherein the heat spreader establishes isothermal conditions necessary to improve high power operation of the fiber laser system.

19. The method as defined in claim 18 wherein the heat spreader establishes isothermal conditions necessary to improve high power operation of one or more of the group consisting of edge-emitting laser diodes, vertical-cavity surface-emitting lasers, vertical external-cavity surface-emitting lasers, and other electronic diodes.

20. The method as defined in claim 18 wherein the heat spreader enhances start-up operations of the system to promote near isothermal behavior of the laser system.

21. The method as defined in claim 18 wherein the head spreader improves phase coupling of multiple lasers by minimizing optical path differences in phase fronts of individual lasers thereby improving resultant high power laser output.

22. The method as defined in claim 15 wherein the method reduces a transient thermal lens for the solid-state laser system.

23. The method as defined in claim 15 additionally comprising the step of performing the method within a computer.

24. The method as defined in claim 15 additionally comprising performing the method in a vacuum with and without operation at sub-zero temperatures.

\* \* \* \* \*